United States Patent [19]

Zook

[11] Patent Number: 5,600,662
[45] Date of Patent: Feb. 4, 1997

[54] ERROR CORRECTION METHOD AND APPARATUS FOR HEADERS

[75] Inventor: Christopher P. Zook, Longmont, Colo.

[73] Assignee: Cirrus Logic, Inc., Fremont, Calif.

[21] Appl. No.: 412,277

[22] Filed: Mar. 28, 1995

Related U.S. Application Data

[63] Continuation of Ser. No. 326,126, Oct. 18, 1994, which is a continuation-in-part of Ser. No. 147,865, Nov. 4, 1993, Pat. No. 5,465,260, and Ser. No. 147,650, Nov. 4, 1993, abandoned, and Ser. No. 147,758, Nov. 4, 1993, abandoned, and Ser. No. 148,068, Nov. 4, 1993, abandoned, and Ser. No. 310,973, Sep. 23, 1994, and Ser. No. 124,936, Sep. 21, 1993, Pat. No. 5,449,424.

[51] Int. Cl.$^6$ ........................................... G11B 20/18
[52] U.S. Cl. ............................. 371/40.1; 360/49
[58] Field of Search ......................... 371/38.1, 39.1, 371/40.1; 360/49

[56] References Cited

U.S. PATENT DOCUMENTS

| | | | |
|---|---|---|---|
| 4,680,746 | 7/1987 | Suzuki et al. | 369/50 |
| 4,782,490 | 11/1988 | Tenengolts | 371/37.5 |
| 4,800,549 | 1/1989 | Yamagami et al. | 369/56 |
| 4,949,200 | 8/1990 | Weng | 360/72.2 |
| 5,136,592 | 8/1992 | Weng | 371/39.1 |
| 5,157,669 | 10/1992 | Yu et al. | 371/37.7 |
| 5,172,380 | 12/1992 | Odaka | 371/37.4 |
| 5,237,574 | 8/1993 | Weng | 371/40.1 |
| 5,241,546 | 8/1993 | Peterson et al. | 371/37.1 |
| 5,267,241 | 11/1993 | Kowal | 371/5.3 |
| 5,381,424 | 1/1995 | Tsang | 371/40.1 |
| 5,434,719 | 7/1995 | Miller et al. | 360/53 |

OTHER PUBLICATIONS

Chang et al., "Cyclic Memory Record Format Without Intrarecord Gaps", IBM Technical Disclosure Bulletin, vol. 19, No. 10, pp. 3890–3891, Mar. 1977.

*Primary Examiner*—Stephen M. Baker
*Attorney, Agent, or Firm*—Nixon & Vanderhye, PC

[57] ABSTRACT

An error correction apparatus and method corrects an error burst occurring in the header information of a sector stored on a rotating magnetic storage medium, particularly sector identifying information. The apparatus (1000) comprises both a header correction subsystem (1060) for performing error correction upon the header information and a data correction subsystem (1075) for performing error correction upon the user data information. The header correction subsystem (1060) comprises a header correction unit (1250) which receives the header information from the medium and which generates an error pattern over the header information. A header register (1252) receives and stores the header information from the medium. The error pattern and the header information stored in the header register are used to obtain corrected header information.

23 Claims, 23 Drawing Sheets

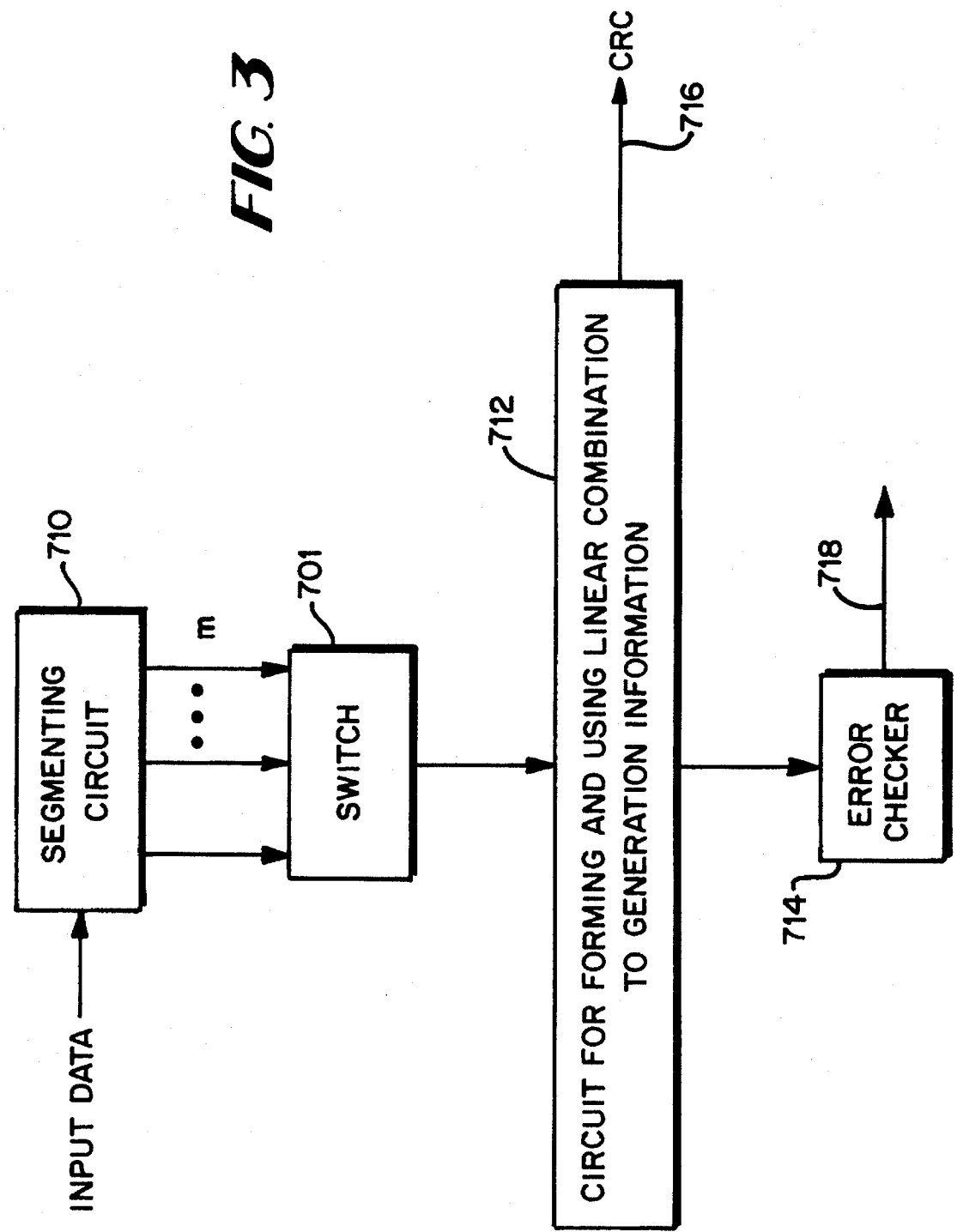

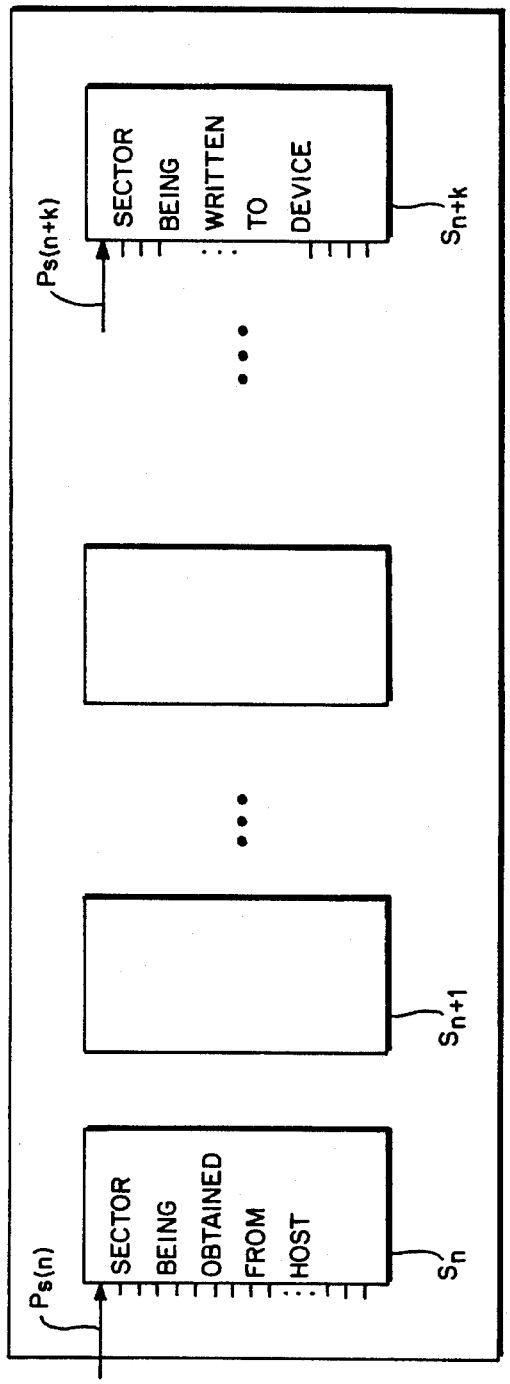
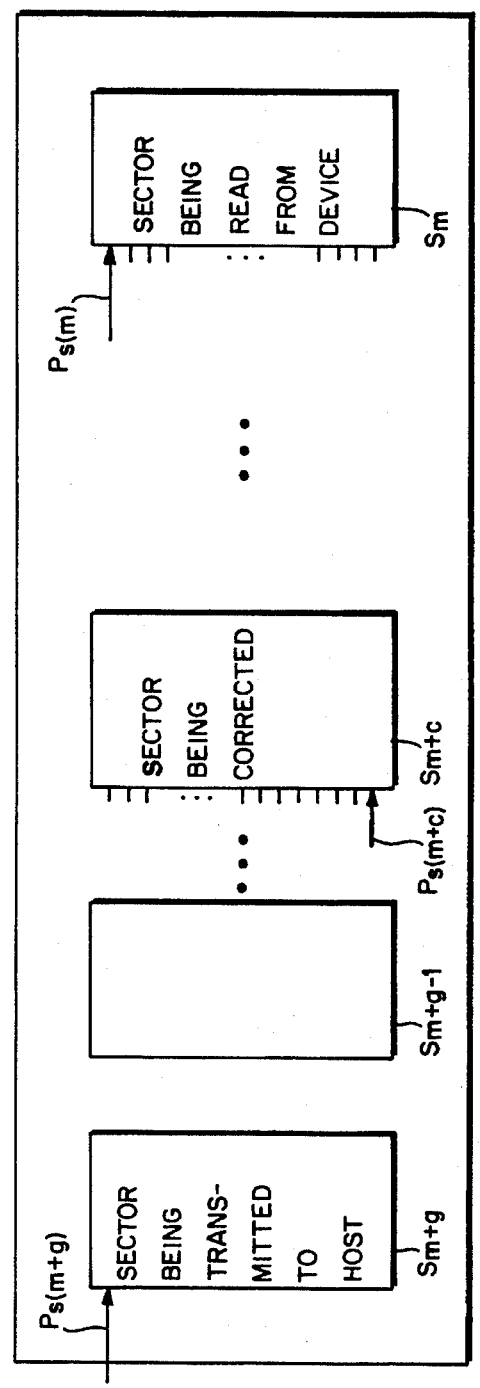

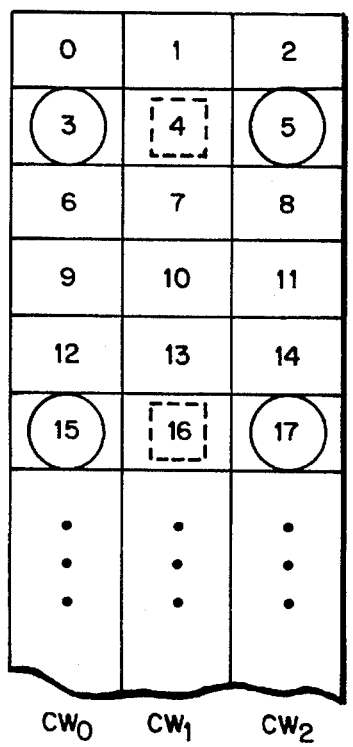
*FIG. 9*
*FIG. 10*
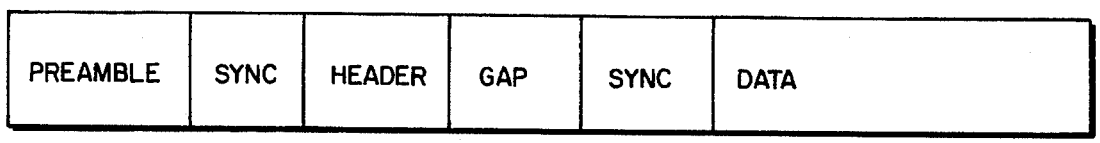

WRITE OPERATION

READ FROM DEVICE OPERATION

5,600,662

ERROR CORRECTION METHOD AND APPARATUS FOR HEADERS

CROSS-REFERENCES TO RELATED APPLICATIONS

This application is a continuation of U.S. patent application Ser. No. 08/326,126, filed Oct. 18, 1994 (incorporated herein by reference), which in turn is a continuation-in-part of the following patent applications, all of which are incorporated herein by reference: U.S. patent application Ser. No. 08/147,865 entitled "DUAL PURPOSE CYCLIC REDUNDANCY CHECK", now U.S. Pat. No. 5,465,260, U.S. patent application Ser. No. 08/147,650, entitled "REED SOLOMON DETECTOR", now abandoned; and U.S. patent application Ser. No. 08/147,758 entitled "FINITE FIELD INVERSION", abandoned; U.S. patent application Ser. No. 08/148,068 all filed Nov. 4, 1993, entitled "BURST ERROR CORRECTOR", abandoned; U.S. patent applications Ser. No. 08/310,973 filed Sep. 23, 1994 and entitled "A METHOD AND APPARATUS FOR DETECTING THE TRANSFER OF A WRONG SECTOR"; and U.S. patent application Ser. No. 08/124,936 of Zook and Glover, filed Sep. 21, 1993 and entitled "PROGRAMMABLE REDUNDANCY/SYNDROME GENERATOR", now U.S. Pat. No. 5,449,424. Patent applications filed concurrently (inventor: Christopher P. Zook) with parent application Ser. No. 08/326,126 and incorporated herein by reference include U.S. patent application Ser. No. 08/325,717 entitled "CYCLIC REDUNDANCY CHECK METHOD AND APPARATUS", U.S. patent application Ser. No. 08/326,164 entitled "REED SOLOMON DECODER", now U.S. Pat. No. 5,446,743; and U.S. patent application Ser. No. 08/325,831 entitled "FINITE FIELD INVERSION", now U.S. Pat. No. 5,467,297, and U.S. patent application Ser. No. 08/325,850 entitled "BURST ERROR CORRECTOR", now U.S. Pat. No. 5,491,701.

BACKGROUND

1. Field of Invention

This invention pertains to method and apparatus for correcting errors occurring in digital data.

2. Related Art and Other Considerations

In a digital data communication system (including storage and retrieval from optical or rotating magnetic media), error control systems are typically employed to increase the transfer rate of information and at the same time make the error rate arbitrarily low. For fixed signal-to-noise ratios and fixed bandwidths improvements can be made through the use of error-correcting codes (ECC).

With error-correction coding, the data to be transmitted or stored is mathematically processed through appropriate circuitry and/or software to obtain additional data symbols called check symbols or redundancy symbols. For further reliable communications it is necessary to be reasonably sure of detecting all transmission errors. One way of doing this is by the use of cyclic redundancy check symbols or CRCs. In general CRCs are calculated by treating data as the coefficients of a polynomial, dividing the data by another polynomial, and keeping the remainder.

The data bytes, CRC bytes, and ECC bytes together make up a codeword. The data bytes are the first bytes in the codeword. The CRC bytes follow the data bytes. The ECC bytes follow the CRC bytes. C(x) is defined as:

$$C(x) = \sum_{n=0}^{s-1} D_n X^{n+m+5} + \sum_{n=0}^{m-1} CR_n X^{n+5} + \sum_{n=0}^{4} E_n X^n$$

where $CR_n$ are the CRC bytes, $D_n$ are the data bytes, $E_n$ are the ECC bytes, s is the number of data bytes and m is the number of CRC bytes. Prior art error correction systems employ either bit-oriented or symbol-oriented CRC. However, the disadvantage of such systems is that each one is most desirable for various expected errors. That is, a bit-oriented CRC is desired if the expected errors are random bit errors whereas a symbol-oriented CRC is desired if the expected errors are burst errors or random symbol errors.

Moreover, in some magnetic disk applications, such as the writing and reading of ID fields in the header portion of a formatted sector necessitate the use of codes which can quickly correct short bursts in a small block of data on-the-fly. As existing prior art error correction systems do not correct errors located in the header ID field, such a capability is clearly needed to ensure correctly locating formatted sectors.

Additionally, all known implementations of decoding Reed-Solomon codes (a class of multiple-error correcting codes) using the Berlekamp-Massey algorithm for generating the error locator polynomial need temporary storage for at least storing the error locator polynomial coefficient resulting in an inefficient and unnecessary system costs.

While the use of ECC and CRC lower the overall probability of transferring undetected erroneous data, neither one ensures the transfer of a correct sector from the storage media to the host. Therefore, the need arises to ensure the integrity of such a transfer.

Prior art solutions generally employ a one-codeword buffer or storage means to implement on-the-fly multi-error correction system. Correction on data read from the disk is performed as data leaves a buffer local to the ECC and is corrected while in the local buffer. The corrected data is then stored in a larger buffer storing multiple codewords. The disadvantage of these system is the need for multiple buffers.

Thus, the need arises for an error tolerant system to ensure the integrity of transfer of information while maintaining efficiency.

SUMMARY

An error correction system included in a utilization device (e.g., disk drive) operates upon a plurality of sectors stored in a multi-purpose data buffer for performing write-from-host and read-from-device operations. Overlapping and asynchronous operational steps are performed with respect to the plurality of sectors, the operational steps including sector transfer into buffer, sector correction, and sector transfer out of buffer.

The error correction system includes a plurality of subsystems which are supervised and sequenced by a correction controller. The subsystems include a multi-purpose CRC generation and checking subsystem; an LBA subsystem; an ECC/Syndrome Generator subsystem; a header (ID) subsystem; a correction subsystem; and, a correction checker subsystem.

During a write-from-host operation, sector data from the host is not only transferred into the data buffer, but is also optionally transmitted to a CRC generation/checker unit which generates a programmable number of buffer CRC bytes (also known as primary CRC bytes) for the purpose of implementing an optional check to determine whether storage/retrieval in the buffer occasions an error. Moreover, during the write-from-host operation, when a sector is to be written to media, the precise location of writing on the media is ensured by the header (ID) subsection. In this regard, the header (ID) subsection checks the sector ID data obtained from the utilization device and, if necessary, performs error correction with respect to the sector ID data on-the-fly. As the sector-to-be-written is outputted from the data buffer, the sector data is applied not only to the utilization device, but also to a second CRC generator/checker unit and to the ECC/syndrome generation subsystem. The second CRC generator/checker unit regenerates a programmable number of device CRC bytes or secondary CRC bytes over the sector data. The device CRC bytes are transmitted to the utilization device for recording on the media, but additionally serve as a comparison with the buffer CRC bytes to detect whether storage/retrieval in the buffer caused an error. The device CRC bytes optionally have LBA bytes XORed therewith to provide a capability of detecting wrong sector transfer. The ECC/syndrome generation subsystem uses the sector data and the device CRC bytes in an interleaving encoding scheme to generate ECC bytes for recording on the media.

During a read-from-device operation, the header (ID) subsystem facilitates fault-tolerant location of a desired sector ID for the sector-to-be-read. The sector-to-be-read is transferred to the data buffer, and optionally applied to the second CRC generation/checker unit for generating buffer CRC bytes, similar to the write-from-host operation. The sector is also applied to the correction subsystem which checks each codeword of the sector to detect (and, if necessary and able, correct) errors on-the-fly. If the sector is correctable by the correction subsystem, correction checker subsystem verifies the correction implemented by the correction subsystem. If the sector is not correctable by the correction subsystem, a device microprocessor optionally attempts correction using one or more programmed correction strategies off line. Prior to actual transfer of the sector to the host, the first CRC correction/checker unit is optionally utilized to check for any errors introduced by storage/retrieval operations concerning the data buffer.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 3 is a schematic block diagrammatic view of a CRC generator/checker unit of a CRC generation/checker subsystem of the error correction system of FIG. 1.

FIG. 8A is a diagrammatic view of sector organization of a buffer in connection with a write to device operation.

FIG. 8B is a diagrammatic view of sector organization of a buffer in connection with a read from device operation.

FIG. 9 is a diagrammatic view of an interleaved sector which undergoes an illustrative mode of attempted supplemental correction by a device microprocessor.

FIG. 10 is a diagrammatic view showing a format of a sector recorded on a medium handled by the utilization device with which the error correction system of FIG. 1 is exemplary operated.

DETAILED DESCRIPTION OF THE DRAWINGS

Figure 1:
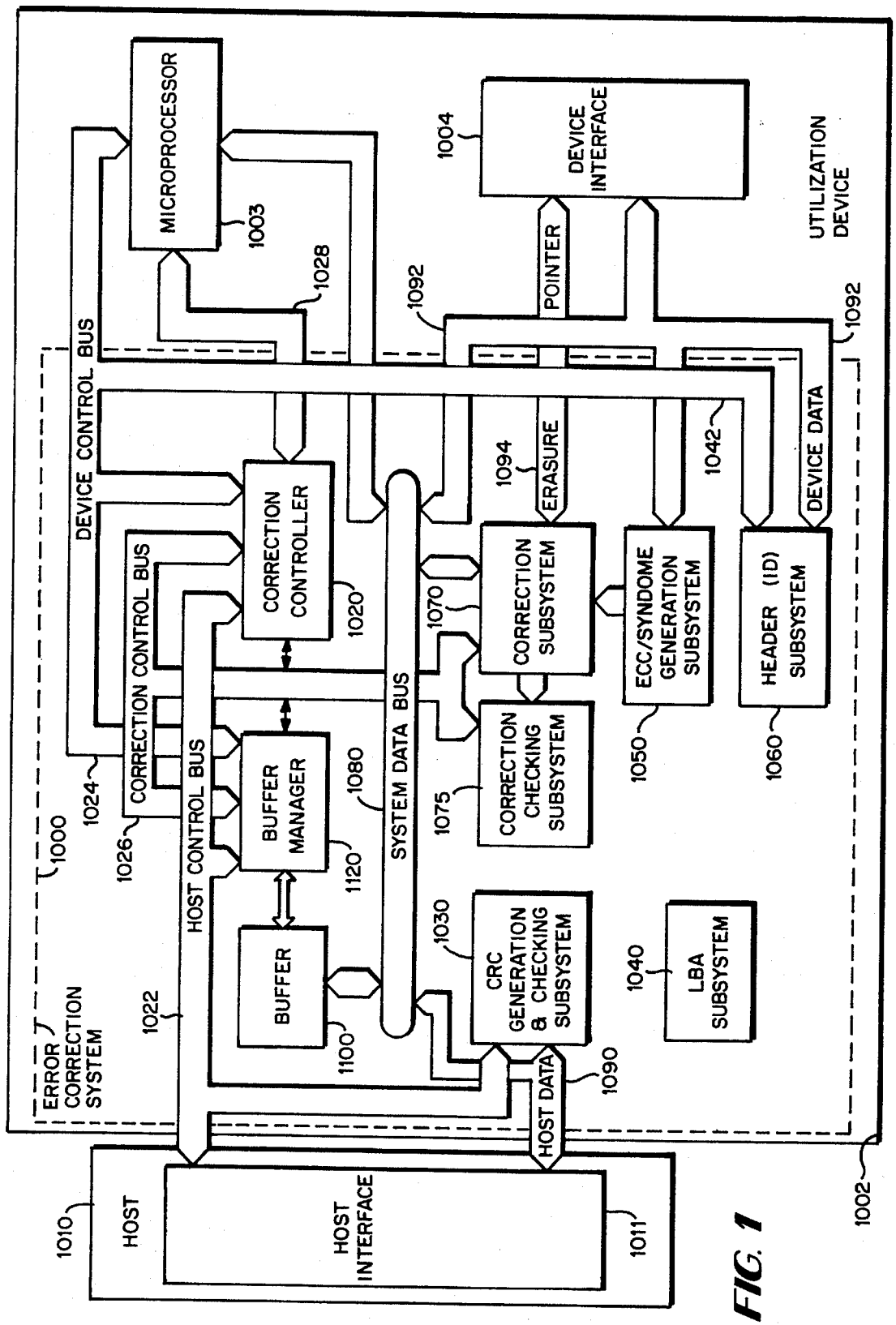
FIG. 1 is a schematic block diagrammatic view of an error correction system according to an embodiment of the invention, showing the error correction system connected to its utilization device and to a host.

FIG. 1 shows an error correction system 1000 (framed by broken lines) which is included in a utilization device 1002. Utilization device 1002 includes a device microprocessor 1003 and media recording/playback device 1005 through which data communication is established via utilization device interface 1004. Error correction system 1000 serves to correct data transmitted between host device 1010 (having host interface 1011) and utilization device 1002, as when host device 1010 writes data to a storage media handled by utilization device 1002 or as when host device 1010 reads data from the storage media handled by utilization device 1002. As used herein, utilization device 1002 is disk drive which handles rotating magnetic storage media.

As shown in FIG. 1 and otherwise herein, correction controller 1020 supervises and sequences operation of various constituent subsystems of error correction system 1000 and is involved with interfacing error correction system with host 1010; device microprocessor 1003, and device interface 1004. In the former regard, the following subsystems are supervised and sequenced by correction controller 1020: CRC generation and checking subsystem 1030; LBA subsystem 1040; ECC/Syndrome Generator subsystem 1050; header (ID) subsystem 1060; correction subsystem 1070; and, correction checker system 1075.

Error correction system 1000 also includes a system bus 1080 which is accessed by various subsystems, device microprocessor 1003, interface 1004, and buffer 1100. As hereinafter discussed, buffer 1100 is a memory utilized to store a plurality of sectors asynchronously undergoing various stages of processing. Buffer 1100 is controlled by buffer manager 1120, buffer manager 1120 being connected to correction controller 1020.

Correction controller is connected to a plurality of control buses as illustrated in FIG. 1, including host side control bus 1022; device side control bus 1024; correction control bus 1026; and, controller/microprocessor control bus 1028. Host side control bus 1022 is connected to CRC generation and checking subsystem 1030 and to buffer manager 1120. Device side control bus 1024 is also connected to device microprocessor 1003, buffer manager 1120; and header (ID) subsystem 1060. Correction control bus 1026 is also connected to buffer manager 1120; correction subsystem 1070; and correction checking subsystem 1075. Controller/microprocessor control bus 1028 connects correction controller 1020 to device microprocessor 1003.

FIG. 1 also illustrates the following data buses: host data bus 1090 connected to host interface 1011; device data bus 1092; and erasure pointer bus 1094. Both device data bus 1092 and erasure pointer bus 1094 are connected to device interface 1004.

Although not specifically illustrated herein, it should be understood that controller 1020 is connected to various elements of the constituent subsystems of error correction system 1000 for carrying myriad control and timing signals, such as (for example) the numerous multiplexer select signals illustrated herein.

Figure 2:
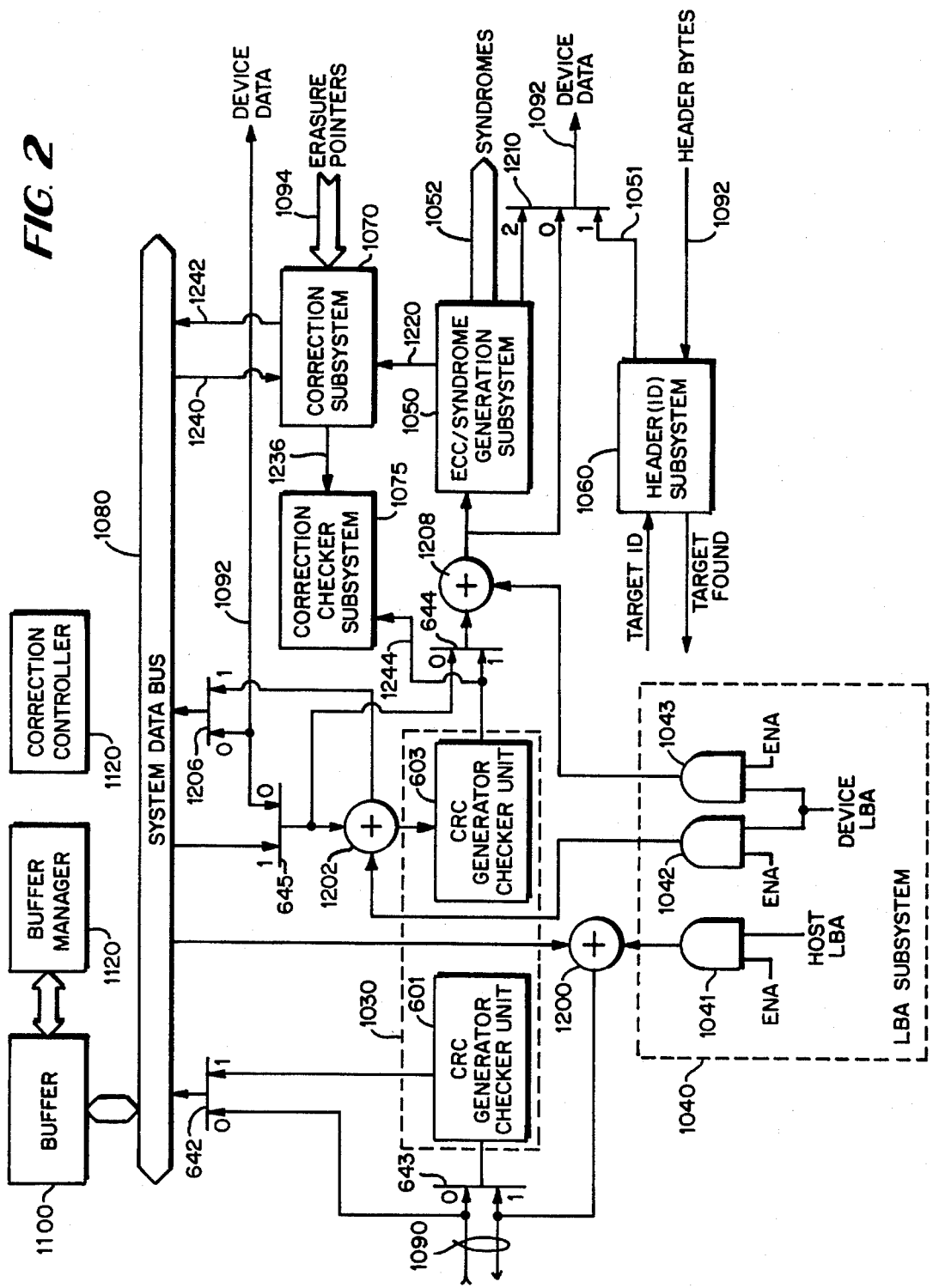
FIG. 2 is a schematic view showing more detail of the error correction system of FIG. 1, including connections between constituent subsystems of the error correction system.

FIG. 2 shows in more detail connections between the subsystems of error correction system 1000, particularly data connections. Data output from host interface 1011 is applied on host data bus 1090 to terminal 0 of MUX 643 and to terminal 0 of MUX 642. An output terminal of MUX 642 is connected to system bus 1080.

As shown in FIG. 2, CRC generation and checking subsystem 1030 includes a first CRC generator/checker unit 601 and a second CRC generator/checker unit 603. An input to CRC generator/checker unit 601 is connected to an output terminal of multiplexer (MUX) 643. An output terminal from CRC generator/checker unit 601 is connected to input terminal 1 of MUX 642, the output terminal of MUX 642 being connected to system bus 1080 as stated above.

Input terminal 1 of MUX 643 is connected to an output terminal of an adder 1200. The output terminal of adder 1200 is also to data input to host interface 1011 via host data bus 1090. A first input terminal of adder 1200 is connected to system bus 1080; a second input terminal of adder 1200 is connected to LBA subsystem 1040.

An input terminal of CRC generation/checker unit 603 is connected to an output terminal of adder 1202. A first input terminal of adder 1202 is connected to an output terminal of MUX 645. A second input a terminal of adder 1202 is connected to LBA subsystem 1040. Input terminal 1 of MUX 645 is connected to system bus 1080. Input terminal 0 of MUX 645 is connected by device data bus 1092 to interface 1004. The output terminal of adder 1202 is also connected to input terminal 0 of MUX 1206; input terminal 1 of MUX 1206 is connected by device data bus 1092 to interface 1004.

As further shown in FIG. 2, the ECC/syndrome generator subsystem 1050 has an input terminal connected to an output terminal of adder 1208. A first input terminal of adder 1208 is connected to an output terminal of MUX 644. Input terminal 0 of MUX 644 is connected to the output terminal of MUX 645; input terminal 1 of MUX 644 is connected to an output terminal of CRC generation/checker unit 603. A second input terminal of adder 1208 is connected to LBA subsystem 1040. The output terminal of adder 1208 is also connected to input terminal 0 of MUX 1210. An output terminal of MUX 1210 is connected to device data bus 1092. Syndromes generated by ECC/syndrome generator subsystem 1050 are applied on syndrome bus 1052 to device microprocessor 1003 (see FIG. 1A). ECC/syndrome generator subsystem 1050 also applies a syndrome signal on line 1220 to correction subsystem 1070. A line carrying ECC bytes generated by ECC/syndrome generator subsystem 1050 is connected to input terminal 2 of MUX 1210. In particular, the line carrying the signal WRITE DATA/REDUNDANCY is connected to input terminal 2 of MUX 1210.

Correction subsystem 1070 receives the syndrome signal on line 1220 from ECC/syndrome generator subsystem 1050, as well as erasure pointers on bus 1094 from device interface 1004. Correction subsystem 1070 corrects multiple randomly-located error symbols on-the-fly—that is, correction of a sector is completed without interrupting the transfer of subsequent sectors into the buffer and without losing a revolution on the disk. Correction unit 1230 outputs an error signal ERR (i.e., error pattern) on line 1236 (which is applied as one input to correction checker subsystem 1070) and various status signals on correction bus 1026, including a signal UNC (which indicates that a codeword is uncorrectable). As explained hereinafter, when correction of a byte of a codeword is required, correction subsystem 1070 requests from buffer 1100 a byte requiring correction, which byte is transmitted to correction subsystem 1070 on line 1240. After the byte is corrected, the corrected byte is transferred back to buffer 1100 on line 1242. Both lines 1240 and 1242 are connected to system bus 1080. Reading a byte to be corrected from buffer 1100, correcting said byte and transferring it back to buffer 1100 as explained above is called read-modify-write operation.

Figure 3A:
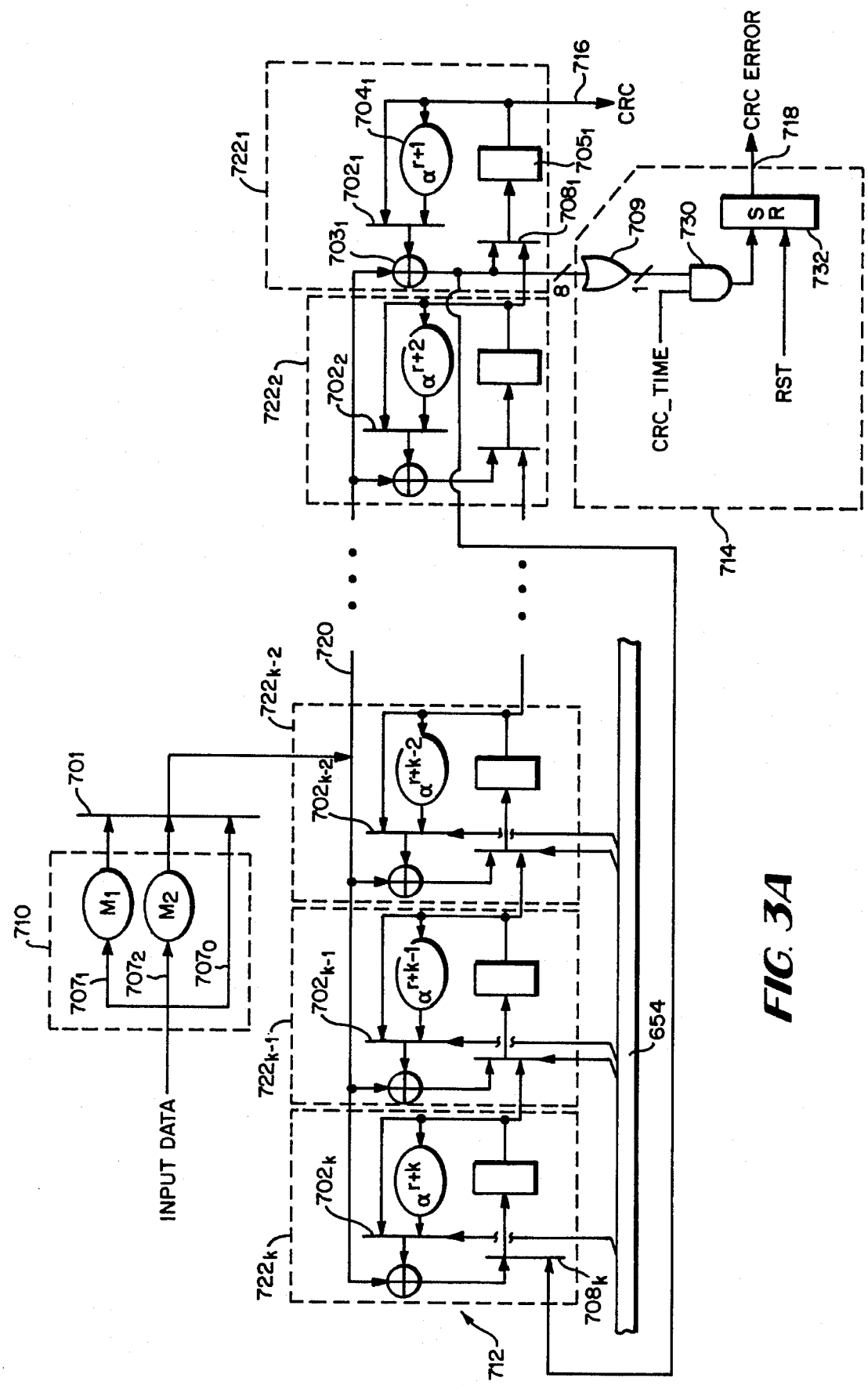
FIG. 3A is a detailed schematic block diagrammatic view showing the CRC generator/checker unit of FIG. 3 in more detail.

As explained below, correction checker subsystem 1075 uses error patterns generated by correction subsystem 1070 and CRC check remainder bytes to confirm the correction implemented by correction subsystem 1070. For this purpose, correction checker subsystem 1075 is not only connected to receive on line 1236 the error signal ERR from correction unit 1230, but is also connected to receive the output from CRC generator/checker unit 603 on line 1244. Line 1244 is also shown as line 716 in FIG. 3A.

CRC generator/checker unit 603 generates CRC check remainder bytes by adding (at adder $703_1$ of FIG. 3A) its regenerated CRC bytes (shifted through the registers 705) to incoming CRC bytes. (The CRC check remainder is one example of an error signature. As used herein, the term "error signature" means any indication of errors, such as syndromes or remainders.) As each regenerated CRC byte is added to its corresponding incoming CRC byte to generate a CRC check remainder. Each CRC check remainder byte outputted from adder $703_1$ is shifted into register $705_k$ via MUX $708_k$. Thus, after formation of all CRC check remainder bytes, the registers 705 have the respective bytes of the CRC check remainder stored therein, so that the CRC check remainder bytes can be outputted on line 716 (also labeled as line 1244).

FIG. 2 shows that header (ID) subsystem 1060 is connected to receive header data bytes on device data bus 1092 from device interface 1004, and to apply header ECC bytes on line 1051 to input terminal 1 of MUX 1210. Header (ID) subsystem 1070 receives a signal TARGET ID from correction controller 1020, and applies a signal TARGET FOUND to correction controller 1020 (see FIG. 1A).

STRUCTURE: BUFFER

Buffer 1100 comprises a bank of memory devices, such as a bank of RAM chips or a bank or DRAM chips. Although illustrated herein as part of error correction system 1000, it should be understood that buffer 1100 may reside external to error correction system 1000. Therefore, error correction system 1000 may be provided without a buffer to a device manufacturer, permitting the device manufacturer to select and install a type of buffer in accordance with the manufacturer's own requirements and/or preferences. For this reason, as hereinafter described with reference to correction controller 1020, a means is provided for communicating to error correction system 1000 the manufacturer's selection of buffer type.

FIG. 8A and FIG. 8B generally show that, during operation, buffer 1100 usually has a plurality of sectors stored therein. FIG. 8A shows sectors $S_n$–$S_{n+k}$ stored in buffer 1100 at a particular instance during a write from host to device operation. FIG. 8B shows sectors $S_{mn}$–$S_{m+q}$ stored in buffer 1100 at a particular instance during a read from device to host operation, including a sector $S_{m+c}$ undergoing correction. Each sector S is illustrated with gradation markings on a left margin thereof to represent byte locations. Buffer manager 1120 maintains an address pointer for referencing the currently addressed byte of each sector, for example pointer $P_{S(n)}$ for sector $S_n$ and pointer $P_{S(n+k)}$ for sector $S_{n+k}$.

Although illustrated as such for simplicity in FIG. 8A and FIG. 8B, it should be understood that the physical locations of sectors S in buffer 1100 are not necessarily related to order of input into buffer 1100 or order of readout from buffer 1100. Importantly, operations are conducted asynchronously with respect to sectors S in buffer 1100. For example, in the read from device to host operation depicted by FIG. 8B, sector $S_m$ is being read from device 1002; sector $S_{m+c}$ is being corrected, and sector $S_{m+q}$ is being transmitted to host 1010, with each of these operations being asynchronous although overlapped with respect to the others.

STRUCTURE: CORRECTION CONTROLLER

Figure 1A:
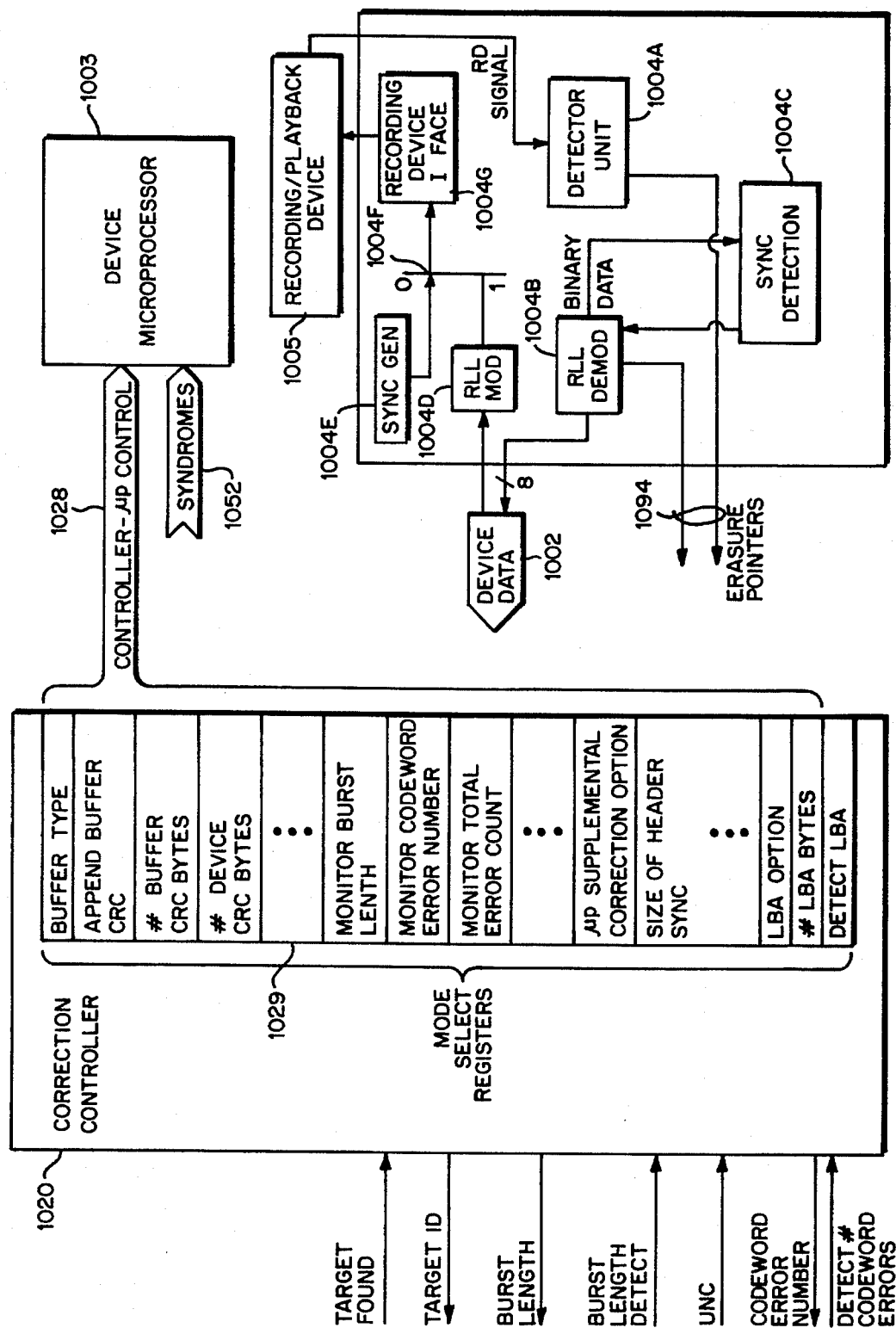
FIG. 1A is a schematic block diagrammatic view of showing various connections of a utilization device to the error correction system of FIG. 1.

As indicated above, correction controller 1020 controls interfacing of error correction system 1000 with both host 1010 and utilization device 1002, as well as supervises and sequences operation of various constituent subsystems of error correction system 1000. FIG. 1A particularly shows communication of correction controller 1020 with device microprocessor 1003, as well as a set 1029 of mode select registers provided in correction controller 1020. The plurality of mode select registers in set 1029 are set in accordance with user (e.g., device manufacturer) input to device microprocessor 1003 (as communicated by signals on controller-microprocessor control bus 1028). For example, the user can specify the type of memory being utilized for buffer 1100 (register BUFFER TYPE), whether CRC bytes are to be appended to sectors in buffer 1100 (register APPEND BUFFER CRC); the number of CRC bytes to be appended to a sector in buffer 1100 (register # BUFFER CRC BYTES); the number of device CRC bytes to be appended to a sector (register # DEVICE CRC BYTES); a number of burst error bytes which correction subsystem 1070 should monitor for reporting to correction controller 1020 (register MONITOR BURST LENGTH); a number of errors per codeword which correction subsystem 1070 should monitor for reporting to correction controller 1020 (register MONITOR CODEWORD ERROR NUMBER); a flag indicative of whether a feature known as microprocessor supplemental correction is to be implemented (register μP SUPPLEMENTAL CORRECTION OPTION); a flag indicative of whether detection for wrong sector transfer is to be implemented (register LBA OPTION); a number of bytes involved in wrong sector detection (register # LBA BYTES); and a flag indicating whether the operator does not know the wrong sector (LBA) value but wishes to detect the same (register DETECT LBA).

STRUCTURE: CRC GENERATOR/CHECKER SUBSYSTEM

As shown in FIG. 2, CRC generator/checker subsystem 1030 includes two units, particularly CRC generator checker unit 601 and CRC generator checker unit 603.

When a buffer CRC option is selected (see register APPEND BUFFER CRC in FIG. 1A), CRC generator checker unit 601 serves to add a programmable number of CRC bytes (known as "buffer CRC" bytes or "primary CRC" bytes) to a sector being transferred from host 1010 to buffer 1100. The programmable number of buffer CRC bytes is determined by the value stored in mode select register # BUFFER CRC BYTES in correction controller 1020 (see FIG. 1A).

During a write from host to device (media) operation, a sector being transferred to the media is transmitted to CRC generator checker unit 603. If the buffer CRC option is selected, CRC generator checker unit 603 regenerates CRC over the sector data obtained from the buffer, and compares its regenerated CRC with the CRC obtained from the buffer 1100. Thus, CRC generator checker unit 603 serves to check buffer 1100. The CRC generated by CRC generator checker unit 603 is used as device CRC for actually recording on the media.

During a read from device (media) operation, CRC generator checker units 601 and 603 essentially switch roles. That is, during a read from device (media) operation, CRC generator checker unit 603 optionally appends buffer CRC prior to storage of the read sector in buffer 1100. When the sector is being transferred from buffer 1100 to host 1010, CRC generator checker unit 601 serves to check whether the sector is correctly obtained from buffer 1100.

Both CRC generator/checker unit 601 and CRC generator/checker 603 essentially have the same structure. FIG. 3 generally shows structure of an exemplary one of the CRC generator/checker units 601, 603. Each unit 601, 603 basically includes a segmenting circuit 710; a switch or multiplexer 701; a circuit 712 for forming and using a linear combination of user data sub-streams to generate CRC information; and, an error checker circuit 714.

Referring again to FIG. 3, segmenting circuit 710 serves to segment an input stream of user data into a plurality m of sub-streams for application to switch 701. Switch 701 selects from the plurality of user data sub-streams in accordance with clock cycle and applies the selected user data sub-stream to circuit 712. The resultant CRC information, preferably in the form of CRC bytes, is outputted on parallel CRC bus 716. When CRC generator/checker unit 601 or 603 is employed to check received CRC information previously generated on the basis of received data, the previously generated CRC information is compared by error checker 714 with verification CRC information currently generated (with respect to the same user data) by circuit 712. Should the previously generated and currently generated verification CRC information differ, an error signal is generated on CRC error line 718.

FIG. 7A shows structural details of one particular implementation of CRC generator/checker unit 601 or 603, and particular an implementation wherein m=3. Accordingly, segmenting circuit 710 of FIG. 7A is shown to include three sub-stream lines $707_0$, $707_1$, $707_2$. For reasons hereinafter discussed, sub-stream line $707_1$ and $707_2$ have multipliers $M_1$ and $M_2$ connected thereon. Switch 701 is a three-input multiplexer having input selected by controller 626 (via a control bus). An output port of multiplexer 701 is connected to apply the sub-stream selected thereby to adder input bus 720.

As shown in FIG. 7A, circuit 712 comprises k number of sub-circuits $722_1$–$722_k$ for generating as many as k bytes of CRC information with respect to the linear combination of sub-streams. As explained below, each sub-circuit 722 is a divider having a divisor which is a power of $\alpha$. Each sub-circuit 722 comprises an adder input multiplexer 702; an adder 703; a multiplier 704; a register 705 for storing CRC information; and, a register input multiplexer 708. Each adder 703 has a first input port, a second port, and an output port. The first port of each adder 703 is connected to adder input bus 720 so that the plurality of sub-streams can be multiplexed thereto. Each multiplier 704 has an output port thereof selectively connected (via a first input port of associated multiplexer 702) to the second input port of its associated adder 703. Each register 705 has an input port connected to the output port of associated adder 703 and its output port is selectively connected (via a first input port of associated multiplexer 702) to the second input port of the adder 703. Each register 705 stores CRC information in the form of a CRC byte which is related to an error correcting code. Each of the multiplexers 702 and 708 are controlled by controller 626 (for example, via control bus 654).

From the foregoing it is understood that sub-circuits 722 are numbered from a first sub-circuit $722_1$ to a $k^{th}$ sub-circuit $722_k$. Registers 705 of the sub-circuits 722 are connected so that CRC information stored therein can be rightwardly shifted. The rightward shift occurs after the n clock cycles executed to generate the CRC bytes in registers 705. After the n clock cycles are executed to generate the CRC bytes, the CRC bytes in registers 705 are shifted rightwardly a desired number of clocks (as input to controller 626), one register (e.g., one sub-circuit) per clock. For example, considering the operation of first CRC generator/checker 601, if an input value of 4 is inputted at input port $627_1$ of controller 626, during a first shift clock cycle the CRC byte in register $705_1$ is shifted out on CRC bus 716; the CRC byte in register $705_2$ is shifted into register $705_1$; the CRC byte in register $705_2$ is shifted into register $705_2$; and so forth. Such shifting continues for four shift clock cycles, so that the CRC values initially in registers $705_1$–$705_4$ are ultimately shifted out to CRC bus 716.

The values of the multipliers 704 are chosen so that the multiplier multiplies by a power of a field element $\alpha$, the power being r+1 for the multiplier of the first sub-circuit $722_1$ and r+k for the multiplier of the $k^{th}$ sub-circuit $722_k$.

The output port of adder $703_1$ is connected to error checker circuit 714. As illustrated in FIG. 7A, error checker circuit 714 comprises an 8-input OR gate 709 which is connected to the output port of adder $703_1$. Error checker circuit 714 further includes and AND gate 730 and an R/S flip-flop or latch 732. An output pin of OR gate 709 is connected to a first input pin of AND gate 730, a second input pin of AND gate 730 being connected to receive a signal CRC_TIME from controller 626. An output pin of AND gate 730 is connected to a set pin of flip-flop 732; a reset pin of flip-flop 732 receives a signal RST from controller 626. Since adder $703_1$ is involved in verifying previously-generated CRC information with currently generated CRC information in the manner hereinafter described, sub-circuit $722_1$ is denominated the "comparison" sub-circuit.

CRC generator/checker subsystem 1030 is described in yet further detail by the following patent applications, both of which are incorporated by reference: U.S. patent application Ser. No. 08/325,717 entitled "CYCLIC REDUNDANCY CHECK METHOD AND APPARATUS"; U.S. patent application Ser. No. 08/147,865 entitled "DUAL PURPOSE CYCLIC REDUNDANCY CHECK".

STRUCTURE: ECC/SYNDROME GENERATOR SUBSYSTEM

Figure 4:
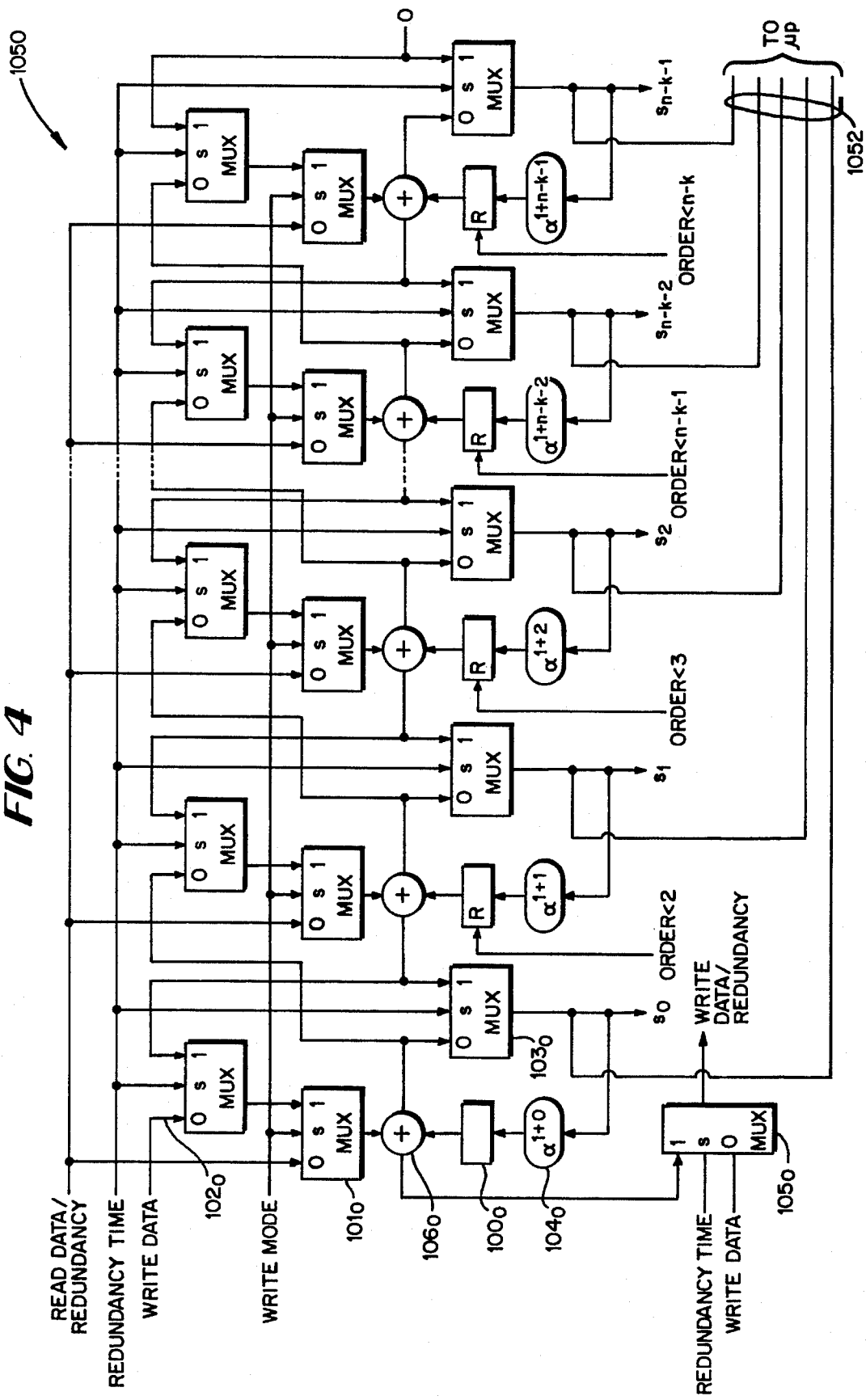
FIG. 4 is a schematic block diagrammatic view of a ECC/syndrome generator subsystem in accordance with an embodiment of the invention.

FIG. 4 shows in more detail the ECC/syndrome generator subsystem 1050. ECC/syndrome generator subsystem 1050 includes a bank of ECC/syndrome registers 100; a bank of MUXes 101; a bank of MUXes 102; a bank of MUXes 103; a bank of multipliers 104; a MUX 105; and, a bank of adders 106. Each like-subscripted set of elements of ECC/syndrome generator subsystem 1050 is referred to as a "slice". For example, register $100_0$, MUXes $10_{10}$, $10_{20}$, $10_{30}$, and register $100_0$ are included in a first slice of subsystem 1050.

ECC/syndrome generator subsystem 1050 is described in yet further detail by U.S. patent application Ser. No. 08/124, 936 of Zook and Glover, filed Sep. 21, 1993 and entitled "PROGRAMMABLE REDUNDANCY/SYNDROME GENERATOR", and which is incorporated herein by reference.

Figure 4A:
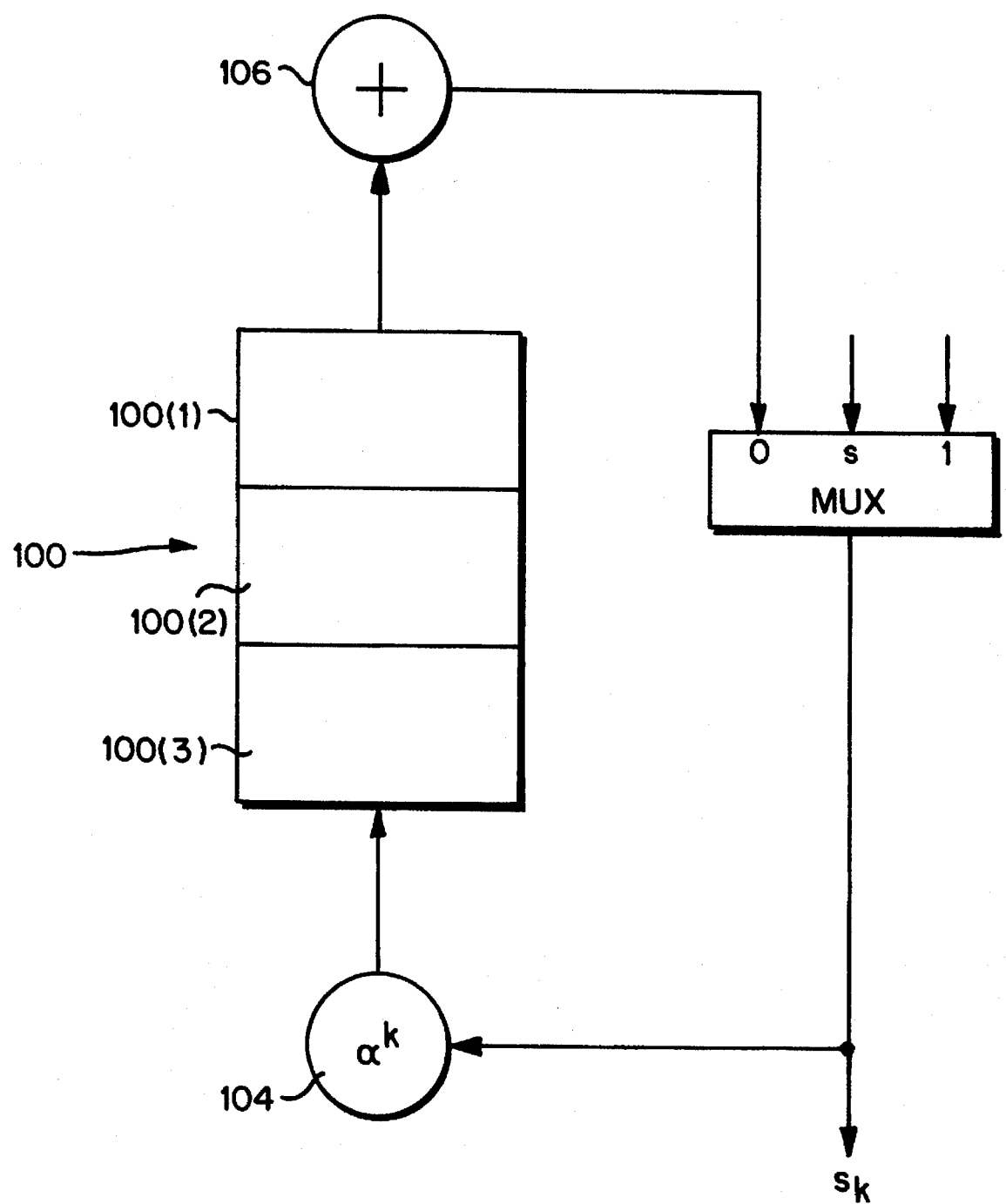
FIG. 4A is a schematic block diagrammatic view for explaining how the ECC/syndrome generator subsystem of FIG. 4 can be operated in an interleaved error correction system.

FIG. 4A illustrates how subsystem 1050 of FIG. 4 is configured for handling interleaved data, particularly three interleaves. For the interleave configuration, each register 100 functions as a shift register divided into three partitions—one partition for each interleave. Accordingly, summation for each interleave occurs in a corresponding one of the circularly rotating register partitions.

STRUCTURE: CORRECTION SUBSYSTEM

Figure 5:
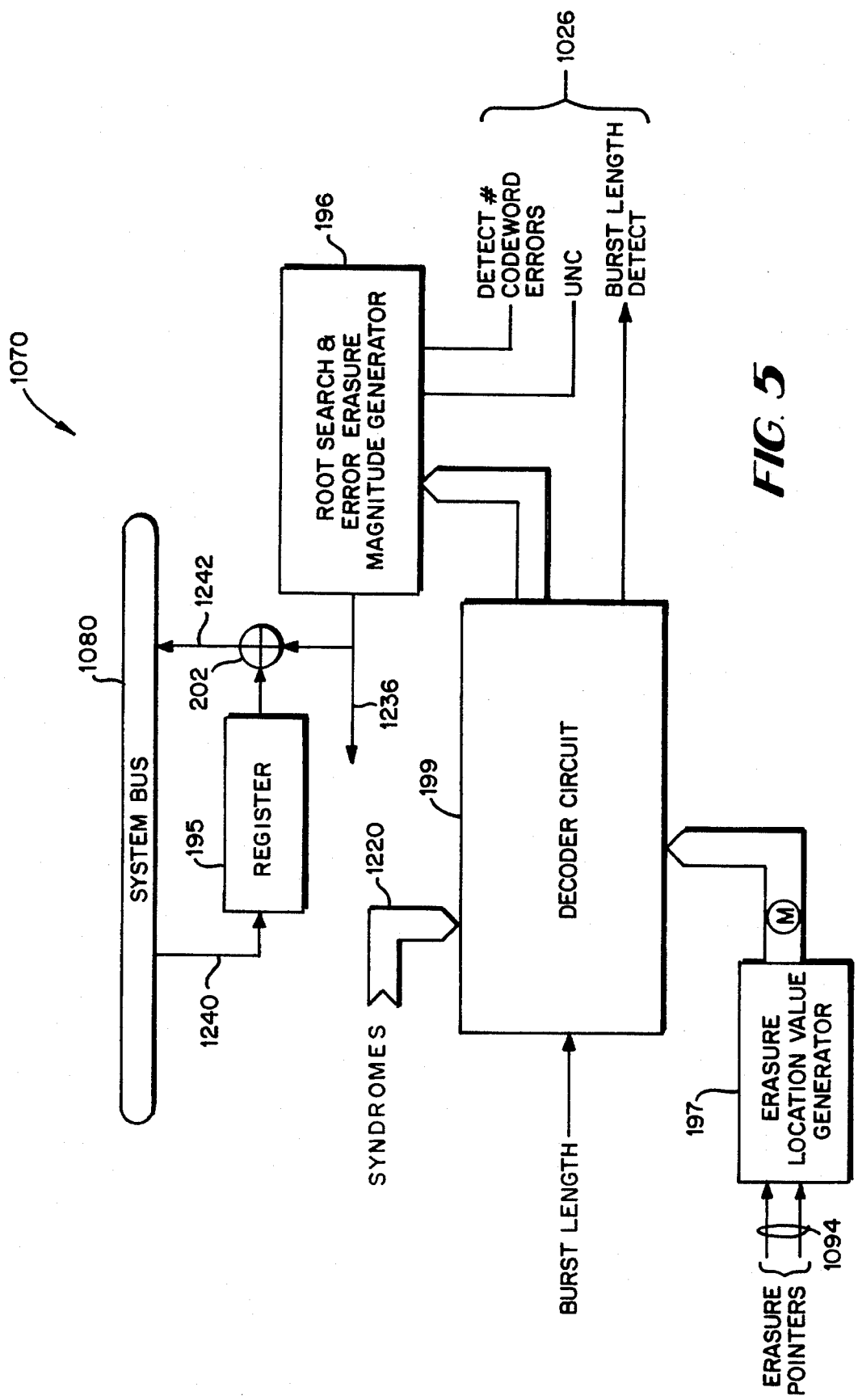
FIG. 5 is a schematic block diagrammatic view of correction unit and its pertinent connections to various other subsystems in accordance with an embodiment of the invention.

FIG. 5 shows correction subsystem 1070 and its connection to system data bus 1080 and erasure pointer bus 1094. Correction subsystem 1070 comprises a one byte register 195; a root search and error/erasure magnitude generator 196; an erasure location value generator 197; a decoder circuit 199; and, an adder 202.

Erasure location value generator 197 is connected to receive the erasure pointers from device interface 1004 on erasure pointer bus 1094. Location values of the erasures are applied to decoder circuit 199. Decoder circuit 199 also receives syndromes on line 1220 from ECC/syndrome generation subsystem 1050.

System bus 1080 is connected by line 1240 to an input terminal of register 195 and by line 1242 to an output terminal of adder 202. A first input terminal of adder 202 is connected to register 195 to receive the byte-requiring-correction. A second input terminal of adder 202 is connected to root search and error/erasure magnitude generator 196 to receive an error pattern on line 1236 therefrom.

The operation of decoder circuit 199 is now briefly summarized. After a series of error locator iterations, decoder circuit 199 obtains final values for t m-bit coefficients of an error locator polynomial $\sigma$. Upon completion of the series of error locator iterations for a codeword, decoder circuit 199 executes a series of error magnitude iterations to generate an error evaluator polynomial ω for the codeword. The coefficients of the error evaluator polynomial ω are transmitted to the root search and error/erasure magnitude generator 196 where the error magnitude E is calculated. After calculation of the error magnitude E, the error magnitude E is added to the original data (i.e., byte requiring correction) at adder 202, resulting in the corrected byte for the codeword. In the buffering scheme herein illustrated, the corrected byte is then returned to buffer 1100 on line 1242.

As further described herein, correction subsystem 1070 generates a plurality of signals for application to correction controller 1020 (on correction control bus 1026). Included among these signals are signals BURST LENGTH DETECT (which indicates that an error burst of length BURST LENGTH [see register MONITOR BURST LENGTH in correction controller 1020 in FIG. 1A]); a signal DETECT # CODEWORD ERRORS (which indicates the number of errors detected per codeword [see register MONITOR CODEWORD ERROR NUMBER in correction controller 1020 in FIG. 1A]); a register MONITOR TOTAL ERROR COUNT indicating the total number of errors detected per sector (shown in FIG. 1A); and a signal UNC (i.e., codeword is uncorrectable).

An important aspect of the invention is on-the-fly error correction of randomly-located error symbols in the codeword. Moreover, in the preferred embodiment, correction is accomplished in less than one sector time.

Correction subsystem 1070 is described in yet further detail by the following patent applications, both of which are incorporated by reference: U.S. patent application Ser. No. 08/147,650 entitled "REED SOLOMON DETECTOR"; U.S. patent application Ser. No. 08/326,164 entitled "REED SOLOMON DECODER".

STRUCTURE: CORRECTION CHECKER SUBSYSTEM

Figure 6:
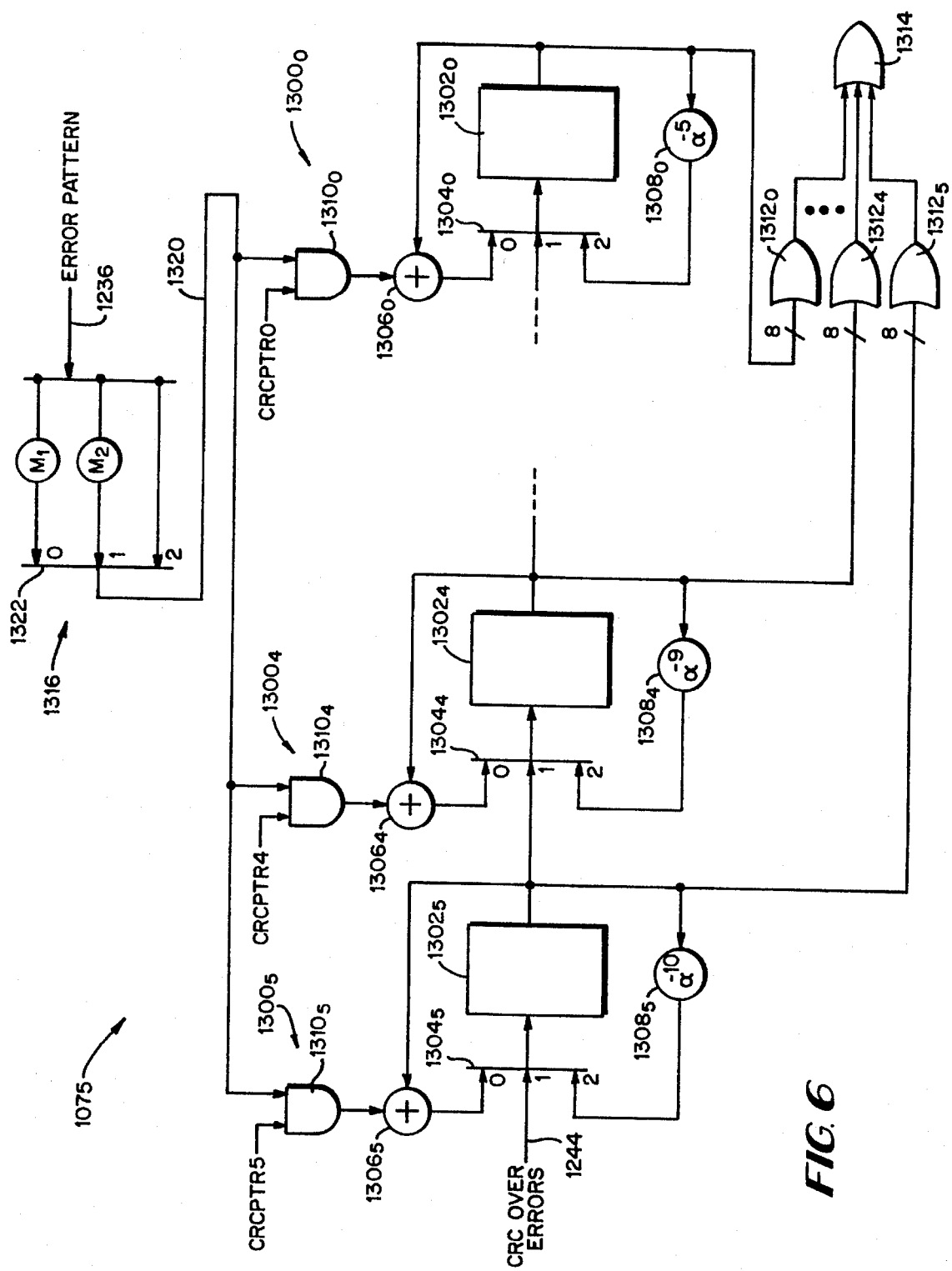
FIG. 6 is a schematic block diagrammatic view of a correction checker subsystem in accordance with an embodiment of the invention.

As further shown in FIG. 6, correction checker subsystem 1075 includes six stages $1300_0$–$1300_5$, each stage including a correspondingly subscripted register 1302; a register input MUX 1304; an adder 1306; a feedback multiplier 1308; a timing control AND gate 1310; and, a zero-checking output OR gate 1312. Correction checker subsystem 1075 further includes an all-byte zero checking OR gate 1314 and a segmentation compensation circuit 1316. Compensation circuit is connected to receive the error pattern signal applied on line 1236 from error correction subsystem 1070, and outputs a compensated error pattern on line 1320.

Register $1302_5$ has its input terminal connected to the output terminal of its corresponding MUX $1304_5$. MUX $1304_5$ has its first input terminal 0 connected to an output terminal of adder $1306_5$; its second input terminal 1 connected to line 1244; and its third input terminal 2 connected to an output terminal of feedback multiplier $1308_5$. Line 1244 is connected to CRC generation/checker unit 603 for applying check remainder CRC bytes (i.e., CRC bytes only over the error) to register $1302_5$ (via MUX 1302).

Registers $1302_4$–$1302_0$ of the remaining stages are similarly connected, except that the second input terminal 1 for MUXes $1304_4$–$1304_0$ are connected to the output terminal of the next upstream register 1302. For example, input terminal 1 of MUX $1304_4$ is connected to the output terminal of register $1302_5$. In this way, the bank of registers 1302 function as a shift register, so that the CRC check remainder bytes, applied a byte at a time to correction checker 1075, can be loaded into registers 1302. In such loading process, the first byte is stored in register $1302_0$, the second byte in register $1302_1$, and so forth with the last byte stored in register $1302_5$.

In the above regard, correction checker subsystem 1075 is shown as including six stages, but more stages may be included in order to facilitate the programmable number of CRC bytes utilized by error correction system 1000. When the number of stages 1300 exceeds the number of CRC remainder bytes outputted from CRC generation/checker 603, zeros are loaded into the higher staged (i.e., higher subscripted) registers 1302.

The output terminal of each register 1302 is also connected to an input terminal of its respective feedback multiplier 1308, to a first input terminal of its associated adder 1306, and to input terminals of its associated OR gate 1312. An output terminal of each adder 1308 is connected to the third input terminal 2 of MUX 1304. The second input terminal of each adder 1306 is connected to an output terminal of its associated AND gate 1310. The output terminal of each adder 1306 is connected to the first input terminal 0 of its associated MUX 1304.

A first input terminal of each AND gate 1310 is connected to receive the compensated error pattern applied on line 1320. A second input terminal of each AND gate 1310 is connected to a timing line (i.e., pointer) which turns on only when the compensated error pattern applied on line 1320 affects the CRC byte loaded into the register 1302 for its stage. For example, the second input terminal of AND gate $1310_0$ is connected to line CRCPTR0; the second input terminal of AND gate $1310_1$ is connected to line CRCPTR1; and so forth.

The segmentation compensation circuit 1316 of FIG. 6 is seen to resemble the segmentation circuit 710 (see FIG. 3A) of the CRC generator/checker units. In this regard, segmentation compensation circuit 1316 includes three branched lines, with two of the branched lines having multipliers $M_1$ and $M_2$ corresponding to multipliers of FIG. 3A. All three branched lines are connected to respective input terminals of MUX 1322.

Each zero-checking output OR gate 1312 is connected to all bits of the byte output from its associated register 1302, and accordingly produces a non-zero output when any of the bits are non-zero. The output terminals of all OR gates 1312 are connected to input terminals of all-byte zero checking OR gate 1314. The output terminal of OR gate 1314 produces a non-zero signal only when correction checker subsystem 1075 is unable to verify correction by the correction subsystem 1060 (meaning that the error is uncorrectable).

As shown in FIG. 6, correction checker subsystem 1075 receives the error pattern in parallel and using an α basis representation. It should be understood, however, that correction checker subsystem 1075 can be implemented serially. Moreover, if input to correction checker subsystem 1075 is provided in another basis representation (e.g., β basis representation), basis conversion can be performed.

STRUCTURE: HEADER (ID) SUBSYSTEM

Figure 7:
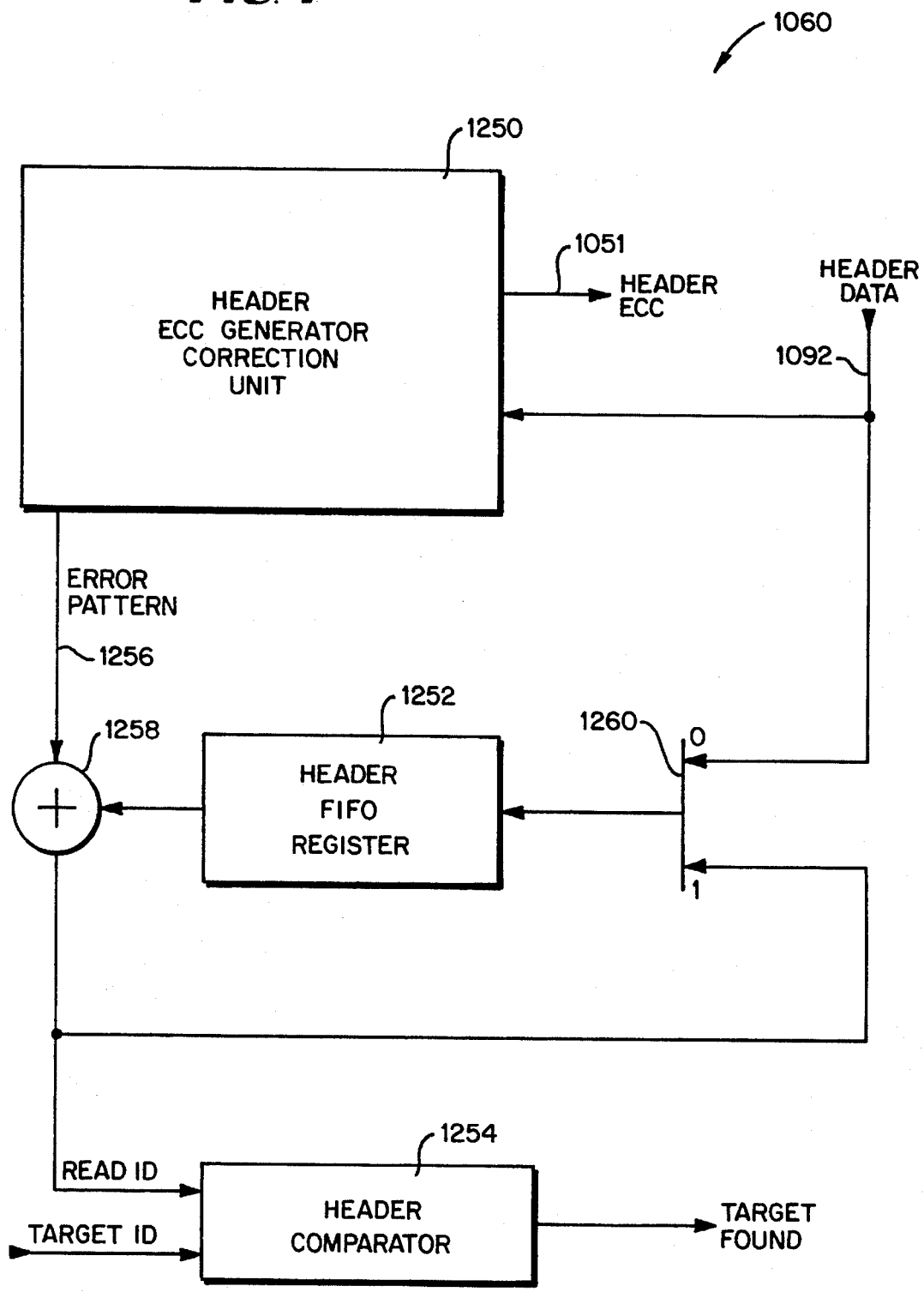
FIG. 7 is a schematic block diagrammatic view of a header ECC generator/corrector subsystem in accordance with an embodiment of the invention.

As further shown in FIG. 7, header (ID) subsystem 1070 includes a header ECC generator corrector unit 1250; header FIFO register 1252; header comparator 1254; adder 1258; and header MUX 1260. Header ECC generator corrector unit 1050 receives header data bytes on device data bus 1092 from device interface 1004) and outputs both a signal HEADER ECC on line 1051 (applied to input terminal 1 of MUX 1210) and a header error pattern signal on line 1256. The signal on line 1256 is applied to a first input terminal of adder 1258, a second input terminal of adder 1258 being connected to an output terminal of header FIFO register 1252. An output terminal of adder 1258 is connected to input terminal 1 of FIFO input MUX 1260. Input terminal 0 of MUX 1260 is connected to receive header data bytes on device data bus 1092. An output terminal of MUX 1260 is connected to the input terminal of header FIFO register 1252.

The output terminal of adder 1258 is also connected to a first input terminal of header comparator 1254. A second input terminal of header comparator 1254 is connected to receive a signal TARGET ID from correction controller 1020. An output signal TARGET FOUND from header comparator 1254 is applied to correction controller 1020 for indicating a match between a target header ID requested by controller 1020 and a header ID obtained from the storage media.

Header (ID) subsystem is described in yet further detail by the following patent applications, both of which are incorporated by reference: U.S. patent application Ser. No. 08/325,850 entitled "BURST ERROR CORRECTOR"; U.S. patent application Ser. No. 08/148,068 entitled "BURST ERROR CORRECTOR".

STRUCTURE: LBA SUBSYSTEM

LBA subsystem 1040 is used for detecting transfer of a wrong sector using logical block address (LBA). As shown in FIG. 2, LBA subsystem includes three AND gates, particularly AND gate 1041; AND gate 1042; and, AND gate 1043. An output terminal of AND gate 1041 is connected to a second input terminal of adder 1200. An output terminal of AND gate 1042 is connected to a second input terminal of adder 1202. An output terminal of AND gate 1043 is connected to a second input terminal of adder 1208. Each AND gate 1041, 1042, and 1043 has a respective ENA signal applied to a first input thereof, the ENA signal being generated by correction controller 1020. A second input terminal of AND gate 1041 is connected to receive a signal herein denominated as "HOST LBA"; second input terminals of AND gates 1042 and 1043 are connected to receive a signal herein denominated as "DEVICE LBA". Further structure and operation of LBA subsystem is described in U.S. patent application Ser. No. 08/310,973 filed Sep. 23, 1994 and entitled "A METHOD AND APPARATUS FOR DETECTING THE TRANSFER OF A WRONG SECTOR", which is incorporated herein by reference.

STRUCTURE: UTILIZATION DEVICE

As an aid to understanding the present invention, brief reference is now made to various structural aspects of utilization device 1002 other than error correction system 1000. As shown in FIG. 1A and previously explained, utilization device 1002 includes microprocessor 1003 and device interface 1004 (which interfaces with the media handled by device 1002). As shown in FIG. 1A, microprocessor 1003 is connected to error control system 1000 by (among other things) controller-microprocessor control bus 1028 and syndrome bus 1052.

Device interface 1004 includes, among its many other components, a detector unit 1004A; a RLL demodulator 1004B; a sync detector 1004C; a RLL modulator 1004D; a sync generator 1004E; a switch or MUX 1004F, and, a recording device interface 1004G. Also shown in FIG. 1A is recording/playback device (e.g., head(s)) 1005. Sync detector 1004C is connected to receive the binary data signal output from detector unit 1004A and to output a sync detect signal to RLL demodulator 1004B. The RLL modulator 1004D is connected to receive the outgoing signal from device data bus 1092, and to apply an RLL modulated signal to input terminal 1 of MUX 1004F. Sync generator 1004F outputs a sync signal to input terminal 1 of MUX 1004F. The output terminal of MUX 1004F is connected to recording device interface 1004G. The output of recording device interface 1004G is connected to recording/playback device 1005. The analog signal produced by recording/playback device 1005 is applied as signal RD SIGNAL to the input of detector unit 1004A.

Detector unit 1004A receives the analog read signal RD SIGNAL from the media (e.g., from recording/playback device 1005), and outputs both binary data to RLL modulator 1004B and (when appropriate) an erasure pointer for inclusion on erasure pointer bus 1094. The erasure pointer outputted by detector unit 1004A occurs when detector unit 1004A has doubts concerning the integrity of the signal it receives (e.g., low amplitude or noise). RLL modulator 1004B outputs the data signal for application to device data bus 1092. If RLL modulator 1004B encounters an abnormal condition such as an illegal or invalid binary sequence, RLL modulator 1004B outputs an erasure pointer signal for inclusion on erasure pointer bus 1094.

STRUCTURE: MEDIA FORMAT

As a further aid for understanding principles of the present invention, attention is directed to FIG. 10 for a simplified illustration of the format of a sector recorded on magnetic disk. As shown in FIG. 10, the sector includes a preamble, which is followed by a first "sync" or synchronization mark. The sync mark is typically a predefined bit pattern extending for a plurality of bytes. The first sync mark is immediately followed by a header field. The header field includes, among other things, a unique identification or ID for the sector. The header field is followed by a gap. The gap is, in turn, followed by a second sync mark. The second sync mark is immediately followed by a (user) data field.

Sector ID information included in the header field is also referred to herein as header data. Header data is not to be confused with user data, since correction for each occurs separately. In this regard, a special subsystem (the header (ID) subsystem 1060) is utilized for correcting header data, while correction subsystem 1070 corrects user data. Multiple random error symbols located in the ID field are corrected on-the-fly within a few clock cycles following the ID field.

In the illustrated embodiment, the length and definition of the sync mark is programmable. In this regard, device interface 1004 includes its own controller which, like correction controller 1020, has a plurality of mode selection registers which are set by microprocessor 1003. As understood by analogy to the mode select registers of correction controller 1020, the sync-related mode select registers permit the operator or user to specify the particular bit pattern to be utilized for the sync mark on the media. In this regard, for an illustration of a fault-tolerant sync detection scheme, see (for example), Glover, Neal and Dudley, Trent, *Practical Error Correction Design for Engineers*, 2nd Edition, (incorporated herein by reference) [specifically pages 250 to 255 thereof, which are attached hereto as Appendix 2].

OPERATION: WRITE FROM HOST: OVERVIEW

Figure 11:
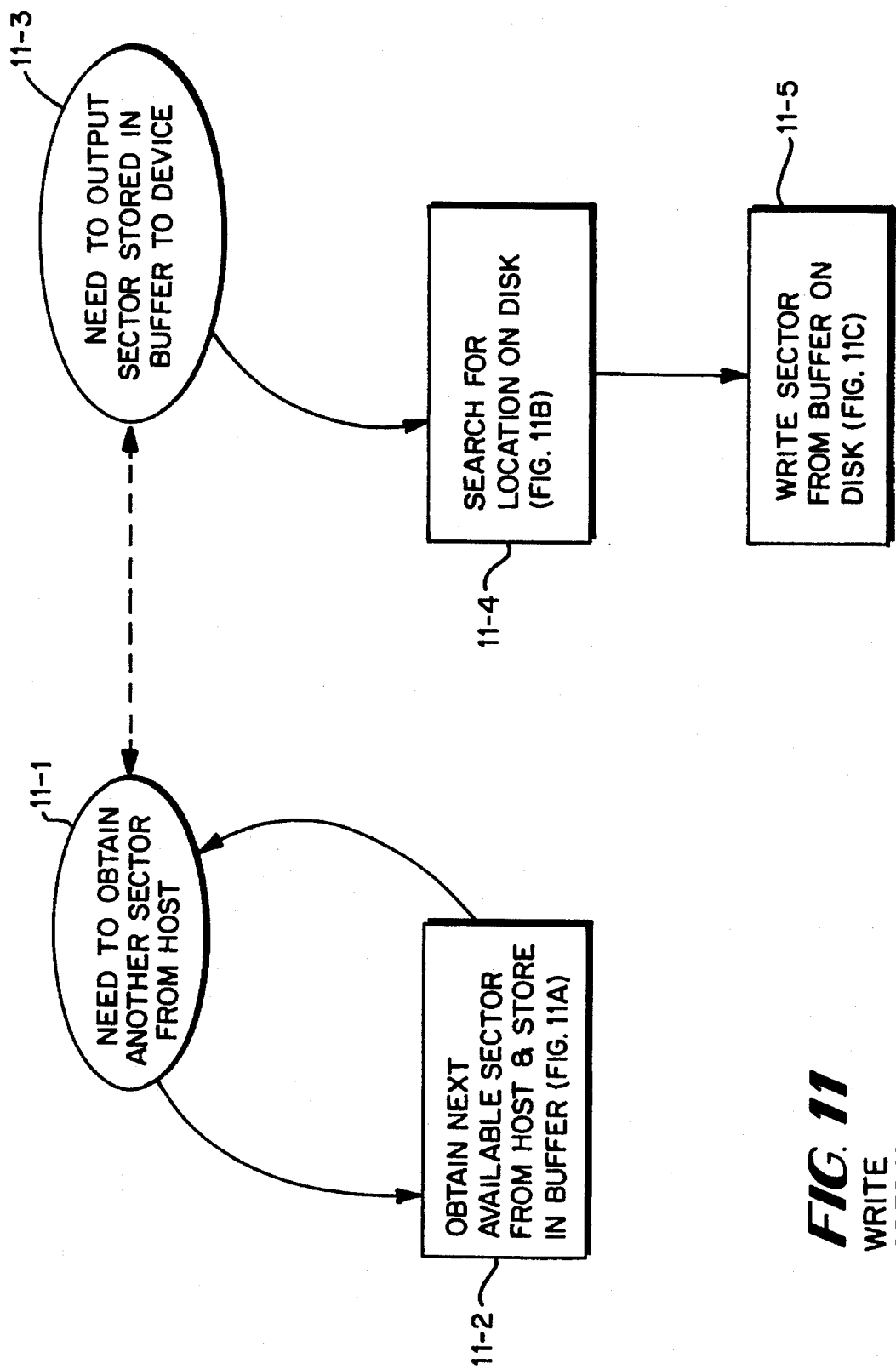
FIG. 11 is a state diagram showing general activities involved in an operation of writing sector(s) from a host to a storage medium handled by a utilization device, and shows relationships of FIG. 11A, 11B, and 11C.
Figure 11A:
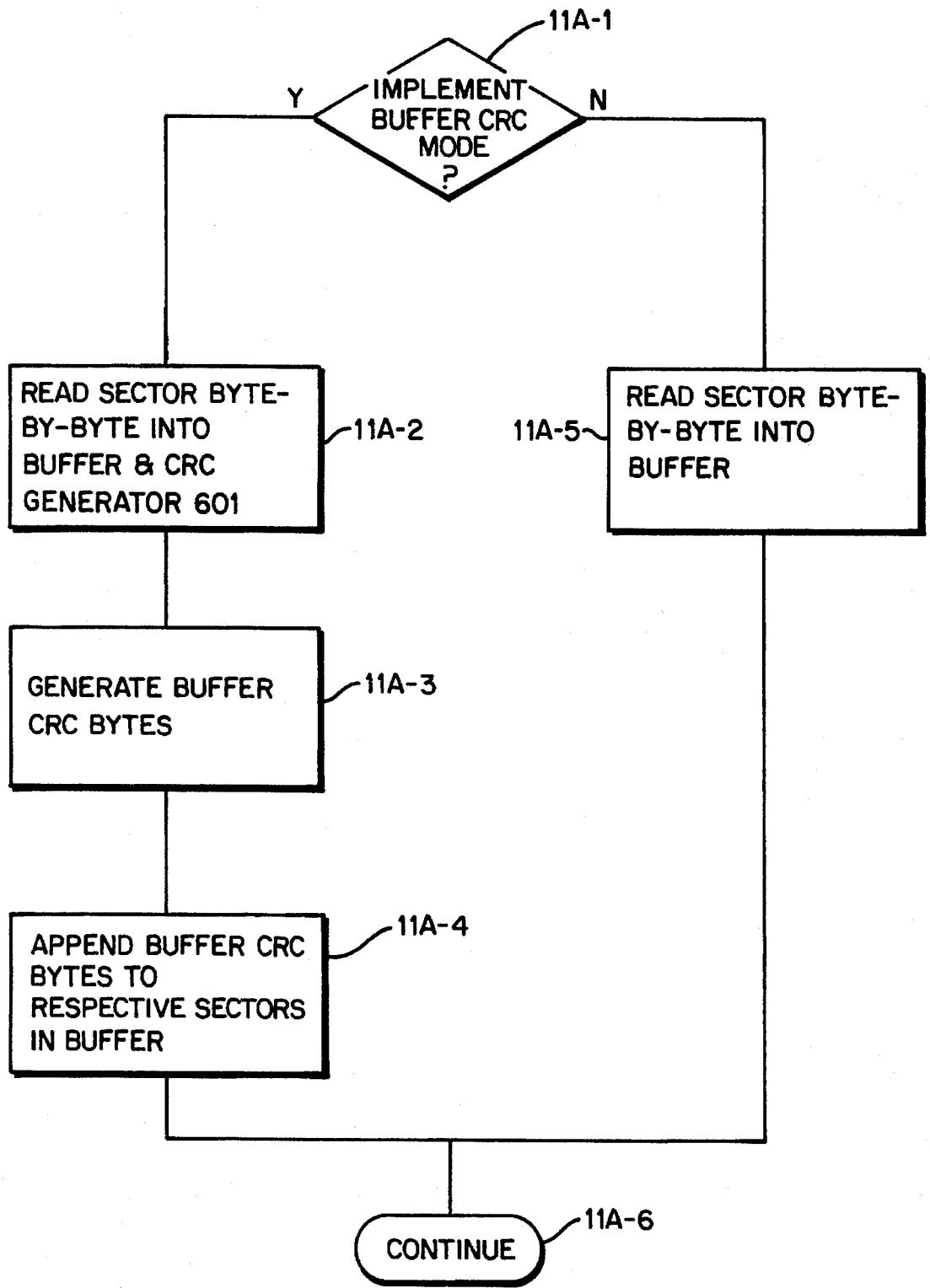
FIG. 11A is a flowchart showing steps involved in obtaining a sector from a host and storing the sector in a buffer.
Figure 11B:
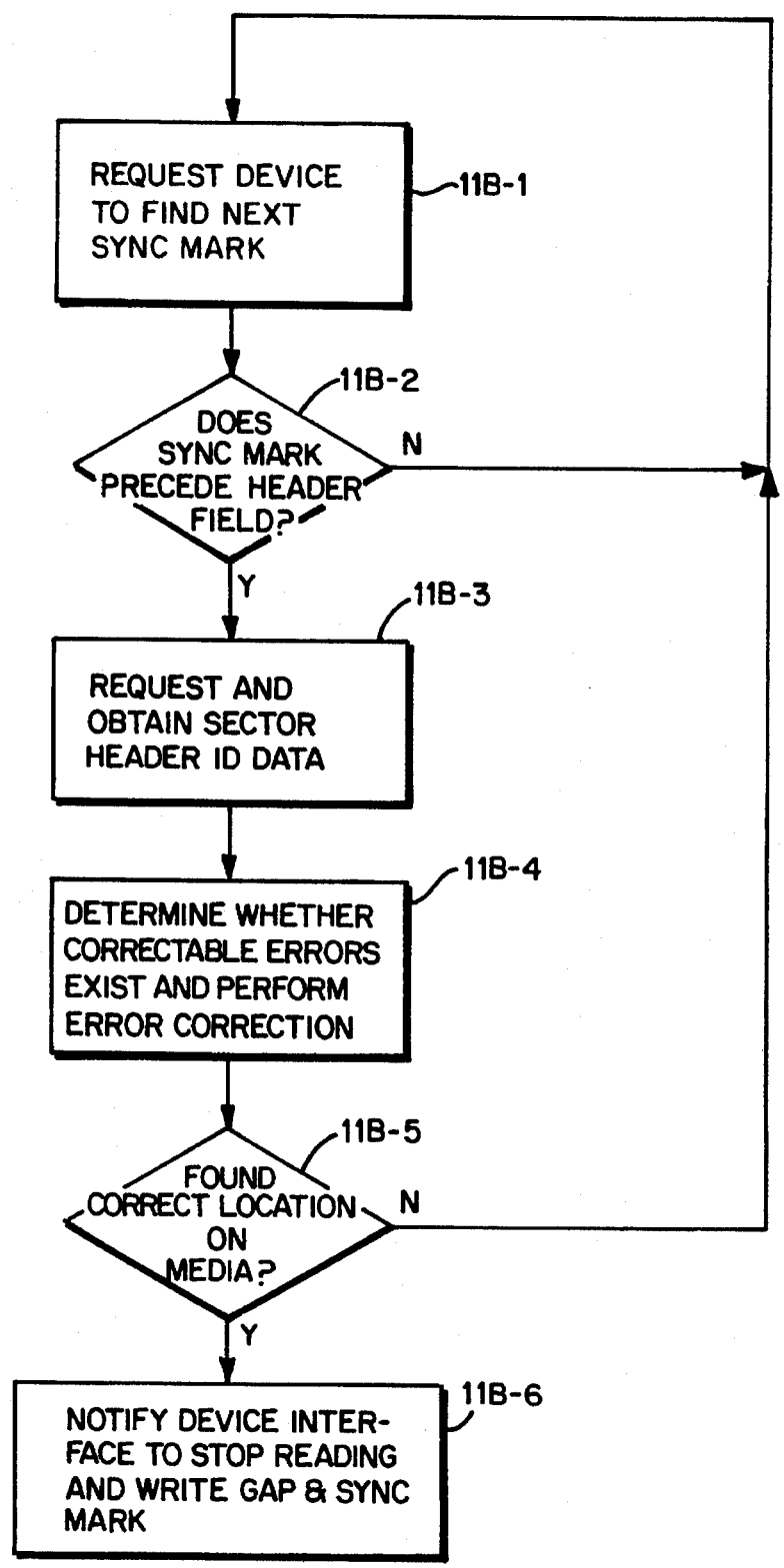
FIG. 11B is a flowchart showing steps involved in searching for a target write location on the storage medium.
Figure 11C:
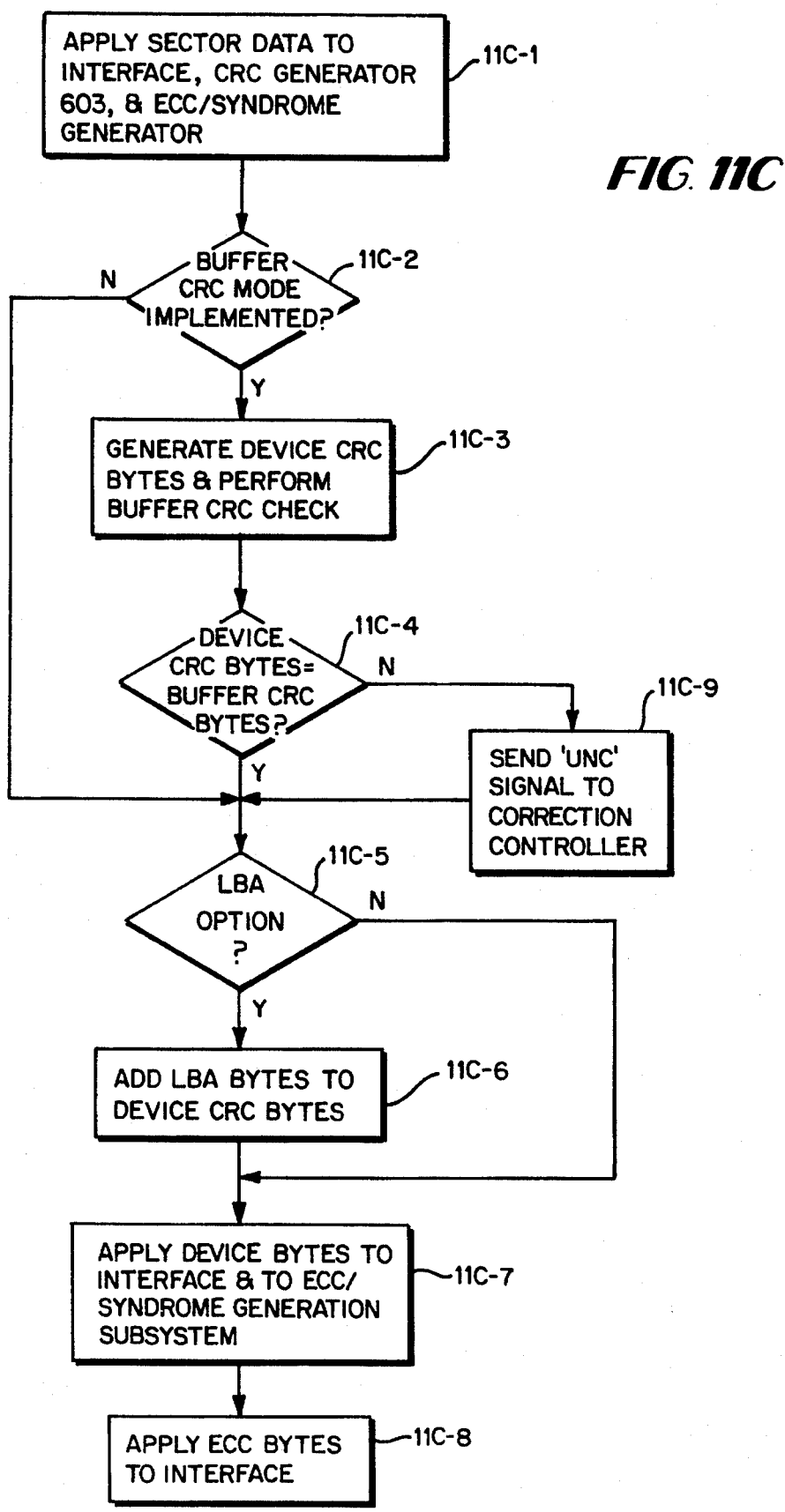
FIG. 11C is a flowchart showing steps involved in writing a sector on the storage medium.

FIG. 11 is a state diagram showing general activities involved in an operation of writing sector(s) from host 1010 to a storage medium handled by utilization device 1002, and further shows relationships of FIGS. 11A, 11B, and 11C.

At state 11-1, correction controller 1020 checks to determine whether buffer 1100 can obtain another sector from host 1010. Such determination occurs, for example, when host 1010 indicates on host side control bus 1022 that another sector is available for transfer to device 1002. In response to an indication that another sector is available from host 1010, at state 11-2 the next available sector is obtained from host 1010 and applied to buffer 1100. More detailed steps involved in implementation of state 11-2 are described in connection with FIG. 11A.

In state 11-3, correction controller 1020 determines whether buffer 1100 should output a sector to device 1002 for storage on the media handled thereby. When the determination of state 11-3 is affirmative, states 11-4 and 11-5 are consecutively executed.

In state 11-4, correction controller 1020 directs device 1002 to search for the precise location on the media for storing the sector-to-be-outputted from buffer 1100. In this regard, sector ID data obtained from the media during the search operation may include errors, which errors are corrected by header (ID) subsystem 1060 on the fly. This and other more detailed steps involved in implementation of state 11-4 are described in connection with FIG. 11B. Then, after the appropriate location has been reached as a result of execution of state 11-4, at state 11-5 correction controller 1020 directs writing of the sector from buffer 1100 to device 1002 for recording on the media. More detailed steps involved in implementation of state 11-5 are described in connection with FIG. 11C.

OPERATION: WRITE FROM HOST: OBTAIN SECTOR

FIG. 11A illustrates steps involved in implementation of state 11-2 (e.g., obtaining a sector from host 1010 and storing the obtained sector in buffer 1100). Initially, it is determined at step 11A-1 whether the operator has specified implementation of the buffer CRC mode. In this regard, if register APPEND BUFFER CRC (see FIG. 1A) has been set in correction controller 1020, steps 11A-2, 11A-3 and 11A-4 of FIG. 11A will be executed. These steps allow generation of a programmable number of CRC bytes to be generated over data in the sector which will be obtained from the host. If register APPEND BUFFER CRC has not been set, step 11A-5 will instead be executed.

At step 11A-2, the sector available at host 1010 is transferred byte-by-byte both into buffer 1100 (via MUX 642 and system data bus 1080 in FIG. 2) and into CRC generator checker unit 601 (via MUX 643 in FIG. 2). If, for example, the sector being obtained from host 1010 is represented as sector $S_n$ in FIG. 8A, pointer $P_{S(n)}$ starts at the top of the memory location for the sector and is incremented byte-by-byte as each byte of the sector is transferred into buffer 1100.

As data bytes from the sector obtained from host 1010 are also clocked into CRC generator/checker 601, as shown in step 11A-3 CRC generator/checker 601 generates a programmable number of buffer CRC bytes for the sector. The number of buffer CRC bytes generated by CRC generator/ checker 601 is determined by the value inputted into register # BUFFER CRC BYTES of correction controller 1020 (see FIG. 1A). As explained in U.S. patent application Ser. No. 08/325,717 entitled "CYCLIC REDUNDANCY CHECK METHOD AND APPARATUS" and U.S. patent application Ser. No. 08/147,865 entitled "DUAL PURPOSE CYCLIC REDUNDANCY CHECK" (both incorporated herein by reference), the data from the sector is divided into three input streams by segmenting circuit 710 (see FIG. 3), and a linear combination of the three streams is formed and used (by circuit 712) to generate the buffer CRC bytes. The buffer CRC bytes are outputted (on line 716 shown in FIG. 3) to MUX 642, so that MUX 642 applies the buffer CRC bytes to system data bus 1080 for receipt by buffer 1100.

At step 11A-4, the buffer CRC bytes are appended in buffer 1100 to the respective sector in buffer 1100. Appending of the buffer CRC bytes naturally occurs after all data bytes have been stored in buffer 1100, since all data bytes must first also be clocked through CRC generator/checker unit 601 in order to generate the buffer CRC bytes. The buffer CRC bytes for the sector are stored at an address in buffer 1100 with buffer manager 1120 associates with the respective sector, e.g., in addresses immediately following data bytes for the sector.

As indicated above, if register APPEND BUFFER CRC has not been set, step 11A-5 is executed. Step 11A-5 involves inputting the sector, byte-by-byte, into buffer 1100. The activity of step 11A-5 is understood with reference to previously-described step 11A-2, it being understood that step 11A-5 does not involve application of the sector to CRC generator/checker unit 601.

After completion of either step 11A-4 or step 11A-5, execution continues to await availability of another sector as indicated by step 11A-6.

OPERATION: WRITE FROM HOST: LOCATION SEARCH

FIG. 11B illustrates steps involved in implementation of state 11-4, e.g., searching for a location on media at which to record a sector ready for outputting from buffer 1100. At step 11B-1, correction controller 1020 requests device 1002 to find a next "sync" or synchronization mark on the media (see FIG. 10). After correction controller 1020 receives an indication that a next sync mark has been found, at step 11B-2 correction controller 1020 inquires whether the found sync mark precedes a header field (again see FIG. 10). If the result of step 11B-2 is negative, controller 1020 loops back to step 11B-1. If the result is positive, at step 11B-3 correction controller 1020 requests that sector ID data from the header field be obtained and moved (on device data bus 1092) into header (ID) subsystem 1060. In particular, at step 11B-3 the sector ID data from the header field is moved both into header ECC generator correction unit 1250 and header FIFO register 1252 (see FIG. 7).

At step 11B-4, header (ID) subsystem 1060, and particularly header ECC generator correction unit 1250, determines whether any errors exist in the sector ID obtained at step 11B-3. If correctable errors exist in the sector ID, at step 11B-4 header ECC generator correction unit 1250 performs correction of the sector ID. In the illustrated embodiment, the sector ID comprises eight bytes which are utilized by header ECC generator correction unit 1250 to generate syndromes and, when a correctable error is detected, an error pattern.

Should a sector ID error be noted at 11B-4, the error pattern generated by header ECC generator correction unit 1250 is applied on line 1256 to adder 1258 (see FIG. 7). Adder 1258 XORs the error pattern with the sector ID data originally obtained from media (which is stored in header FIFO register 1252) to perform correction, and then returns the corrected sector ID to register 1252 (via MUX 1260).

At step 11B-5 header (ID) subsystem 1060 determines whether the sector ID contained in header FIFO register 1252 (now corrected, if necessary, as described in step 11B-4) is the "TARGET ID" sought by correction controller 1020. The TARGET ID is the location at which the sector-to-be-outputted from buffer 1100 should be recorded. For the determination of step 11B-5, correction controller 1020 sends the value of TARGET ID to header comparator 1254 (see FIG. 7). Header comparator 1254 compares the value of TARGET ID with the value of the sector ID contained in header FIFO register 1252. If a match occurs, meaning that the correct location on media has been found, a signal TARGET FOUND is applied to correction controller 1020 (see also FIG. 1A).

If the TARGET ID is not found at step 11B-5, execution returns to step 11B-1 for searching for another sync mark, and ultimately for another sector ID. If the TARGET ID is found at step 11B-5, at step 11B-6 correction controller 1020 directs device interface 1004 to write a gap and a sync mark following the header, in preparation of recording a data field (the data field being the sector-ready-to-leave buffer 1100). In this regard, recall from FIG. 10 that, according to the media format, a gap and sync mark precede a data field.

OPERATION: WRITE FROM HOST: WRITE SECTOR

Steps involved in implementation of state 11-5 (e.g., recording a sector to disk) are described in connection with FIG. 11C. At step 11C-1, sector data from the sector-to-be-outputted from buffer 1100 is applied to device interface 1004, to CRC generation and checking unit 603, and to ECC/syndrome generation subsystem 1050. Assuming the sector-to-be-outputted from buffer 1100 is illustrated as sector $S_{n+k}$ in FIG. 8A, the pointer $P_{S(n+k)}$ is incremented as each byte of the sector data is read out of buffer 1100 and applied to system data bus 1080. As shown in FIG. 2, the bytes of sector data are transmitted from buffer 1100 to device interface 1004 via system data bus 1080, MUX 645, MUX 644, adder 1208, and MUX 1210. The bytes of sector data are transmitted from buffer 1100 to CRC generator/checker unit 603 via system data bus 1080 and MUX 645. The bytes of sector data are transmitted from buffer 1100 to ECC/syndrome generation subsystem 1050 via system data bus 1080, MUX 645, MUX 644, and adder 1208.

Concerning operation of CRC generator/checker unit 603, at step 11C-2 a determination is made whether the buffer CRC mode has been implemented. This mode has been described above with respect to analogous step 11A-1. If the buffer CRC mode has been implemented, steps 11C-3 and 11C-4 are executed, followed by step 11C-5. If the buffer CRC mode has not been implemented, execution jumps to step 11C-5.

At step 11C-3, CRC generator/checker unit 603 regenerates CRC bytes (the regenerated CRC bytes being known as device CRC bytes or secondary CRC bytes) and performs a check with respect to the buffer CRC bytes. In this regard, in connection with step 11C-3, CRC generator/checker unit 603 uses only the sector data obtained from buffer 1100 to regenerate its own device CRC bytes, in essentially the same manner as CRC generator/checker unit 601 generated the CRC buffer bytes as analogously described with respect to step 11A-3. After it has regenerated its own device CRC bytes, CRC generator/checker unit 603 receives the buffer CRC bytes appended to the sector data obtained from buffer 1100 and (at step 11C-3) compares those buffer CRC bytes to the regenerated device CRC bytes. The comparison is specifically performed by error checker 714 (see FIG. 3 and FIG. 3A) of CRC generator/checker unit 603.

If at step 11C-4 error checker 714 detects that the regenerated device CRC bytes do not agree with the buffer CRC bytes, then (at step) 11C-9 CRC generator/checker unit 603 sends an signal UNC to correction controller 1020 to advise that storage/retrieval from buffer 1100 introduced an error.

Assuming no buffer error, execution continues at step 11C-5 by checking to see whether the LBA option has been implemented. If the LBA option has been implemented, execution includes step 11C-6 followed by step 11C-7. If the LBA option has not been implemented, execution jumps directly to step 11C-7.

It will be recalled that the LBA option involves usage of the logical block address (LBA) in order to detect transfer of a wrong sector. If the LBA option has been implemented, at step 11C-6 the LBA bytes (DEVICE LBA) are added (XORed) at adder 1208 to the device CRC bytes outputted from CRC generator/checker unit 603.

As indicated above, step 11C-1 resulted in the application of the sector data bytes to interface device 1004. At step 11C-7, the device CRC bytes (optionally XORed with the LBA bytes at step 11C-6) are applied to interface device 1004 to follow the sector data bytes. In addition, at step 11C-7 these device CRC bytes are also applied to ECC/syndrome generation subsystem 1050.

Upon receipt of the sector data bytes and continuing with receipt of the device CRC bytes, ECC/syndrome generation subsystem 1050 has been generating ECC bytes for each codeword of the sector. The generation of the ECC bytes by ECC/syndrome generation subsystem 1050 is understood with reference to U.S. patent application Ser. No. 08/124,936 of Zook and Glover, filed Sep. 21, 1993 and entitled "PROGRAMMABLE REDUNDANCY/SYNDROME GENERATOR", which is incorporated herein by reference. As illustrated in FIG. 4A, ECC/syndrome generation subsystem 1050 conducts a three-interleaved ECC encoding operation. After the ECC bytes are generated, as shown at step 11C-8, the ECC bytes are applied to MUX 1210 to follow application of the device CRC bytes to device interface 1040.

Thus, that data field of a sector being written to the utilization device includes first the sector data (obtained from buffer 1100), followed by the device CRC bytes (obtained from CRC generator/checker unit 603 and optionally modified by LBA), followed by the ECC bytes (generated by ECC/syndrome generation subsystem 1050). This data field would follow the gap and sync mark written by the device 1002 at step 11B-6 (see also FIG. 10)

It should be understood that the foregoing activities, optionally modified as above noted, are conducted during normal operation for essentially each sector to be transferred from host 1010 to utilization device 1004. For example, if host 1010 were to request that user data sufficient to fill twenty sectors be transferred to media, twenty sectors would eventually be transferred into buffer 1100 and ultimately to utilization device 1004. All twenty sectors may or may not reside simultaneously in buffer 1100, depending upon such factors as size of the buffer and relative speed of the equipment (e.g., utilization device 1004).

OPERATION: READ FROM DEVICE: OVERVIEW

Figure 12:
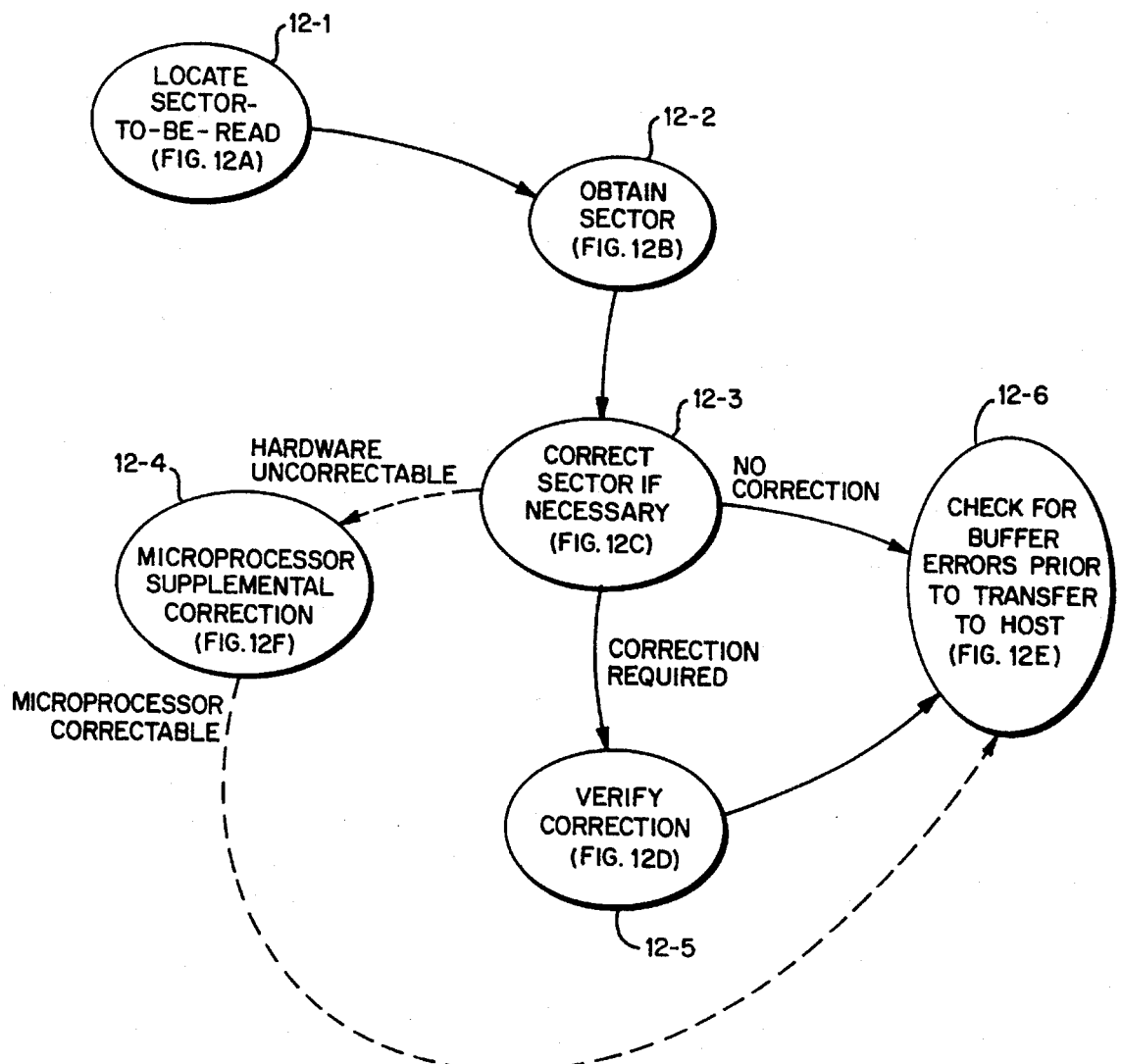
FIG. 12 is a state diagram showing general activities involved in an operation of reading sector(s) from a storage medium handled by a utilization device for transmission to a host, and shows relationships of FIG. 12A, 12B, 12C, 12D, 12E, and 12F.

FIG. 12 is a state diagram showing general activities involved in an operation of reading sector(s) from utilization device 1002 (e.g., from the storage medium handled by utilization device 1002) for transfer to host 1010, and further shows relationships of FIG. 12, FIG. 12B, FIG. 12C, FIG. 12D, FIG. 12E and FIG. 12F.

State 12-1 involves locating the particular sector to be read from utilization device 1002. Similar to the location operation performed with respect to FIG. 11B, state 12-1 requires checking (and, if necessary, correcting) of sector ID (header) data. More detailed steps involved in implementation of state 12-1 are described in connection with FIG. 12A.

State 12-2 involves obtaining from the media the sector-to-be-transferred and storing the sector in buffer 1100. More detailed steps involved in implementation of state 12-2 are described in connection with FIG. 12B. State 12-2 is ultimately followed by state 12-3, which involves checking each codeword of the sector to detect errors using correction subsystem 1070. If no correction is required, state 12-6 is assumed. If correction is required, during state 12-3 correction subsystem 1070 attempts to correct erroneous bytes of the sector. More detailed steps involved in implementation of state 12-3 are described in connection with FIG. 12C.

If the sector is correctable by correction subsystem 1070, state 12-5 is assumed for the purpose of using correction checker subsystem 1075 for verifying the correction implemented by correction subsystem 1070. More detailed steps involved in implementation of state 12-5 are described in connection with FIG. 12D.

Upon completion of state 12-5, state 12-6 is assumed. During state 12-6, CRC correction/checker unit 601 is utilized to check for any errors introduced by storage/retrieval operations concerning buffer 1100. More detailed steps involved in implementation of state 12-6 are described in connection with FIG. 12E.

Should correction subsystem 1070 determine during state 12-3 that a sector has an uncorrectable codeword, state 12-4 is optionally executed. In state 12-4, device microprocessor 1003 attempts to correct the sector using one or more programmed strategies. More detailed steps involved in implementation of state 12-4 are described in connection with FIG. 12F. Upon completion of optional state 12-4, state 12-6 is assumed.

OPERATION: READ FROM DEVICE: LOCATE SECTOR

Figure 12A:
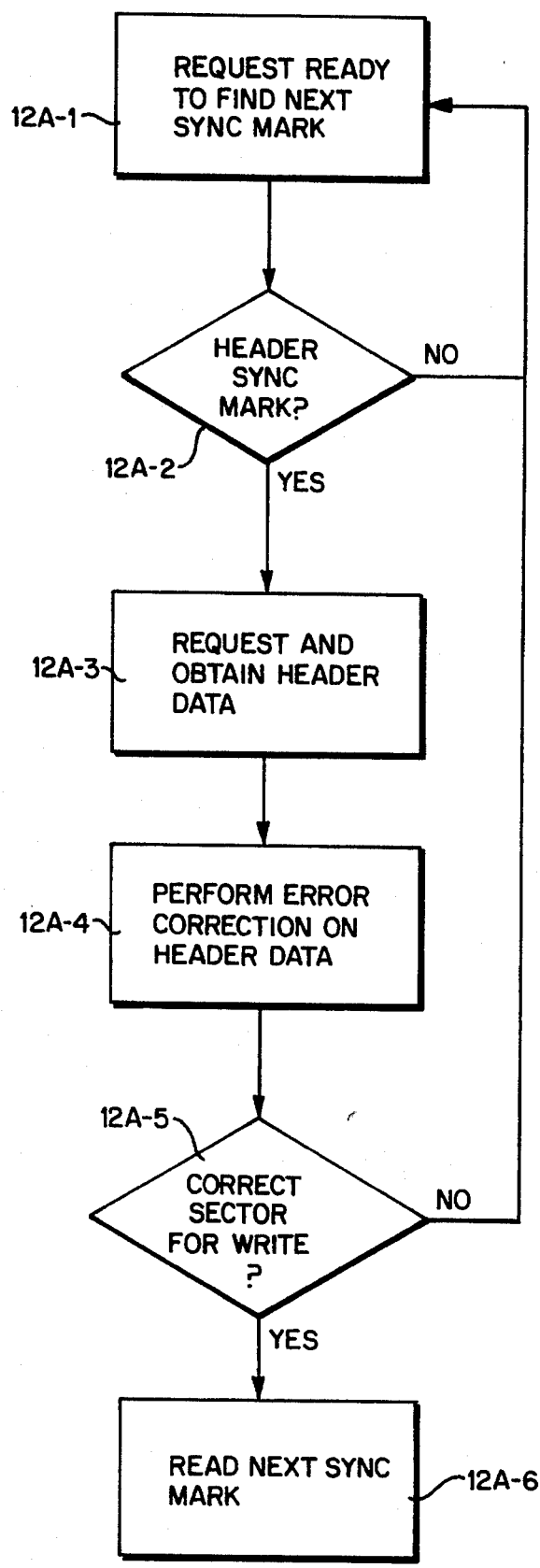
FIG. 12A is a flowchart showing steps involved in searching for a target read location on the storage medium handled by the utilization device.

FIG. 12A illustrates steps executed in implementation of state 12-1 (e.g., locating the particular sector to be read from utilization device 1002). At step 12A-1, correction controller 1020 request device interface 1004 to find the next sync mark on media. After correction controller 1020 receives an indication that a next sync mark has been found, at step 12A-2 correction controller 1020 inquires whether the found sync mark precedes a header field (again see FIG. 10). If the result of step 12A-2 is negative, controller 1020 loops back to step 12A-1. If the result is positive, at step 12A-3 correction controller 1020 requests that sector ID data from the header field be obtained and moved (on device data bus 1092) into header (ID) subsystem 1060. In particular, at step 12A-3 the sector ID data from the header field is moved both into header ECC generator correction unit 1250 and header FIFO register 1252 (see FIG. 7).

At step 12A-4, header (ID) subsystem 1060, and particularly header ECC generator correction unit 1250, determines whether any errors exist in the sector ID obtained at step 12A-3. If correctable errors exist in the sector ID, at step 12A-4 header ECC generator correction unit 1250 performs correction of the sector ID.

Should a sector ID error be noted at 12A-4, the error pattern generated by header ECC generator correction unit 1250 is applied on line 1256 to adder 1258 (see FIG. 7). Adder 1258 XORs the error pattern with the sector ID data originally obtained from media (which is stored in header FIFO register 1252) to perform correction, and then returns the corrected sector ID to register 1252 (via MUX 1260).

At step 12A-5 header (ID) subsystem 1060 determines whether the sector ID contained in header FIFO register 1252 (now corrected, if necessary, as described in step 12A-4) is the "TARGET ID" sought by correction controller 1020. The TARGET ID is the location at which the sector-to-be-outputted from buffer 1100 should be recorded. For the determination of step 115-5, correction controller 1020 sends the value of TARGET ID to header comparator 1254 (see FIG. 7). Header comparator 1254 compares the value of TARGET ID with the value of the sector ID contained in header FIFO register 1252. If a match occurs, meaning that the correct location on media has been found, a signal TARGET FOUND is applied to correction controller 1020 (see also FIG. 1A).

If the TARGET ID is not found at step 12A-5, execution returns to step 12A-1 for searching for another sync mark, and ultimately for another sector ID. If the TARGET ID is found at step 12A-5, at step 12A-6 correction controller 1020 requests device interface 1004 to read to the next sync mark on the media. In this regard, it will be recalled from the previous discussion of FIG. 10 that data fields follow a sync mark. Now that the header for the sector-to-be-read has been found (at step 12A-5), correction controller 1020 knows that the user data required by host 1010 follows the next sync mark.

OPERATION: READ FROM DEVICE: OBTAIN SECTOR

Figure 12B:
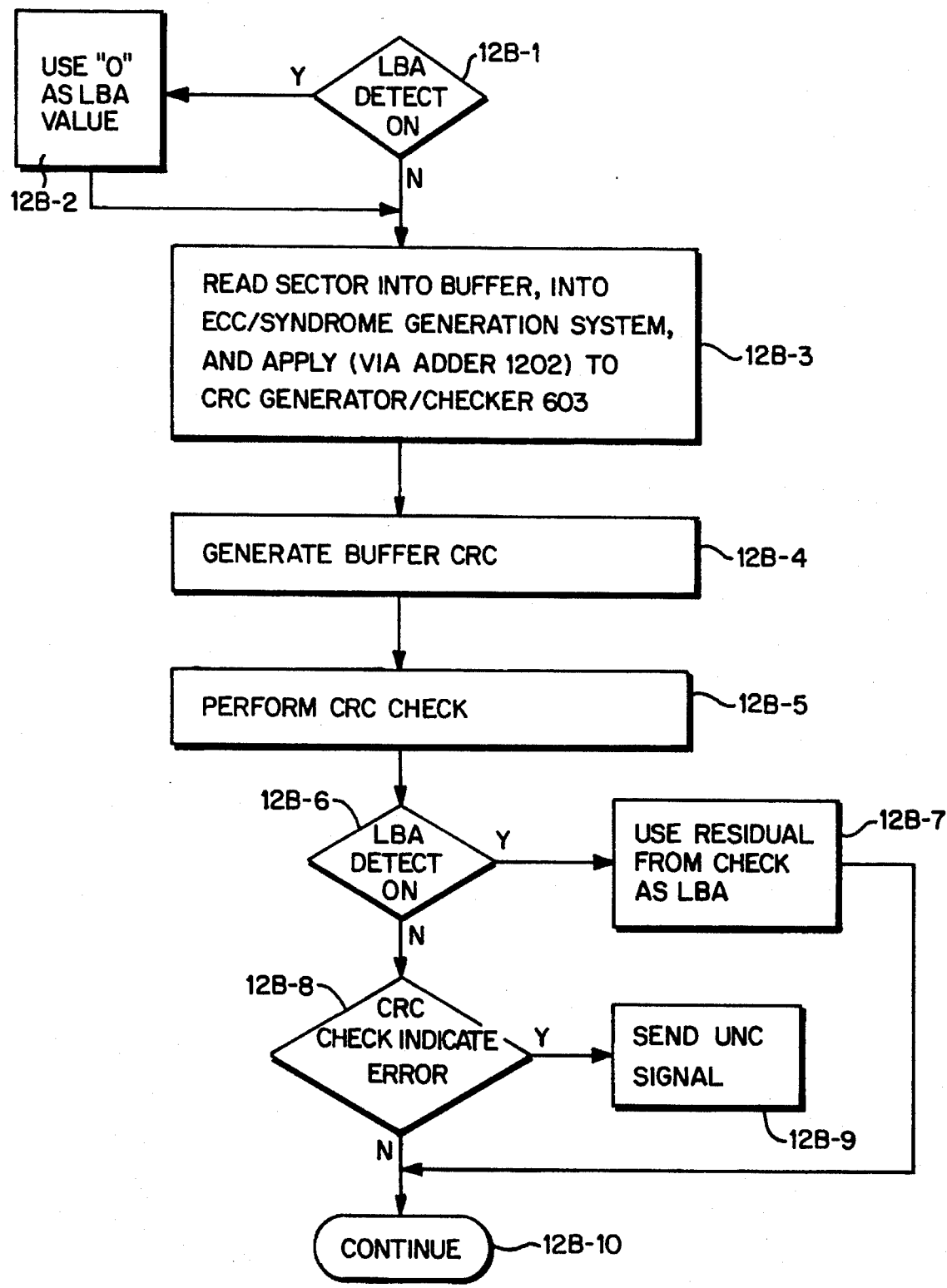
FIG. 12B is a flowchart showing steps involved in obtaining a sector from the storage medium.
Figure 12C:
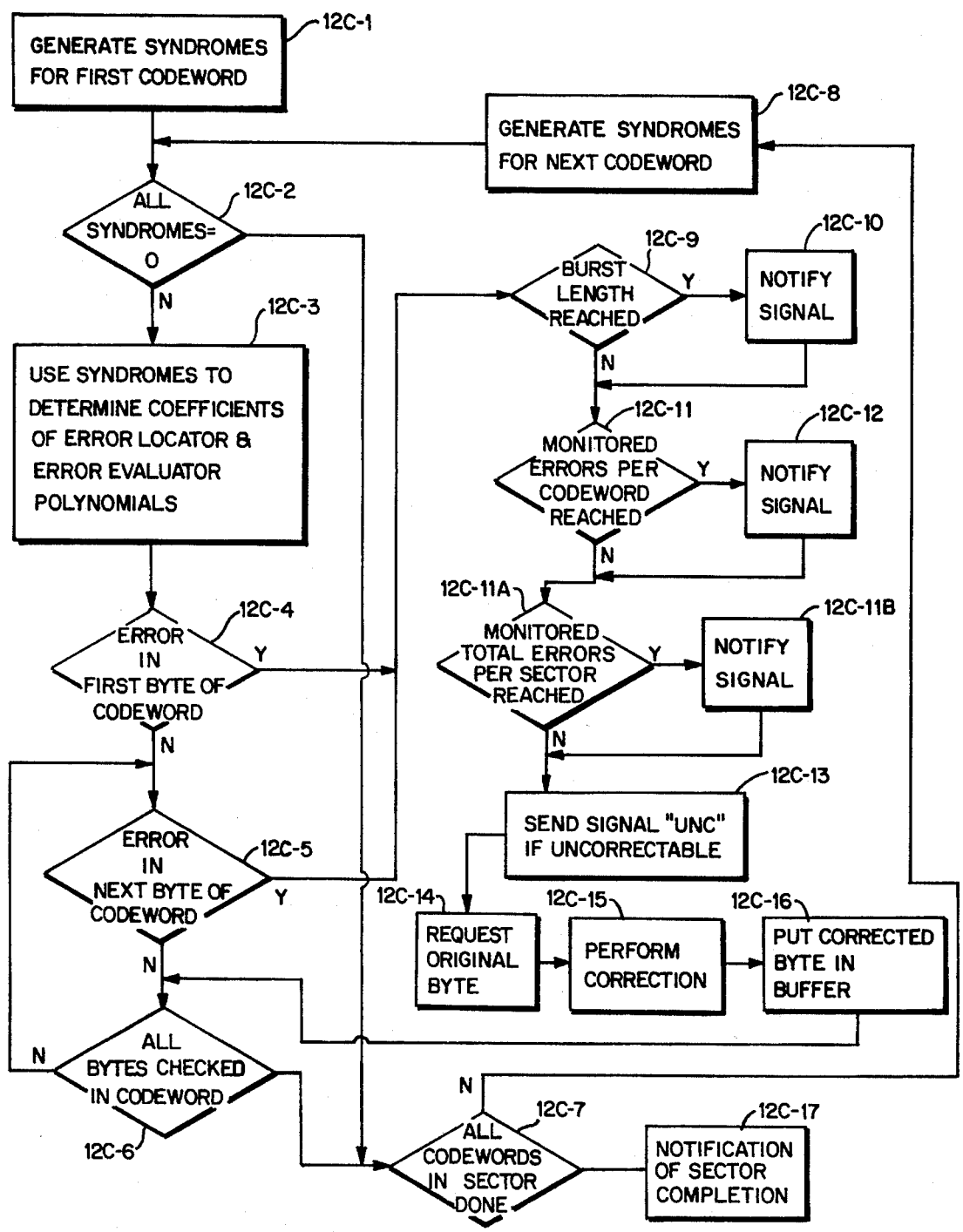
FIG. 12C is a flowchart showing steps involved in correcting a sector from the storage medium.

As a result of performance of state 12-1, and particularly the last step 12A-6 thereof, utilization device is positioned to read the user data for the sought sector. FIG. 12C illustrates steps executed in implementation of state 12-2 (e.g., obtaining a sector from device 1002).

Initially, at step 12B-1, correction controller 1020 determines whether a DETECT LBA mode has been implemented. The DETECT LBA mode is implemented when a user or operator and/or correction controller 1020 does not know, but would like to know, specific values utilized during the LBA mode (e.g., logical block address values). DETECT LBA mode is implemented by setting register DETECT LBA in correction controller 1020 (see FIG. 1A).

If the DETECT LBA mode has been implemented, as a result of the determination at step 12B-1, step 12B-2 is executed prior to executing step 12B-3. Step 12B-2 involves requesting LBA subsystem 1040 to use zero as the LBA value which is applied when sector CRC values are being transmitted through adders 1202 and 1208.

At step 12B-3, correction controller 1020 directs device interface 1004 to apply the user data from the sector to device data bus 1092. Upon such application, the user data of the sector is transmitted (via system data bus 1080) into buffer 1100 (under control of buffer manager 1120). In this regard, assuming sector $S_m$ as illustrated in FIG. 12B is being acquired from utilization device 1004, buffer manager 1120 uses incrementing pointer $P_{S(m)}$ for clocking bytes of the sector into buffer 1100.

It will also be noted that the sector user data obtained from utilization device is simultaneously applied (via MUX 645 and adder 1202) to CRC generator/checker unit 603 and (via MUX 645, MUX 644, and adder 1208) to ECC/syndrome generation subsystem 1050. If the DETECT LBA option is implemented, or if the basic LBA OPTION is not implemented, during application of CRC bytes to adders 1202 and 1208, zero signals will be applied to adders 1202 and 1208 from LBA subsystem 1040 (see step 12B-2 above). If the LBA signal applied from LBA subsystem 1040 is non-zero, the LBA signals applied from LBA subsystem 1040 to adders 1202 and 1208 when the CRC bytes are applied serve to remove the LBA values from the CRC values.

At step 12B-4, CRC generator/checker unit 603 uses the incoming sector data to generate buffer CRC bytes. The manner of such regeneration is understood with reference to previous discussions of CRC regeneration. Then, at step 12B-5, error checker 714 of CRC generator/checker unit 603 compares the regenerated buffer CRC bytes with the incoming, sector-obtained CRC bytes (with any known LBA removed).

After the CRC check of step 12B-5, at step 12B-6 correction controller 1020 again determines whether the LBA DETECT mode is implemented (in like manner as step 12B-1 above). If the LBA DETECT mode is implemented, and if the check of step 12B-5 resulted in an error pattern, at step 12B-7 such error pattern developed by checker 714 of CRC generator/checker unit 603 is now presumed to be the previously unknown LBA value. If the LBA DETECT mode is not implemented, a determination is made at step 12B-8 whether the check of step 12B-5 resulted in an error. If so, at step 12B-9 an uncorrectable signal (UNC) is generated on line 718 for application to correction controller 1020. Otherwise, execution continues (as indicated by step 12B-10) with the sector checking and (if necessary) correction.

OPERATION: READ FROM DEVICE: CORRECT SECTOR

FIG. 12C illustrates steps executed in preferred implementation of state 12-3 (e.g., checking each codeword of the sector to detect errors using correction subsystem 1070). It should be understood that various correction techniques may be employed without departing from the scope of the present invention. For instance, while normally syndromes are used to decode error values and locations during a read operation, alternatively, remainder derived from dividing the codeword by generator polynomial, can be employed to decode the same. The term error signature will thus denote the use of either syndromes or remainders for decoding purposes in a read operation. At step 12C-1, ECC/syndrome generation subsystem 1050 generates syndromes for the first codeword of the sector. The syndromes are applied on line 1220 to correction subsystem 1070. The manner of syndrome generation by ECC/syndrome generation subsystem 1050 is understood from U.S. patent application Ser. No. 08/124,936 of Zook and Glover, filed Sep. 21, 1993 and entitled "PROGRAMMABLE REDUNDANCY/SYNDROME GENERATOR", which is incorporated herein by reference.

At step 12C-2 it is determined whether all syndromes generated for the codeword are zero. If one or more of the syndromes is non-zero, steps 12C-3 through 12C-6 are executed prior to execution of step 12C-7. If all syndromes are zero, execution jumps to step 12C-7.

At step 12C-3, correction subsystem 1070, and particularly decoder circuit 199 (see FIG. 5) uses the syndromes applied on line 1220 determine coefficients of an error locator polynomial σ and thereafter generates coefficients of an error evaluator polynomial ω for the codeword. Also at step 12C-3, root search and error/erasure magnitude generator 196 determines the error pattern for the codeword.

At step 12C-4 it is determined whether the error locators point to the first byte of the codeword as being erroneous. If an error does not detected in the first byte of the codeword, a check is made at step 12C-5 to determine if an error exists for the next byte of the codeword. Checking for erroneous bytes continues through the codeword (indicated by looping back to step 12C-5) until it is determined (at step 12C-6) that all bytes of the codeword have been checked.

When it is determined at step 12C-6 that all bytes of the codeword have been checked for error, a determination is made (at step 12C-7) whether other codewords of the sector remain for checking. If other codewords remain, execution jumps to step 12C-8 for generation of syndromes for the next codeword. After the syndromes for the next codeword are generated at step 12C-8, execution returns to step 12C-2 for checking whether the syndromes are zero.

If it is determined at either step 12C-4 or step 12C-5 that an error exists in a byte of the codeword, step 12C-9 is next executed. At step 12C-9, it is determined if the number of consecutive bytes in the codeword having an error has reached the number inputted to decoder circuit 199 by the programmable signal BURST LENGTH. The value of signal BURST LENGTH is programmed by setting the value MONITOR BURST LENGTH in mode select registers 1029 (see FIG. 1A). If the BURST LENGTH value is reached, at step 12C-10 decoder circuit 199 issues a notification signal BURST LENGTH DETECT to correction controller 1020. The value of signal BURST LENGTH can thus be programmed on the fly, as may occur when, for example, an operator is informed that the originally-programmed BURST LENGTH value has been reached, and the operator desires to raise the BURST LENGTH value for continuing operation.

After execution of step 12C-9 or step 12C-10, step 12C-11 is executed. At step 12C-11, root search and error/erasure magnitude generator 196 determines whether the number of erroneous bytes thus far encountered in the codeword exceeds a threshold value CODEWORD ERROR NUMBER input from correction controller 1020. The value of CODEWORD ERROR NUMBER is also programmable on the fly in accordance with a corresponding setting of mode select register MONITOR CODEWORD ERROR NUMBER of correction controller 1020 (see FIG. 1A). The value of CODEWORD ERROR NUMBER is typically less than the number of errors that would render a codeword uncorrectable. If the number of (not necessarily consecutive) bytes in the codeword requiring correction reaches the value CODEWORD ERROR NUMBER, generator 196 issues a signal DETECT # CODEWORD ERRORS to correction controller 1020 (step 12C-12). In a similar manner, the total number of errors in a sector is monitored by 12C-11A and if the same exceeds the value in register MONITOR TOTAL ERROR COUNT, status is accordingly reported by 12C-11B.

After execution of step 12C-11 or step 12C-12, step 12C-13 is executed. At step 12C-13, root search and error/erasure magnitude generator 196 sends a signal UNC (i.e., uncorrectable) if the codeword is uncorrectable.

Assuming that the codeword is correctable, at step 12C-14, it is requested that the original (erroneous) byte in buffer 1100 be sent (on line 1240) to register 195 (see FIG. 5). Then, at step 12C-15, adder 202 performs the correction by XORing the error pattern (applied on line 1236 from error/erasure magnitude generator 196) with the original byte (in register 195), with the result being returned (step 12C-16) on line 1242 and stored as the corrected byte in buffer 1100.

After byte correction is performed at step 12C-16, step 12C-6 is next executed for determining whether other bytes remain for checking in the codeword.

In connection with the correction of bytes in a sector, in the illustrated embodiment bytes of the sector are checked in reverse order. Accordingly, FIG. 8B shows correction byte pointer $P_{S(m+c)}$ starting at the last byte of the sector, and (unlike other buffer pointers) being decremented upon examination of the "next" byte.

After all codewords in a sector have been checked and erroneous codewords corrected, at step 12C-17 correction controller 1020 is notified of completion of the sector.

In FIG. 1A, erasure pointers 1094, are generated in real time by detector unit 1004A and RLL 1004B and output by device interface 1004 while data is continuously being received by device interface 1004.

OPERATION: READ FROM DEVICE: CHECK CORRECTION

Figure 12D:
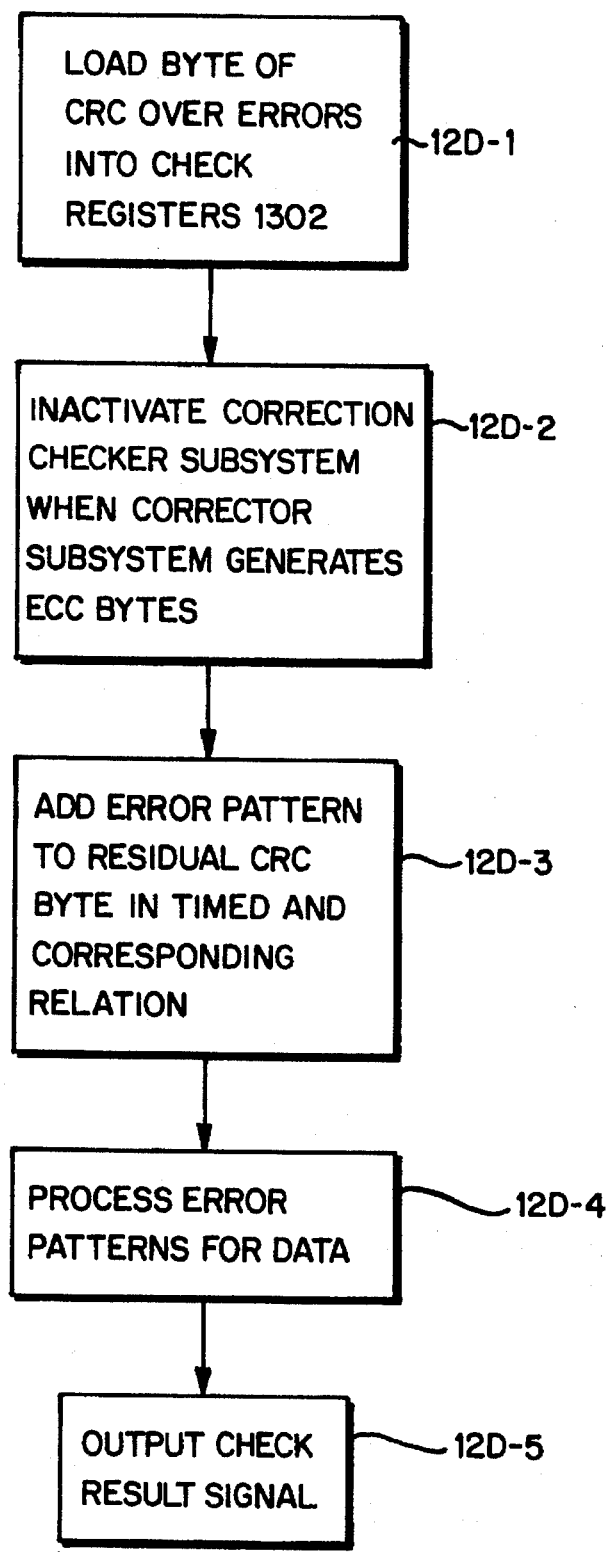
FIG. 12D is a flowchart showing steps involved in checking correction of a sector obtained from the storage medium.

FIG. 12D illustrates steps executed in connection with state 12-5 (e.g., steps executed by correction checker subsystem 1075 for verifying the correction implemented by correction subsystem 1070). At step 12D-1, the CRC check remainder bytes are loaded into registers 1302 (see FIG. 6) on line 1244 from CRC generator/checker unit 603. As explained above with reference to FIG. 6, the first byte of the CRC check remainder bytes is loaded into register $1302_0$; the second byte of CRC check remainder bytes is loaded into register $1302_1$; and so forth. Should there be more stages in correction checker subsystem 1075 than CRC bytes supplied by CRC generator/checker unit 603, the higher staged (i.e., higher subscripted) registers are filled with zeroes.

It will be recalled that correction subsystem 1070 checks and corrects in a byte order which is the reverse of the order in which bytes are stored in buffer 1100 (see FIG. 8B). Accordingly, during a correction process, correction subsystem 1070 will first process ECC bytes, followed by CRC bytes, followed by data bytes. As the sector is clocked through, when an error is detected for a particular byte an error pattern for that byte is applied on line 1236 (see FIG. 5 and FIG. 6).

For each clocking of correction subsystem 1070 (i.e., clocking of ECC bytes, CRC bytes, and data bytes), correction checker subsystem 1075 is also clocked. However, as explained below in more detail with reference to steps 12D-2 and 12D-3, in the illustrated embodiment data (i.e., a compensated error pattern) is clocked into registers 1302 of correction checker subsystem only when an error pattern is produced for the corresponding byte of the clock.

Step 12D-2 shows that correction checker subsystem 1075 is rendered inactive while correction subsystem 1070 clocks through ECC. However, following the processing of ECC bytes by correction subsystem 1070, correction subsystem 1070 may output error patterns for CRC bytes, those CRC byte error patterns being generated and applied on line 1236 in timed relation with the clocking through of the sector by correction subsystem 1070. While the number of potential CRC error patterns generated by correction subsystem 1070 corresponds to the number of CRC bytes stored in registers 1302 of correction checker subsystem 1075, it is likely that error patterns will be generated for less than all of these CRC bytes. When an error pattern is generated for a CRC byte which corresponds to the CRC check remainder byte stored in a register $1302_x$ (x being used as a subscript to represent any one of the stages of FIG. 6), correction controller 1020 turns on a pointer control signal CRCPTRX (X=0 to 5). For example, if an error pattern is generated corresponding to the CRC check remainder byte 0, pointer CRCPTR0 is turned on. Accordingly, step 12D-3 of FIG. 12D shows that the error pattern (if any) is added to register 1302 in timed relation to the outputting of the compensated error pattern.

In connection with the clocking of error patterns for CRC bytes, the error pattern produced by correction subsystem 1070 and applied on line 1236 is not multiplied by compensation circuit 1316 (i.e., the branch of circuit 1316 not having a multiplier is utilized).

After all CRC bytes have been handled in the manner aforedescribed with respect to step 12D-3, correction checker subsystem 1075 is next clocked in time relation with the clocked processing of data bytes by correction subsystem 1070. Error patterns generated for data bytes are applied on line 1236 to compensation circuit 1316. If the data byte for which the error pattern is produced was multiplied by multiplier $M_1$ of segmentation circuit 710 (see FIG. 3A), then the error pattern for that byte will be multiplied by multiplier $M_1$ of compensation circuit 1316. Similarly, if the data byte for which the error pattern is produced was multiplied by multiplier $M_2$ of segmentation circuit 710, then the error pattern for that byte will be multiplied by multiplier $M_2$ of compensation circuit 1316. Thus, for error patterns concerning data bytes, compensation circuit 1316 outputs a compensated error pattern on line 1320.

Step 12D-4 reflects the processing of error patterns for data, including the above-mentioned compensation for segmentation and also for feedback multiplication implemented by feedback multipliers 1308. In the particularly illustrated embodiment, during the data byte portion of processing, feedback multiplication using multipliers 1308 occurs only every third clock (again in view of the particular structure and operation of the segmentation circuits 710 included in the CRC generation/checking system 1030). Feedback multiplication occurs only during processing of error patterns for data bytes, and then only for every third clock.

After all error patterns for CRC and data bytes have been processed in the manner above described with respect to steps 12-3 and 12D-4, the values of registers 1302 should all be zero if correction subsystem 1070 accurately performed correction. At step 12D-5, OR gate 1314 outputs a check result signal. If the check result signal output by gate 1314 is non-zero, the check result signal is treated as an uncorrectable error signal.

It should be understood that the particular values of the feedback multipliers 1308, as well as the employment of a compensation circuit 1316 and the every third clock feedback multiplication, results from the particular structure and operation of other aspects of error correction system 1000, particularly CRC correction/checker subsystem 1030. Accordingly, the correction checking of the present invention should not be so limited in general application.

Moreover, it should be understood that correction checker subsystem 1075 can be operated in alternative ways. For example, if correction subsystem 1070 is configured to output a byte for every clock (e.g., non-zero error patterns), then clocking into register 1302 of correction checker subsystem 1075 can likewise occur for every clock.

OPERATION: READ FROM DEVICE: CRC CHECK

Figure 12E:
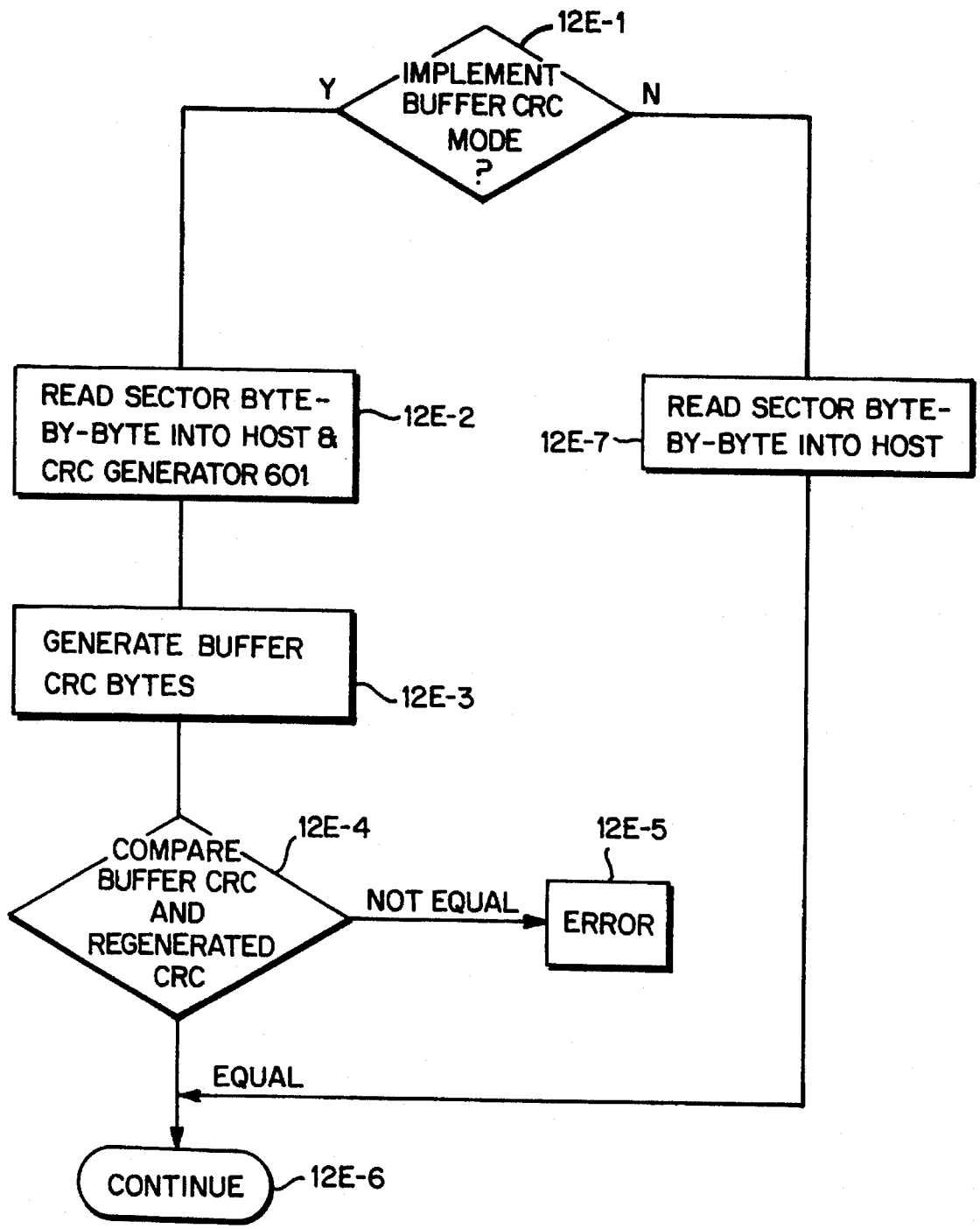
FIG. 12E is a flowchart showing steps involved in checking a sector obtained from buffer during transfer to a host.

FIG. 12E illustrates steps executed in connection with state 12-6 (e.g., using CRC correction/checker unit 601 to check for any errors introduced by storage/retrieval operations concerning buffer 1100). At step 12E-1, a check is made to determine whether the buffer CRC option is in effect. If the buffer CRC option is in effect, steps 12E-2 through 12E-4 are executed. At step 12E-2 the sector-to-be-transmitted to host 1010 is read out of buffer 1100 and transmitted both to host 1010 and to CRC generator/checker unit 601. At step 12E-3, CRC generator/checker unit 601 regenerates CRC bytes for the sector data. At step 12E-4, checker unit 714 compares the CRC bytes which it regenerates with the buffer CRC bytes earlier generated by CRC generator/checker unit 603. If the two sets of CRC bytes are not identical, an error message is generated (step 12E-5). If the two sets of CRC are equal, correction controller 1020 awaits availability of a next sector to be transferred (step 12E-6).

If the buffer CRC option is not in effect, at step 12E-7 the sector-to-be-transmitted to host 1010 without being transmitted to CRC generator/checker unit 601. Thereafter, correction controller 1020 awaits availability of a next sector to be transferred (step 12E-6).

OPERATION: READ FROM DEVICE: SUPPLEMENTAL CORRECTION

Figure 12F:
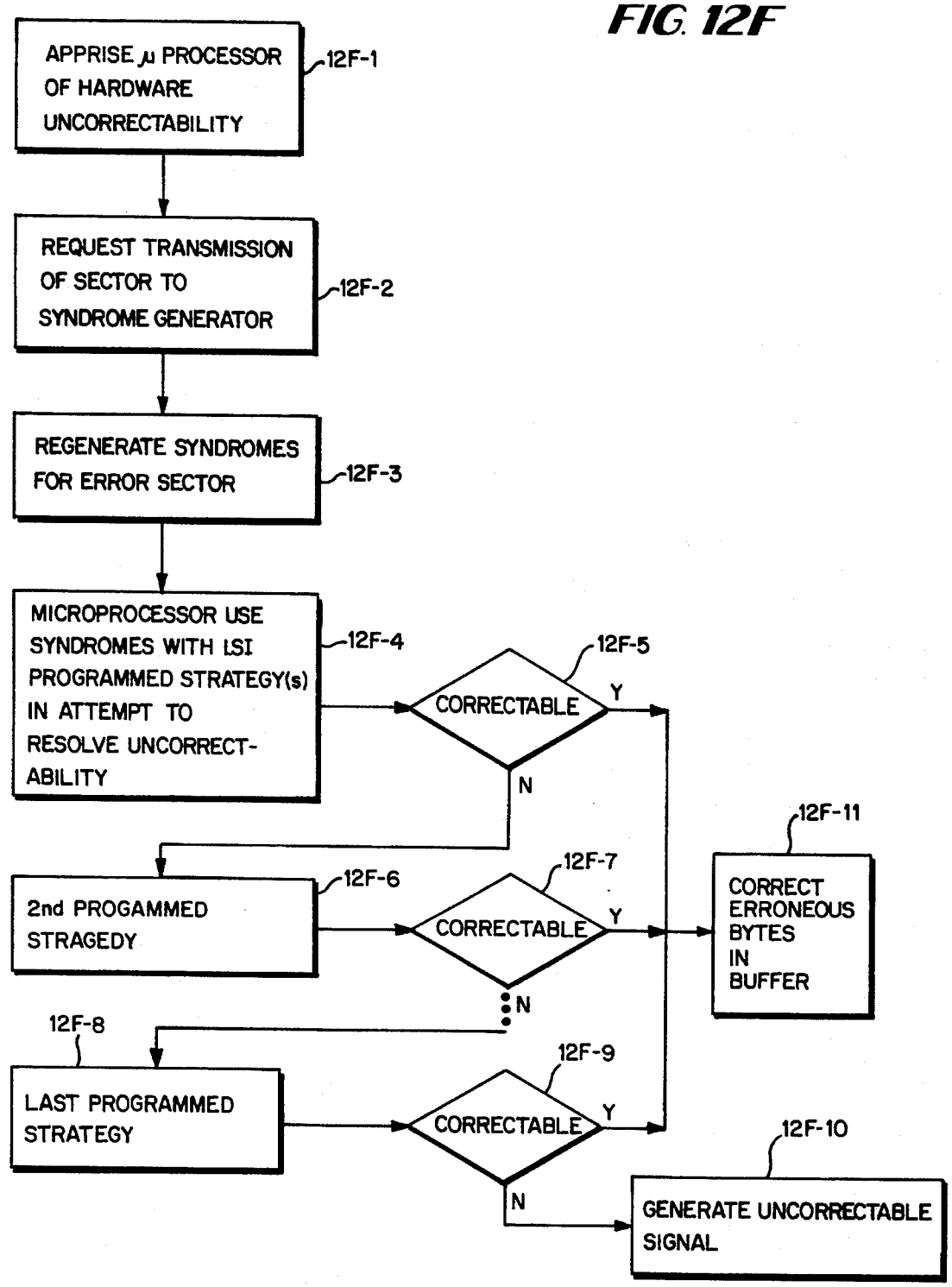
FIG. 12F is a flowchart showing steps involved in supplemental correction undertaken by a device microprocessor.

FIG. 12F illustrates general steps executed in connection with 12-4 (e.g., permitting microprocessor 1003 to attempt to correct the sector using one or more programmed strategies). This supplemental correction attempt is optionally undertaken by microprocessor 1003 when requested by the appropriate setting of register μP SUPPLEMENTAL CORRECTION OPTION in correction controller 1020 (see FIG. 1A).

Supplemental correction is initiated at step 12F-1 when correction controller 1020 advises device microprocessor 1003. Such advisement occurs after correction controller 1020 has received an uncorrectable signal (e.g., from correction subsystem 1070). At this point, hardware-implemented on-the-fly error correction has been unsuccessful in correcting all multiple randomly-located error symbols, consequently, further correction is resumed by microprocessor-executed software or firmware off line.

When device microprocessor 1003 is alerted that supplemental correction is to be attempted, at step 12F-2 device microprocessor 1003 requests that the sector which includes the uncorrectable error again be transmitted to ECC/syndrome generation subsystem 1050. The sector is transmitted to ECC/syndrome generation subsystem 1050 via MUX 645, MUX 644, and adder 1208 in the manner aforedescribed. At step 12F-3, ECC/syndrome generation subsystem 1050 generates syndromes for each of the codewords of the sector. The syndromes must be re-generated at step 12F-3, because the previously-generated syndromes for the sector are no longer available at this point in time. In connection with step 12F-3, it is understood from FIG. 4 that the syndromes for a codeword of the sector are applied on syndrome bus 1052 to device microprocessor 1003.

Device microprocessor 1003 uses the syndromes in connection with one or more programmed strategies in an attempt to resolve uncorrectability of a codeword in the sector. An example of a first such strategy is illustrated in FIG. 9. FIG. 9 represents three adjacent interleaved codewords of a sector (codewords $CW_0$, $CW_1$, and $CW_2$), each codeword being viewed as a column in FIG. 9 and the bytes of the sector being numerically labeled. Device microprocessor 1003 determines that error pointers exist for bytes 0, 5, 15 and 17; that codewords $CW_0$ and $CW_2$ are correctable; but that codeword $CW_1$ is uncorrectable. The bytes pointed to by pointers have byte numbers encircled in FIG. 9. This determination of error pointers may result by independent software correction techniques executed by device microprocessor 1003 using the syndromes, or alternatively the pointers previously generated/obtained by error correction system 1000 for the codewords may be communicated to device microprocessor 1003. In either case, device microprocessor 1003 is now ready to implement a supplemental correction strategy.

Step 12F-4 shows device microprocessor attempting a first example of a supplemental correction strategy. In the first example supplemental correction strategy in which it is assumed that errors occur in bursts which affect adjacent interleaves, the pointer positions are analyzed as device microprocessor 1003 endeavors to discern any pattern for pointer positions, as would occur in a burst, for example. Thus, in connection with the first illustrated supplemental correction strategy, device microprocessor 1003 notes that pointers are set for bytes 3 and 5 and also for bytes 15 and 17. In attempting to discern a pattern for the pointers, device microprocessor 1003 presumes that pointers also be set for bytes 4 and 16 (byte numbers appearing in phantom blocks in FIG. 9), since appears it that there may be a linear pattern formed by bytes 3, 4, and 5 near the top of FIG. 9 and a linear pattern formed by bytes 15, 16, and 17 near the bottom of FIG. 9.

With pointers now tentatively set for bytes 4 and 16 in connection with the first supplemental correction strategy, device microprocessor 1003 executes a standard correction routine of programmable instructions to determine if the setting of pointers for bytes 4 and 16 results in correctability for codeword $CW_1$. If the first supplemental strategy results does not result in correction of the previously uncorrectable codeword(s) as determined at step 12F-5, a second supplemental strategy is implemented (step 12F-6).

An example of a second supplemental correction strategy executed at step 12F-6 involves repeated re-reading of the sector from media in order to discern variations in byte values among the plurality of reads. According to the second strategy, device microprocessor 1003 requests that the entire uncorrectable sector be copied in a first location in a memory which is local to device microprocessor 1003. Then device microprocessor 1003 requests correction controller 1020 request again the same sector from media. The re-requested sector is responsively transmitted into buffer 1100 in the same manner as aforedescribed in connection with read from device operations. After transmission of the sector to buffer 1100, device microprocessor requests that this second transmission of the sector be copied into its local memory, this time into a second location in local memory. These steps of requesting that the sector be again read from media, moved into buffer 1100, and then moved into local memory may be repeated a predetermined or programmable number of times. In connection with the second supplemental strategy, device microprocessor 1003 examines corresponding byte locations of the various copies of the sector in its local memory to determine variances in stored values. Any noted variances are presumed to result from error, so that device microprocessor 1003 sets tentative error pointers for the variant bytes.

Implementation of the second supplemental strategy is followed by attempted correction using conventional programmed correction operations. If correction is not successful as a result of the second supplemental strategy (as determined at step 12F-7), a further supplemental correction strategy is implemented until a last correction strategy (see step 12F-8) is executed. If the last correction strategy is not successful (as determined at step 12F-9), device microprocessor 1003 generates an uncorrectable signal (step 12F-10).

Should any supplemental correction strategy result in correction (as determined at steps 12F-5, 12F-7, or 12F-9, for example), at step 12F-11 device microprocessor 1003 implements the correction by directing that the erroneous bytes in buffer 1100 be replaced with the corrected bytes as deduced by device microprocessor 1003 after using the supplemental correction strategy.

Other advantages of error correction system 1000 and the invention described herein are set forth in Appendix I.

While the invention has been particularly shown and described with reference to the preferred embodiments thereof, it will be understood by those skilled in the art that various alterations in form and detail may be made therein without departing from the spirit and scope of the invention.

APPENDIX 1

3.2.1 CRC and ECC Capabilities

The CL-SH385 has CRC and ECC capabilities for both the ID and data fields.

The ID CRC and ID ECC bytes covering the ID bytes provide error detection and correction for the ID bytes.

The header length (ID+ID CRC+ID ECC) is programmable as 12, 14, 16, or 20 bytes long (Reg 74H, bits 5:4) while the ID CRC length is programmable as 1, 2, or 3 bytes (Reg 74H, bits 3:2) and the ID ECC is fixed at 5 bytes long.

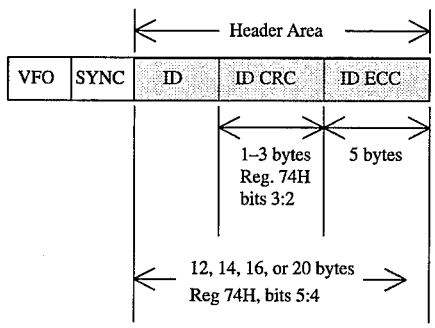

```
|<----------- Header Area ----------->|
| VFO | SYNC | ID | ID CRC | ID ECC |
                    |<--->|<------->|
                    1-3 bytes  5 bytes
                    Reg. 74H
                    bits 3:2

|<----- 12, 14, 16, or 20 bytes ----->|
                    Reg 74H, bits 5:4
```

The ID byte length is defined by subtracting ID CRC byte length (Reg 74H, bits 3:2) and ID ECC length (5 bytes) from the header area length (Reg 74H, bits 5:4).

The ID ECC adds single burst hardware detection and correction capabilities to the ID, protecting up to 14 bytes of ID. Neither ID CRC nor ID ECC covers the ID sync byte.

ID ECC code may be used for correction or detection of nibble errors (any combination of bit errors falling within a nibble boundary). The correction span is programmable (0, 2, 3, or 4 nibbles) via Reg. 74H, bits 7:6. Decreasing the correction span increases the maximum number of detectable errors.

Correctable burst lengths for ID errors are shown below:

TABLE 2

Burst Correction Lengths

| Reg 74H bits 7:6 | Correction Span | Correctable Burst Size |
|---|---|---|
| 00 | 0 nibbles | 0 bits |
| 01 | 2 nibbles | 5 to 8 bits[a] |
| 10 | 3 nibbles | 9 to 12 bits |
| 11 | 4 nibbles | 13 to 16 bits |

[a]A two nibble correction span means that if all ID errors are located within two consecutive nibbles, the errors can be corrected. Given two nibble correction span, any single randomly placed 5 bit error burst can be corrected. A six bit burst can possibly span three consecutive nibbles which 2 nibble correction could not correct. If errors are properly placed, the corrected error burst length can be as long as 8 bits.

The probability of an uncorrectable ID error given completely random occurrences of unclustered errors is approximately:

$$P_u ID \approx \frac{1}{n} \left( \sum_{i>1}^{n} \binom{n}{i} (P_e)^i (1-P_e)^{n-1} \right)$$

where:

$P_u ID$=Probability of uncorrectable ID error, n=Number of bits per ID (including ECC redundancy bits), $P_e$=Raw burst error probability (error per bit), and The probability of a miscorrection given there an error is:

$$P_{mc} = \frac{n \times 2^{b-1}}{2^m}$$

where:

$P_{mc}$=miscorrection probability in units of corrected IDs per uncorrectable ID, n=number of bits in the ID including redundancy bits, b=number of nibbles that are correctable times four, and m=the total number of ID redundancy bits.

The data CRC and data ECC bytes provide error detection and correction for the data bytes.

Data field CRC and ECC lengths are programmable via Register 75H, bits 7:6 and Register 75H, bits 4:3 respectively. CRC length may be 4, 5, or 6 bytes while ECC length may be 4, 5, or 6 bytes per interleave. The number of interleaves is fixed three. The maximum data area is 765 bytes.

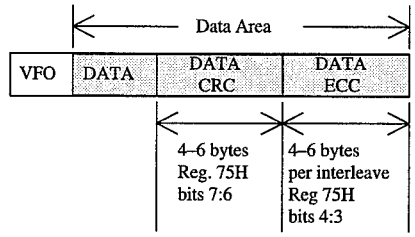

```
|<-------- Data Area -------->|
| VFO | DATA | DATA | DATA |
              | CRC  | ECC  |
              |<-->|<---->|
              4-6 bytes  4-6 bytes
              Reg. 75H   per interleave
              bits 7:6   Reg 75H
                         bits 4:3
```

The data field ECC is a three interleave Reed Solomon code which allows customization of error detection and correction. The detectable and correctable errors per interleave are defined as follows:

$$E_D = N_{ECC} - 2 \times N_{CORR}$$

where, $N_{CORR}$=Max. number of correctable bytes per interleave (0, 1, 2, or 3), $N_{ECC}$=# of data field ECC bytes per interleave (4, 5, or 6), and $E_D$=# of detectable error bytes beyond $N_{CORR}$ in an interleave.

$N_{ECC}$ and $N_{CORR}$ are programmable values.

The data field ECC hardware corrects single, double, and triple burst errors. Correctable burst lengths depend on the number of checkbytes per interleave (Reg. 75H, bits 4:3) and the number of correctable bytes per interleave (Reg. 75H, bits 1:0) which are shown below:

TABLE 3

| Checkbytes per interleave | Programmed max. # of correctable bytes per interleave | Single Burst Correction Length[a] | Double Burst Correction Length[b] | Triple Burst Correction Length |
|---|---|---|---|---|
| 4, 5, or 6 | 1 | 17 bits | 0 bits each | 0 bits each |
| 4, 5, or 6 | 2 | 41 bits | 17 bits each | 0 bits each |
| 6 | 3 | 65 bits | 17 bits each | 17 bits each |

[a]The "Single burst correction length" is the length of the longest randomly placed correctable single burst error.

TABLE 3-continued

Burst Correction for 3 Interleave Correction Scheme

| Checkbytes per interleave | Programmed max. # of correctable bytes per interleave | Single Burst Correction Length[a] | Double Burst Correction Length[b] | Triple Burst Correction Length |
|---|---|---|---|---|

[b]The "Double burst correction length" is the length of the largest double burst which is guaranteed correctable if randomly placed in the data/ECC field. That is, two burst errors of 17 bits each may be randomly placed in the data/ECC field and guaranteed correctable given either 2 or 3 bytes per interleave correction.

The CL-SH385 allows a trade-off between error detectability and correctability which gives the flexibility to augment performance (maximum correctability) or reliance (high detectability) as required.

The CL-SH385 has an autonomous correction engine which generates syndromes and applies correction vectors without μP assistance. This relieves the μP from any error correction overhead.

TABLE 4

Sample Table of Uncorrectable/Undetectable/Miscorrection Probabilities

| n/#ECC bytes per interleave | 2 | 3 | 4 | 5 | 6 |
|---|---|---|---|---|---|
| 0 | XX/YY/ZZ | XX/YY/ZZ | XX/YY/ZZ | XX/YY/ZZ | XX/YY/ZZ |
| 1 | XX/YY/ZZ | XX/YY/ZZ | XX/YY/ZZ | XX/YY/ZZ | XX/YY/ZZ |
| 2 | XX/YY/ZZ | XX/YY/ZZ | XX/YY/ZZ | XX/YY/ZZ | XX/YY/ZZ |
| 3 | XX/YY/ZZ | XX/YY/ZZ | XX/YY/ZZ | XX/YY/ZZ | XX/YY/ZZ |

The CL-SH385 sector formatter also has a recirculating stack that is twelve bytes deep. By enabling stack during the read process, information read from the drive can be pushed on to the stack to be examined later at a low speed by the microcontroller. This capability can be used for defect management or pass the identification field to the microcontroller.

The probability of an uncorrectable combination of errors in an interleave (assuming random error distribution) is:

$$P_{ui} \approx \frac{1}{n \times w} \sum_{i>t}^{n} \binom{n}{i} \times (k \times P_e)^i \times (1 - k \times P_e)^{n-1}$$

where, $P_{ui}$=Probability of undetectable error in one or more interleaves (events per bit), t=Number of symbols (bytes) corrected per interleave, n=Number of symbols (bytes) per interleave (including ECC redundancy symbols), w=Number of bits per symbol (symbol width in bits), k=Number of symbols affected by each error burst (k≦# of interleaves), and $P_e$=Raw burst error probability (error events per symbol=w * error events per bit).

When the number of errors in an interleave exceeds the correction power of a code, it is possible for the ECC syndrome bytes produced to be identical to those produced by some correctable set of errors. This is a miscorrection. Assuming that each error affects a single byte and that error values and locations gre random is given by:

$$P_{mc} = \sum_{i=0}^{t} \frac{\binom{n}{i} \times 255^i}{256^d}$$

where, $P_{mc}$=the probability that an interleave containing more bytes in error than is guaranteed detectable appears to the ECC as an interleave containing t or fewer bytes in error, n=the number of bytes per interleave including ECC redundancy bytes, t=the number of errors corrected per interleave, and d=the degree of the code generator polynomial (number of redundancy bytes per interleave).

3.2.1.1 Probability of Transferring Undetected Errors

The probability of transferring undetected errors is an important factor when evaluating an ECC system. The probability of transferring undetected erroneous data (units: undetected erroneous data events per bit) due to the enhanced data field ECC is approximated by:

$$P_{ued} = P_{ui}ID \times P_{mc}$$

where, $P_{ued}$=Probability of undetected erroneous data. This is the ration of undetected erroneous data occurrences to total bits transferred: a measure of data accuracy, $P_{ui}ID$=The probability of occurrence of an uncorrectable interleave in units of events per bit (also the uncorrectable sector probability, and $P_{mc}$=Miscorrection probability. The probability that a given error occurrence which exceeds the guaranteed capabilities of the enhanced data field ECC code will result in miscorrection, assuming all errors are possible and equally probable.

7.2 Buffer Block CRC

Data flow from the host interface to the buffer, disk, and back to the host can optionally protected by buffer block CRC. Buffer block CRC, when enabled, appends four to six CRC bytes to every sector (or buffer block) written from the host to the buffer. The CRC bytes are generated from the incoming host data stream and checked as the data is written to disk. When data retrieved, the CRC bytes are checked as they are read from the disk and also checked when read from buffer to host. The final checking process on a data transfer from buffer to host strips the CRC bytes from the data bytes. Buffer block CRC is enabled by setting the enable Host Buffer CRC bit (register 2BH/BBH, bit 5) and the Enable Disk Buffer CRC bit (register 2BH/BBH, bit 4). During a buffer-to-host transfer, if there is an error in the CRC check, the Host Buffer CRC Error bit (register 39H/A9H, bit 5) will be set. If there is an error in the Buffer CRC during a buffer-to-disk write, the Disk Buffer CRC Error bit (register 7CH, bit 1) will be set. Enable disk and host CRC error status can generate interrupts to the local microprocessor. Since Format Sequencer stops on buffer CRC errors, the Sequencer Stopped Detected status interrupt enable bits (register 7DH, bit 3 and register 7EH, bit 3) will serve as the buffer to CRC status and interrupt. For a buffer-to-host CRC error, the Buffer-to-Host CRC error Detected bit (register 39H/A9H, bit 5) will be set and a corresponding interrupt will enabled via the Buffer-to-Host CRC Error Detected Enable bit (register 38H/A8H, bit 5).

7.3 Error Detection and Correction Logic

The serial data flow portion of the Sector Formatter consists of a 40 bit ECC code and 8, 16, 24 bit CRC code for ID field protection: a 3-way interleaved Error Correction Code (ECC) for the data field: and a serializer/deserializer (SERDES). Data to be written to the disk the CL-SH5600-C from the host interface in either a word or a byte-wide format. It is serialized and processed through the CRC/ECC generators. An NRZ serial bit stream is then shifted to the drive. Note that the NRZ serial bit stream will include serialized constants required address marks, gaps, and ID fields, as well as the serialized data bytes with ECC/CRC in the field and ECC/CRC appended to the end of the data field bytes. All of the bytes used in sector ID and data field format are generated in the WCS map.

The error detection and correction (EDAC) logic can be programmed as follows:

ID Field

- 1, 2 or 3 CRC bytes (register 73H, bits 3:2)
- 0 or 5 ID ECC bytes (register 73H, bit 1)

Data Field

- 4, 5 or 6 data field ECC bytes per interleave (register 74H, bits 4:3)
- 4, 5 or 6 data field CRC bytes (register 74H, bits 7:6)

The ID and data field CRC/ECC configurations are shown in the figure below.

The ID CRC code can only be used for error detection in the ID field, while the ID ECC is used for correction and detection. When the ID field is read during a read data or write data operation, the CRC bytes are read and checked by the CRC and corrected using ID ECC. After any ID correction is applied, if the computed ID CRC doesn't match the CRC read from the ID field, then the ID CRC Error bit will be set in the Format Sequencer Status 2 register (7AH, bit 2).

The data field Reed-Solomon ECC code is an interleaved code, operating on 8-bit symbols. The code is capable of correcting 1, 2 or 3 8-bit symbols that are in error in each interleave. This hardware can correct a randomly placed 65-bit single burst error, 17-bit double burst errors, or 17-bit triple burst errors when using 6 ECC bytes per interleave and 3 corrections per interleave.

7.3.1 ID Field ECC Correction

Hardware on-the-fly correction for the ID field is enabled by setting the ID ECC Enable bit in the ID ECC Control register (73H, bit 1). The ID on-the-fly error burst correction span is programmable in register 73H, bits 7:6. An error burst correction span of 0, 2, 3 or 4 nibbles can be selected. The on-the-fly error correction capability varies with the correction span selected, as shown in the table below.

TABLE 7-2

| ID Correctable Burst Lengths | |
|---|---|
| Hardware On-the-Fly Correction Span | Largest Guaranteed Correctable Randomly Located Burst |
| 0 nibbles | 0 bits |
| 2 nibbles | 5 bits |
| 3 nibbles | 9 bits |
| 4 nibbles | 13 bits |

The ID field ECC correction process is described below:

- With hardware ID ECC correction enabled (register 73H, bit 1 is set), the ID ECC syndrome is computed as the ID field header bytes are read by the sequencer. The ID ECC syndrome calculation is complete after the last ID ECC byte has been read.

- If an error is detected (ID ECC syndrome is non-zero) after the last ID ECC byte has been read, then the ID Field Non-Zero Syndrome bit (register 7CH, bit 0) is set. The ID ECC logic will then begin the correction process, which consists of calculating the error pattern and its position in the ID field, and correcting the errors in the 12-byte formatter stack (register 7FH).

Note: All of the ID field header bytes (not including the CRC and ECC bytes) must be pushed on the formatter stack

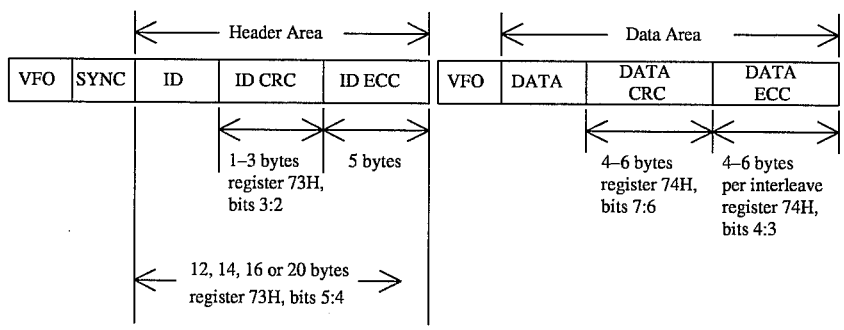

in order for the ID ECC correction process to function correctly. This task is accomplished by setting the Stack Enable bit (WCS Control Field, bit 4) for every header byte read in the ID field during a sequencer read ID operation.

• The ID error correction time for the ID field is expressed as follows:

ID correction and decision time=[ID header size/4]+1

Note: The ID header size includes the cylinder, head, sector, flag and split count bytes, and must be equal to the value programmed in register 73H, bits 5:4. The ID header size does not include the data sync byte, CRC or ECC bytes. The resultant value of [ID header/4] must be rounded up to the nearest integer.

• The ID correction engine uses RRCLK. After any ECC correction vectors are applied the CRC is checked. If the ID CRC does not check, the ID Field CRC/ECC Error bit (register 7AH, bit 2) is set, indicating that the ID error is uncorrectable.

The following steps describe an ID field correction strategy that could be used with the CL-SH5600-C.

1. Read the sector with hardware correction enabled (register 73H, bit 1 is set).
2. If an uncorrectable ECC error occurs, reread the ID with hardware correction still enabled. In addition, the correction span can be increased (register 73H, bits 7:6).

If the ID can be read successfully, then the ID has a soft error. The sector data can now be read and relocated.

If the ID is still uncorrectable, then a hard error has occurred. Drastic action must be taken in order to recover the data associated with this ID field.
3. If there are no ECC errors or the errors are correctable, continue to the next sector.

The probability of an uncorrectable ID error, given completely random occurrences of unclustered errors, is approximately:

$$P_uID \approx \frac{1}{n} \left( \sum_{i>1}^{n} \binom{n}{i} (P_e)^i (1-P_e)^{n-1} \right)$$

where, $P_uID$=Probability of uncorrectable ID error, n=Number of bits per ID (including ECC redundancy bits), $P_e$=Raw burst error probability (error events per bit), and The probability of a miscorrection, given there was an error, is:

$$P_{mc} = \frac{n \times 2^{b-1}}{2^m}$$

where, $P_{mc}$=miscorrection probability in units of miscorrected IDs per uncorrectable ID, n=number of bits in the ID including redundancy bits, b=number of nibbles that are correctable times four, and m=the total number of ID redundancy bits.

7.3.2 Data Field ECC Correction

The data field ECC is a three-way interleaved Reed Solomon code which allows customization of error detection and correction. The detectable and correctable errors per interleave are defined as follows:

$$E_D = N_{ECC} - 2 \times N_{CORR}$$

where, $N_{CORR}$=Maximum number of correctable bytes per interleave (0, 1, 2 or 3) (register 74H, bits 1:0)

$N_{ECC}$=Number of data field ECC bytes per interleave (4, 5 or 6) (register 74H, bits 4:3)

$E_D$=Number of detectable error bytes beyond $N_{CORR}$ in an interleave.

Note: $N_{ECC}$ and $N_{CORR}$ are programmable values.

Hardware on-the-fly correction for the data field is enabled by setting the Hardware Correction Enable bit in the ECC Control register (71H, bit 0). The on-the-fly error burst correction span programmable in register 74H, bits 1:0. An error burst correction span of 1, 2 or 3 bytes interleave can be selected. The on-the-fly error correction capability varies with the correction span selected, as shown in the table below. Also the programmed number of correctable bytes per interleave is limited by the programmed number of ECC bytes per interleave.

That is, $N_{CORR} \leq N_{ECC}/2$. The maximum number of correctable bytes per interleave can most half the number of ECC bytes per interleave. Thus, in order to achieve the correct power of three bytes per interleave, the sector must use six ECC bytes per interleave.

TABLE 7-3

Guaranteed Burst Correction for 3-Way Interleave Correction Scheme

| ECC Bytes Per Interleave (register 74H, bits 4:3) | Programmed Correctable Bytes Per Interleave (register 74H, bits 1:0) | Single Burst Correction Length[a] | Double Burst Correction Length[b] | Triple Burst Correction Length[c] |
| --- | --- | --- | --- | --- |
| 4, 5 or 6 | 1 | 17 bits | 0 bits each | 0 bits each |
| 4, 5 or 6 | 2 | 41 bits | 17 bits each | 0 bits each |
| 6 | 3 | 65 bits | 17 bits each | 17 bits each |

[a]The "Single burst correction length" is the length of the largest guaranteed correctable randomly placed single burst error. If an error begins at the first bit of a symbol (i.e. not randomly placed) then the single burst correction lengths change from 17, 41, and 65 to 24, 48, and 72.
[b]The "Double burst correction length" is the length of the largest randomly placed, guaranteed correctable double burst error. In a system with 5 checkbytes per interleave and programmed 2 correctable bytes per interleave, two randomly placed burst errors of 17 bits each are guaranteed correctable.

TABLE 7-3-continued

Guaranteed Burst Correction for 3-Way Interleave Correction Scheme

| ECC Bytes Per Interleave (register 74H, bits 4:3) | Programmed Correctable Bytes Per Interleave (register 74H, bits 1:0) | Single Burst Correction Length[a] | Double Burst Correction Length[b] | Triple Burst Correction Length[c] |
|---|---|---|---|---|

[c]The "Triple burst Correction Length" is the length of the largest randomly placed guaranteed correctable triple burst error. In as system with 6 checkbytes per interleave and programmed 3 correctable bytes per interleave three randomly placed burst errors of 17 bits are guaranteed correctable.

The ECC detection/correction scheme guarantees the correction lengths shown in the above table. The ECC scheme is not, however, limited to these correction lengths. Some examples of possible burst corrections are shown in the table 7.4 below:

TABLE 7-4

Sample Burst Corrections (Given Specific Error Placement)

| Corrections Per Interleave | Using Double Burst Correction It is possible to correct . . . | Using Triple Burst Correction It is possible to correct . . . |
|---|---|---|
| 1 | . . . an 8 bit error and a 16 bit error | . . . three 8 bit errors |
| 2 | . . . a 16 bit error and a 32 bit error. | . . . two 8 bit errors and a 32 bit error. |
| 3 | . . . two 36 bit errors | . . . two 16 bit errors and a 40 bit error |

With hardware ECC correction enabled for a read operation, the ECC syndrome is calculated as the data bytes are read, and stored in the internal correction registers. If an error is detected (ECC syndrome is nonzero) after the last ECC byte has been read, then the Data Field ECC Error bit (register 7AH, bit 3) is set. The ECC logic will then begin the correction process, which consists of calculating the error pattern and its displacement from the beginning of the data field, and correcting the error in the external buffer RAM via a memory read, data correction and memory write. The error correction process for a given sector data field will occur during the next sector time.

If the error is correctable (less than or equal to the programmed correction span), then the Correction Done bit (register 71H, bit 5) is set when ECC correction is complete for that sector. If the error is correctable, then the ECC correction for sector N will be completed by the last data byte of sector N+1.

If the error pattern is uncorrectable because it exceeds the correction span, then the Uncorrectable Error Found bit (register 7AH, bit 7) will be set. The Format Sequencer can be programmed to stop (register 7AH, bit 1 is set) with a WCS branch command when an uncorrectable ECC error occurs. The following steps describe a data field ECC correction strategy that could be used with the CL-SH5600-C.

1) Read the sector with hardware correction enabled (register 71H, bit 0 is set) and the correction power set to one byte per interleave (register 74H, bits 1:0=00).
2) If an uncorrectable ECC error occurs, reread the sector with hardware correction still enabled.
3) If the sector can be read successfully with a correctable ECC error, then the sector has a soft error. The sector data has been recovered and may be relocated.
4) If the data is still uncorrectable, then increase the ECC correction power (register 74H, bits 1:0) to two or three bytes per interleave. This is equivalent to the firmware off-line correction used with previous 88-bit ECC devices.

5) If the sector is correctable by the increased correction power, then the firmware designer may wish to relocate the data to an alternate sector.
6) If the data is still uncorrectable, then an unrecoverable ECC error has occurred.
7) If there are no ECC errors or the errors are correctable, continue to the next sector.

The mechanism by which the ECC error bits are set and cleared in the CL-SH5600-C registers is also an important firmware consideration, in order to determine when and where ECC errors have occurred. The ECC register bits to consider are shown below. For a complete description of how these bits function, consult the register description section, Chapter 10.

| | |
|---|---|
| - Correction Detected | register 71H, bit 7 |
| - ECC Error/Uncorrectable Error Detected | register 71H, bit 6 |
| - Correction Done | register 71H, bit 5 |
| - ECC Error/Uncorrectable Error Found | register 71H, bit 4 |
| - ECC Error/Uncorrectable Error Found | register 7AH, bit 7 |
| - Data Field ECC Error | register 7AH, bit 3 |
| - Data Field ECC Error Detected (interrupt) | register 7DH, bit 4 |

7.3.3 ECC Correction Clock and Correction Time

The clock used to drive the data field correction process is called the corrector clock. corrector clock source used by the ECC logic is determined by the ECC Correction Clock Source bits (register S72H, bits 3:2). The choices for the corrector clock include an CCLK, RRCLK, SYSCLK or SYSCLK divided by two.

The corrector clock must be fast enough so that all the correctable ECC errors for sector N corrected by the last data field byte of sector N+1. This requirement is necessary because ECC status is evaluated for sector N (and DSTC is decremented) when the Process ECC (WCS Count Field, bit 6) is set after the last data field byte is read for sector N+1.

In order to guarantee that the ECC correction process will be completed by the end of the sector, the following equation is used to determine the minimum corrector clock frequency respect to the disk data rate:

Minimum Corrector Clock Frequency $> K \times [RRCLK/N_{BYTES}]$

Where,

K=144 (for 1-bit NRZ) 288 (for 2-bit NRZ)

$N_{BYTES}$=Total number of bytes from the last ECC byte to the last data field byte of the next sector (including all gaps and PLO fields).

For example, if the 80 Mb/s NRZ rate is used (RRCLK= 40 MHz for 2-bit NRZ), and $N_{BYTES}$ 575 bytes, then the minimum corrector clock frequency must be at least 20 MHz. Thus, correctable ECC error occurs in a sector, it will be corrected by the end of the data field for next sector.

Using the equation above, the appropriate choice for the correction clock source can be (register S72H, bits 3:2). In general, the RRCLK can be used as the correction clock which meets the requirements for the correction time and uses an already existing clock.

7.3.4 Continuing on an Uncorrectable ECC Error

The CL-SH5600-C can be programmed to enable on-the-fly ECC correction to the buffer, ignore uncorrectable ECC errors by setting the Continue On Uncorrectable ECC Error (register S73, bit 2). When this bit is reset and the previous sector has an uncorrectable ECC error, the following operation occurs:

1) The sequencer stops at the end of the current sector.
2) The DBC is not incremented for the previous sector or current sector.
3) The DSTC is not decremented for the current sector.
4) The uncorrectable error status is set in register 71H, bits 4 and 6.
5) If the current sector has a non-zero ECC syndrome, then correction will be attempted on the current sector. This sector could be either correctable or uncorrectable, and the appropriate status bits will be set.

When the Continue On Uncorrectable ECC Error bit is set and an uncorrectable ECC error is detected, the following operation occurs:

The sequencer will not stop. Processing of the remaining sectors will continue as if an uncorrectable ECC error had not occurred.

The DBC will be incremented for the sector with the uncorrectable error and that sector can be transferred to the host. Some of the data in the buffer may have already been corrected.

The DSTC is decremented for the current sector.

The uncorrectable error status will be set in register 71H, bits 4 and 6.

When the Continue On Uncorrectable ECC Error bit is set but on-the-fly correction is not enabled, an ECC error detected after the data field (non-zero syndrome) is treated as an uncorrectable ECC error. The operation is the same as when on-the-fly correction is enabled, except that correction does not occur.

7.3.5 Reserving Correction Power

The on-the-fly ECC circuitry in the CL-SH5600-C can be configured to correct 1, 2 or 3 bytes per interleave. In the 3 byte correction mode, the on-the-fly correction provides the maximum correction possible (unless erasure pointers are provided by external circuitry). That is, when 6 byte of ECC per interleave are chosen, the theoretical maximum correction power of the ECC code is 3 bytes per interleave, which is implemented in the hardware. Thus, firmware off-line ECC correction is not necessary when using the CL-SH5600-C.

Typical defect handling algorithms in the past would use software correction to retrieve and spare a sector after the on-the-fly correction could no longer correct it. The software correction provided the reserve correction power needed to retrieve the sector. In the CL-SH5600-C, all of the correction power is implemented in the hardware on-the-fly correction. In order to maintain some reserve ECC correction power for the purpose of sparing sectors with grown defects, the drive designer should only enable the one- or two-byte per interleave correction mode during normal operation. If a defect grows to the point that the one- or two-byte per interleave correction mode cannot correct it, then the three byte per interleave correction mode may be enabled to retrieve the data and rewrite it to a spare sector.

NOTE: In order to use the correction power of three bytes per interleave (register 74H, bits 1:0=10), six ECC bytes per interleave must be employed (register 74H, bits 4:3=10). If four or five ECC bytes per interleave are used, the maximum correction power of the ECC code is two bytes per interleave.

APPENDIX 2

4.8 SYNCHRONIZATION

4.8.1 Synchronization Codes

In order to recover data, we must be able to determine where the data are recorded on the medium, or equivalently, when data begin and end in the read bit stream; this is called data framing or frame synchronization. This is normally accomplished by detecting a special pattern called a sync mark. This process is called byte synchronization and it is preceded by frequency and phase lock. Several types of synchronization errors arise. A synchronization failure occurs when it is known that we have been unable to establish initial synchronization; this is a serious error situation but one which is detected. A synchronization framing error occurs when we erroneously believe we have established correct synchronization; this is worse than synchronization failure in that undetected erroneous data could be transferred, as many error detection and correction codes have a weakness for this type of error. A loss of synchronization occurs when synchronization has been achieved and is later lost; the ease and speed of re-synchronization are heavily implementation-dependent.

It is common for data storage device track formats to include a sector mark and one or more sync marks in front of each sector for achieving initial synchronization.

A sector mark is used to establish coarse synchronization to a sector. The sector mark is unique and very different from data. It may be chosen so that it is impossible for data to emulate it and very difficult for a defect to emulate it. Sector marks are generally detected before data acquisition and therefore must be detected asynchronously. After coarse synchronization has been established, the general location of the sync mark is known and the search for the sync mark can be restricted to a window spanning the time around which it is expected to occur.

Ideally, the sync mark is unique and we are assured that no combination of valid channel bits can emulate it. To achieve this, the sync mark might include a run-length violation or an invalid decode. An invalid decode is a sequence which satisfies the run-length constraints but which cannot be emulated by any valid combination of channel words. When the sync mark is unique, the misdetection probability in the absence of error is zero. In some cases, the sync mark is not unique and there is a valid data bit sequence which can emulate it, but with sufficiently low misdetection probability. In such a case there would generally be additional sync mark detection qualification criteria.

In selecting a sync mark strategy, it is desirable to minimize overhead yet maximize the probability of successful decoding and minimize the probability of false decoding. These conflicting goals require that trade-offs be made in selecting sync mark parameters. Typical parameters include:

Detection window width
Error tolerance of the mark
Mark length
Mark pattern

Detection window width and error tolerance of the mark may be changed for retry reads. A narrow detection window is desirable in order to minimize the probability of false detection. However, if the detection window is established by a counter running off a reference clock then spindle speed variations, eccentricity, and mechanical oscillations will influence timing accuracy and will therefore influence window width as well.

Increasing the error tolerance of the sync mark while keeping its length constant increases the probability of successful decoding but also increases the possibility of false decoding.

Increasing the sync mark length decreases the probability of false decoding but increases overhead.

The sync mark pattern is selected to minimize the probability of false decoding when defects exist within and/or preceding the sync mark. To accomplish this, the pattern is selected to maximize the number of error bits and/or the error burst length that are required to cause a sync mark to be falsely detected in front of the true mark. This selection can be accomplished with a computer.

If we assume that the bit stream preceding and following a mark is random, we are motivated to use a sequence which does not resemble itself when shifted one or more bits, so that it is impossible for a small number of errors to cause false detection. As an illustration, consider a sequence of all '1' s. If the bit immediately preceding is random, there is a 50% chance of falsely detecting this sequence one bit early.

The autocorrelation function of a sequence is used to measure the degree to which a sequence resembles itself. Conceptually, one copy of the sequence is "slid past" another. At each offset i, the autocorrelation $R(i)$ is the number of corresponding bits which are identical minus the number which differ. $R(0)$ is of course equal to the number of bits in the sequence, n; the maximum value of $R(i)$ is n−|i|, with lower values being preferred. The class of sequences called Barker codes has the so-called "perfect" property $|R(i)| \leq 1$ for $i \neq 0$. Only eight Barker codes are known to exist, with lengths 2, 3, 4, 5, 7, 11, and 13.

APPENDIX 2

| BARKER CODES | | |
|---|---|---|
| n | Sequence* | Autocorrelation (i=0 to n−1) |
| 2 | 10 | 2,−1 |
| 3 | 110 | 3, 0,−1 |

APPENDIX 2-continued

| BARKER CODES | | |
|---|---|---|
| n | Sequence* | Autocorrelation (i=0 to n−1) |
| 4a | 1101 | 4,−1, 0, 1 |
| 4b | 1110 | 4, 1, 0,−1 |
| 5 | 11101 | 5, 0, 1, 0, 1 |
| 7 | 1110010 | 7, 0,−1, 0,−1, 0,−1 |
| 11 | 11100010010 | 11, 0,−1, 0,−1, 0,−1, 0,−1, 0,−1 |
| 13 | 1111100110101 | 13, 0, 1, 0, 1, 0, 1, 0, 1, 0, 1, 0, 1 |

*Including reversals and complements

Barker codes can be combined to form longer codes which have good, though not "perfect" autocorrelations. To construct such a combined Barker code, each bit of a Barker code is replaced with the entire sequence of another (possibly the same) Barker code, the sequence being inverted if the bit being replaced is zero. Longer sequences with autocorrelations which are nearly as desirable (Barker-like codes) also exist.

In practice, a sync mark is detected by counting the number of matching bits, without subtracting the number of mismatched bits. The sync mark is considered detected when the count of matching bits meets or exceeds a threshold, which may be variable so that it can be changed for read retries. In discrete designs, an efficient implementation may include PROM circuits; in integrated designs, logic gates may be preferable.

Window width can be increased and misdetection can be reduced by writing a known bit pattern (preamble) preceding the mark. A mark pattern is then selected for minimum correlation with the preamble and with itself. This preamble-sync mark combination is equivalent to a sync mark which is detected by searching only for its last half. An example is 16 zero-bits followed by the 16-bit mark '0001111100110101' (3 zero bits followed by the 13-bit Barker code) and followed by random data. When detected in a window from 16 bits before the position of the mark up to 5 bits after and requiring 13 bits (out of 16) to match, this pattern is guaranteed to be detected and guaranteed not to be falsely detected when not more than 3 random bits (out of 16) are in error or when a single error burst of length 3 bits or less exists. There are other patterns besides this one which have the same error tolerance using the same detection method.

Note that a preamble of all one-bits could be used as well, in which case each bit of the mark would be inverted. The preamble need not be all zero-bits or all one-bits; satisfactory codes can be selected for any given preamble pattern.

An extension of the above technique would be to write known patterns both preceding and following the sync mark. Selecting the pattern following the mark for minimum correlation with the sync mark would increase the acceptable window width after the position of the mark.

Sync marks can be decoded in either the data-bit domain or the channel-bit domain; the error propagation of the RLL decoding process motivates us to decode in the channel bit domain when possible, particularly if the detection criteria have been relaxed to achieve error tolerance. The desire to have error tolerant clock phasing also motivates us to decode in the channel-bit domain. In this case clock phasing and byte synchronization are established simultaneously with the detection of the sync mark.

Some implementations do not detect sync marks using a bit-by-bit comparison, but by comparing groups of bits. This reduces the circuitry required to implement majority-vote detection. Such a code has been proposed for use in optical disk. The 48 channel-bit mark is made up of 12 groups of 4 bits, each group containing a single one-bit. The whole mark obeys (2,7) run-length constraints and is preceded by the highest-frequency (2,7) pattern. The mark is detected in the channel bit domain using 4-bit groups. The correlation function for the sync mark sequence against the preamble-sync mark-random data sequence on a 4-bit basis, counted as the number of matches (plus the number of possible matches when correlating with random data at positive offsets) is

```
Offset: -15 . . . . . . . . . . . . . . -1  0  1 . . . . . . . . . . 11
4-bit:    2  3  3  4  4  0  4  4  3  2  2  3  4  0   0 12  0  0  5  4  3  2  5  5  4  4  5
```

If a detection threshold of 9 is used, 4 groups-in-error are required before failure to detect is possible, while 5 groupsis the same performance which would be obtained using a bit-by-bit majority vote criterion of 42 channel bits (out of 48; there is a peak correlation of 35 bits at an offset of −3) but with much lower implementation cost.

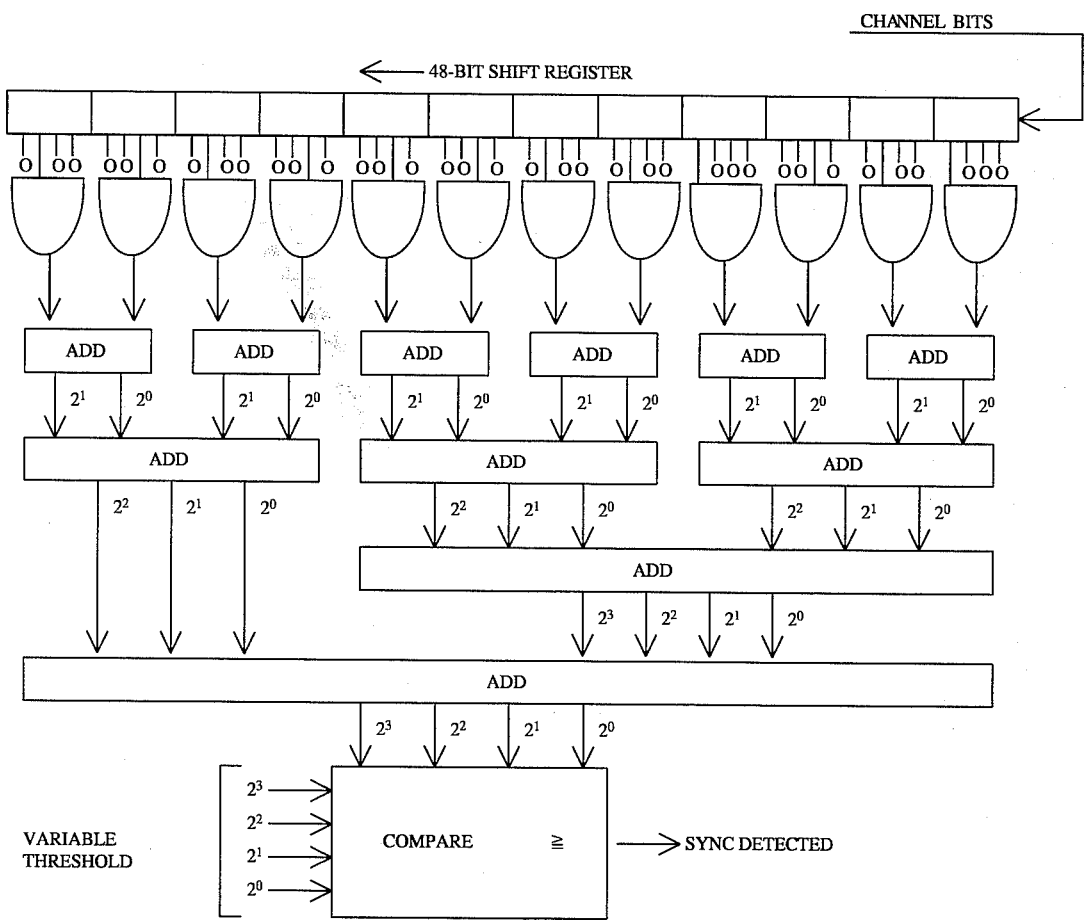

in-error are required before false detection is possible. If a detection threshold of 8 is used, 5 groups-in-errors are required before failure to detect is possible, while 4 groups-in-error are required before false detection is possible. This suggests the following strategy for sync mark detection: on the first try, using a threshold of 9 will insure that the mark will not be falsely detected, while on read re-try, using a threshold of 8 will insure that those cases of 4 groups-in-error that fail on the first try will be detected, subject to only a low probability of early false detection.

In the general case, 4 groups-in-error could be caused by an error burst of 10 channel bits, but analysis of the specific correlation bit patterns for this code reveals that this detection scheme handles any error burst of not more than 12 channel bits in length on the first pass, and will very likely handle any error burst of 16 channel bits or less on retry. This One possible decoding alternative for the X3B11 data field sync code. Note the increasing complexity of the binary adders as the compare circuit is approached.

As another example consider a 32 data-bit sync mark that is composed of four 8-bit groups A, B, C, and D, preceded by all zeros and followed by random data, to be detected in the data-bit domain when any one of the pairs A-B, C-D, or A-D is detected. It is possible to construct a mark which will be detected in the presence of a burst of not more than 9 data bits (out of 32 data bits) and will not be falsely detected in the presence of a burst of not more than 10 data bits (out of 32 data bits) in length when detected in a window from 16 bits before to 16 bits after the mark.

Using the same pair-wise detection method in the channel bit domain, it is possible to construct a 32 channel-bit mark subject to a (1,7) run-length constraint and preceded by 32 bits of the maximum-frequency (1,7) pattern which will be detected and will not be falsely detected in the presence of a burst of not more than 9 channel bits (out of 32 channel bits) when detected in the channel-bit domain in this pairwise fashion. Similarly, 32-bit marks have been constructed using a (2,7) run-length constraint which will be detected in the presence of a burst of not more than 9 channel bits (out of 32 channel bits) and will not be falsely detected in the presence of a burst of not more than 8 channel bits (out of 32 channel bits) in length.

For a given detection method, it is possible to use a computer to select mark patterns which satisfy the desired error tolerance requirements, if such patterns exist. The most straightforward method is to successively generate random patterns (using run-length constraints, if the mark is to be detected in the channel-bit domain), analyze them, and record the best performers.

RESYNC MARKS

When the probability of loss of synchronization is high, due for example to long defects, some applications require one or more sync marks preceding each sector and resync marks interspersed at regular intervals within each sector. The sync marks are used for achieving initial clock phasing and byte synchronization and the resync marks are used for restoring clock phasing and byte synchronization after a loss of sync (when the PLL has slipped cycles).

Many resync marks may be required per sector, so it is very important to minimize resync mark length to minimize overhead. In clever implementations it is not necessary for each resync mark to be detected, so the resync mark itself need not be error tolerant. To minimize the false detection of resync marks, their detection window is made very narrow. In addition they are typically assigned a channel bit pattern that cannot be emulated by a channel-bit sequence encoded from data. This guarantees that correct data will never emulate a resync mark.

The embodiments of the invention in which an exclusive property or privilege is claimed are defined as follows:

1. An error correction apparatus which obtains a sector from a rotating disk magnetic storage medium, the sector including header information followed by user data information associated with the header information of the sector, wherein the error correction apparatus obtains the header information for the sector and corrects an error burst occurring in the header information stored on the storage medium.

2. The apparatus of claim 1, wherein the header information is sector identifying information.

3. The apparatus of claim 1, further comprising:
   a header correction subsystem connected to obtain the header information from the rotating magnetic storage medium and to perform error correction upon the header information; and,
   a data correction subsystem connected to obtain user data information from the rotating magnetic storage medium and to perform error correction upon the user data information.

4. The apparatus of claim 3, wherein the header correction subsystem comprises:
   a header correction unit which receives the header information from the rotating magnetic storage medium and which generates an error pattern over the header information;
   a header register which receives and stores the header information from the rotating magnetic storage medium;
   means for using the error pattern and the header information stored in the header register to obtain corrected header information.

5. The apparatus of claim 4, further comprising a header comparator which receives target header information and generates a target found signal when the target header information matches the corrected header information.

6. The apparatus of claim 5, wherein the data correction subsystem performs error correction on the user data information upon generation of the target found signal.

7. An error correction apparatus which obtains a sector from a rotating magnetic storage medium, the sector including header information for the sector and user data information associated with the header information of the sector, the error correction apparatus including:
   a header correction subsystem which performs error correction upon the header information;
   a data correction subsystem which performs error correction upon the user data information;
   an interface which separately routes the header information of the sector to the header correction subsystem and the user data information to the data correction subsystem.

8. The apparatus of claim 7, wherein the interface first routes the header information of the sector to the header correction subsystem and then routes the user data information to the data correction subsystem prior to handing another sector on the medium.

9. The apparatus of claim 7, wherein the header information is sector identifying information.

10. The apparatus of claim 7, wherein the header correction subsystem comprises:
    a header correction unit which receives the header information from the rotating magnetic storage medium and which generates an error pattern over the header information;
    a header register which receives and stores the header information from the rotating magnetic storage medium;
    means for using the error pattern and the header information stored in the header register to obtain corrected header information.

11. The apparatus of claim 10, further comprising a header comparator which receives target header information and generates a target found signal when the target header information matches the corrected header information.

12. The apparatus of claim 11, wherein the interface routes the user data information to the data correction subsystem upon generation of the target found signal.

13. A method of correcting errors in a sector obtained from a rotating magnetic storage medium, the sector including header information followed by user data information associated with the header information of the sector, the method comprising:
    obtaining the header information for the sector from the storage medium and performing correction on an error burst occurring in the header information; then, prior to accessing a further sector from the medium,
    obtaining the user data information for the sector from the storage medium and performing correction on the user data information.

14. The method of claim 13, wherein the header information is sector identifying information.

15. The method of claim 13, further comprising separately routing the header information of the sector to a header correction subsystem and the user data information to a data correction subsystem.

16. The method of claim 13, further comprising:
    routing the header information for the sector from the storage medium also to a header register;
    using the header correction subsystem to generate a header error pattern; and, using the header error pattern and the header information stored in the header register to generate corrected header information.

17. The method of claim 16, further comprising comparing target header information and the corrected header information and generating a target found signal when the target header information matches the corrected header information.

18. A method of correcting errors in a sector obtained from a rotating magnetic storage medium, the sector including header information followed by user data information associated with the header information of the sector, the method comprising:

separately routing the header information of the sector to a header correction subsystem and the user data information to a data correction subsystem;

using the header correction subsystem to perform correction on an error burst occurring in the header information;

using the data correction subsystem to perform correction on the user data information.

19. The method of claim 18, wherein the header information is sector identifying information.

20. The method of claim 18, further comprising:

routing the header information for the sector from the storage medium also to a header register;

using the header correction subsystem to generate a header error pattern; and, using the header error pattern and the header information stored in the header register to generate corrected header information.

21. The method of claim 20, further comprising comparing target header information and the corrected header information and generating a target found signal when the target header information matches the corrected header information.

22. An error correction apparatus which recording a sector of information from a host on a rotating magnetic storage medium, the sector including header information for the sector and user data information associated with the header information of the sector, the apparatus comprising:

a controller which generates target identification information indicative of a target location on the medium where the sector is to be recorded;

an interface for obtaining from the medium header information for a pre-recorded sector on the medium;

a header correction subsystem, the header correction subsystem including:

a correction unit which performs error correction on the header information for the pre-recorded sector to obtain corrected header information for the pre-recorded sector; and, a comparator which makes a comparison of the corrected header information for the pre-recorded sector with the target identification information, and wherein the controller uses the comparison to control timing of recording of the user data information of the sector on the medium.

23. A method of recording a sector of information from a host on a rotating magnetic storage medium, the sector including header information for the sector and user data information associated with the header information of the sector, the method comprising:

(1) generating target identification information indicative of a target location on the medium where the sector is to be recorded;

(2) reading the medium to obtain header information for a pre-recorded sector on the medium;

(3) performing error correction on the header information for the pre-recorded sector to obtain corrected header information for the pre-recorded sector;

(4) making a comparison of the corrected header information for the pre-recorded sector with the target identification information, and (5) using the comparison of step (4) to control timing of recording of the user data information of the sector on the medium.

* * * * *